US010516133B2

(12) United States Patent
Nishimura et al.

(10) Patent No.: US 10,516,133 B2
(45) Date of Patent: *Dec. 24, 2019

(54) ORGANIC EL DISPLAY PANEL AND METHOD OF MANUFACTURING ORGANIC EL DISPLAY PANEL

(71) Applicant: JOLED INC., Tokyo (JP)

(72) Inventors: Masaki Nishimura, Tokyo (JP); Hiroyuki Ajiki, Tokyo (JP); Shuhei Yada, Tokyo (JP); Yasuharu Shinokawa, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/392,558

(22) Filed: Apr. 23, 2019

(65) Prior Publication Data

US 2019/0252635 A1   Aug. 15, 2019

Related U.S. Application Data

(63) Continuation of application No. 15/945,655, filed on Apr. 4, 2018, now Pat. No. 10,319,935.

(30) Foreign Application Priority Data

Apr. 5, 2017  (JP) ................................. 2017-075156
Jun. 30, 2017  (JP) ................................. 2017-128990
Jul. 6, 2017  (JP) ................................. 2017-132646

(51) Int. Cl.
*H01L 51/52* (2006.01)
*H01L 27/32* (2006.01)
*H01L 51/50* (2006.01)

(52) U.S. Cl.
CPC ...... *H01L 51/5212* (2013.01); *H01L 27/3258* (2013.01); *H01L 51/5072* (2013.01);
(Continued)

(58) Field of Classification Search
CPC ............. H01L 51/5212; H01L 51/5234; H01L 51/5072
See application file for complete search history.

(56) References Cited

U.S. PATENT DOCUMENTS 5,443,922 A    8/1995  Nishizaki et al.
10,319,935 B2 *  6/2019  Nishimura .......... H01L 51/5212
(Continued)

FOREIGN PATENT DOCUMENTS

JP   5-163488 A   6/1993
JP   2001-230086 A   8/2001
(Continued)

*Primary Examiner* — Douglas M Menz
(74) *Attorney, Agent, or Firm* — Hauptman Ham, LLP

(57) ABSTRACT

An organic EL display panel includes a substrate, a plurality of pixel electrodes disposed in a matrix pattern over the substrate, a first current feeding auxiliary electrode layer disposed to extend in a column or row direction in at least one of gaps between adjacent ones of the pixel electrodes over the substrate, a second current feeding auxiliary electrode layer that contains aluminum as a main constituent and is disposed to be superposed on the first current feeding auxiliary electrode layer, a plurality of light emitting layers disposed on the plurality of pixel electrodes, and a common electrode layer disposed continuously to cover the first current feeding auxiliary electrode layer and the second current feeding auxiliary electrode layer as well as an upper side of the plurality of light emitting layers.

19 Claims, 39 Drawing Sheets

(52) U.S. Cl.
CPC ...... *H01L 51/5234* (2013.01); *H01L 51/5056* (2013.01); *H01L 51/5088* (2013.01)

(56) References Cited

U.S. PATENT DOCUMENTS

| | | |
|---|---|---|
| 2002/0011783 A1 | 1/2002 | Kosokawa |
| 2002/0158835 A1 | 10/2002 | Kobayashi et al. |
| 2004/0160170 A1 | 8/2004 | Sato et al. |
| 2004/0178722 A1 | 9/2004 | Cok et al. |
| 2004/0263441 A1 | 12/2004 | Tanaka et al. |
| 2005/0012454 A1 | 1/2005 | Yamazaki et al. |
| 2005/0077816 A1 | 4/2005 | Yamada et al. |
| 2006/0255726 A1 | 11/2006 | Kim |
| 2012/0074423 A1 | 3/2012 | Kanegae |
| 2013/0285042 A1 | 10/2013 | Komatsu et al. |
| 2016/0133677 A1 | 5/2016 | Yamamoto et al. |
| 2017/0117347 A1 | 4/2017 | Yamane et al. |

FOREIGN PATENT DOCUMENTS

| | | |
|---|---|---|
| JP | 2002-318553 A | 10/2002 |
| JP | 2002-318556 A | 10/2002 |
| JP | 2003-123988 A | 4/2003 |
| JP | 2004-207217 A | 7/2004 |
| JP | 2004-281402 A | 10/2004 |
| JP | 2005-19211 A | 1/2005 |
| JP | 2005-38833 A | 2/2005 |
| JP | 2005-93398 A | 4/2005 |
| JP | 2006-318910 A | 11/2006 |
| JP | 2007-273261 A | 10/2007 |
| JP | 2008-135325 A | 6/2008 |
| JP | 2009-283304 A | 12/2009 |
| JP | 2013-214359 A | 10/2013 |
| JP | 5592365 B2 | 9/2014 |
| JP | 5884224 B2 | 3/2016 |
| JP | 2016-91841 A | 5/2016 |
| WO | 2012/042567 A1 | 4/2012 |
| WO | 2012/114648 A1 | 8/2012 |
| WO | 2015/151415 A1 | 10/2015 |

\* cited by examiner

FIG. 10A
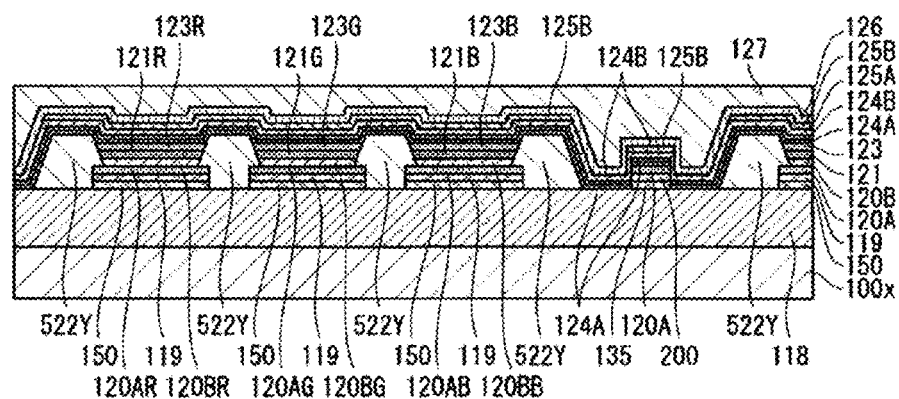
FIG. 10B
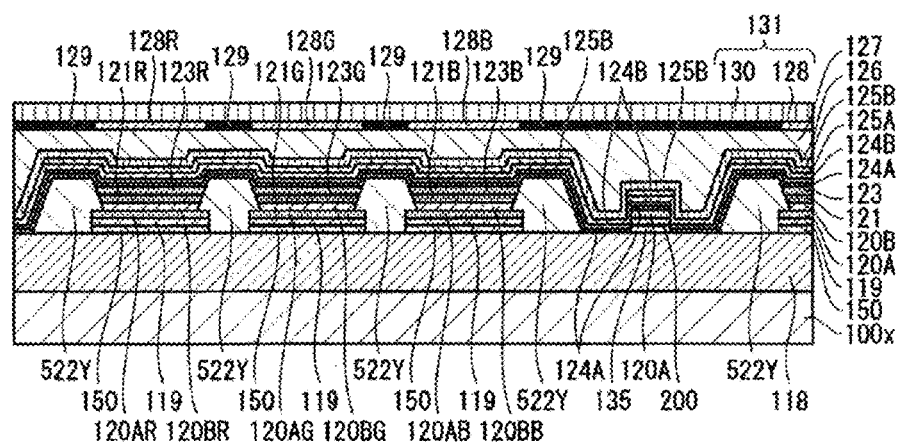

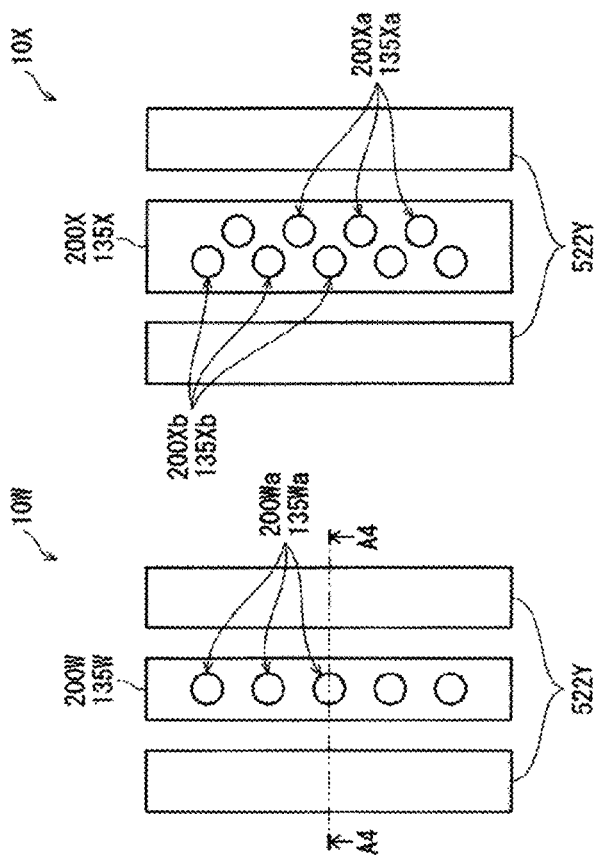

FIG.24A
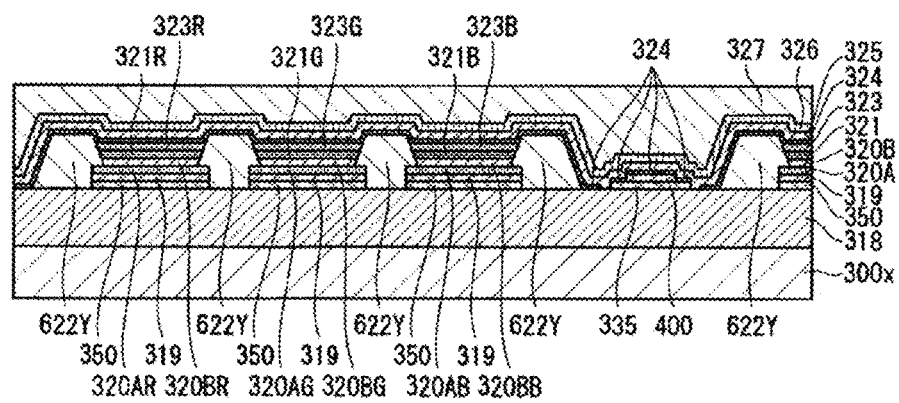
FIG.24B
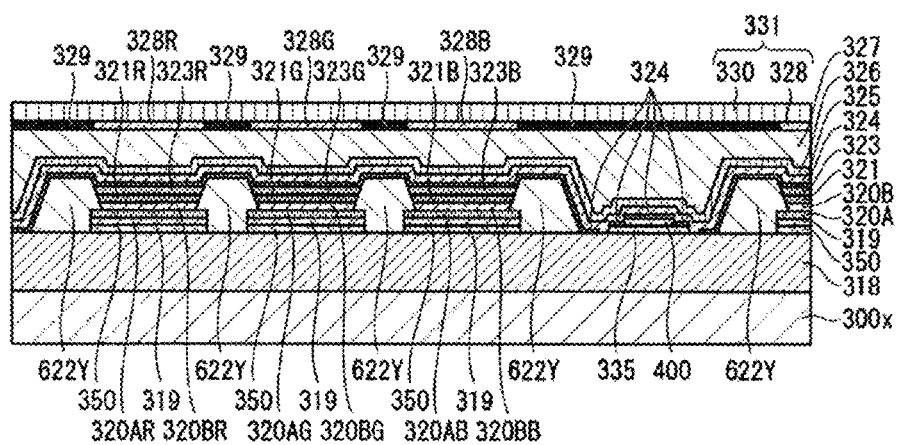

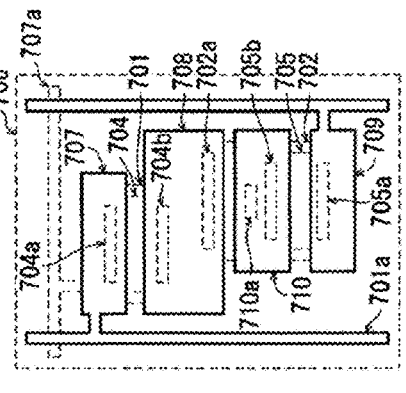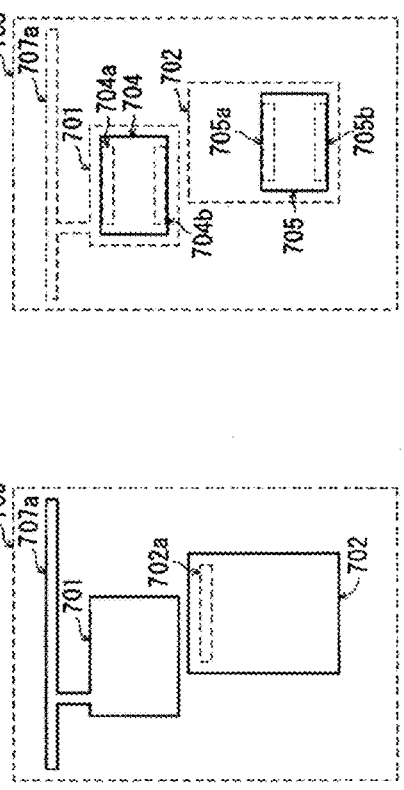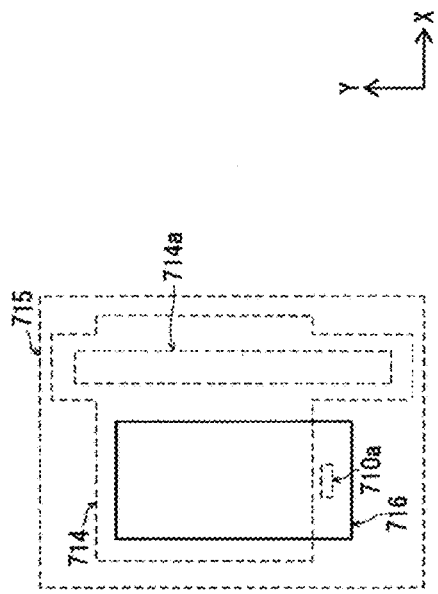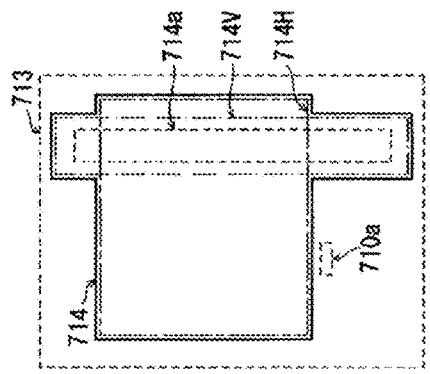

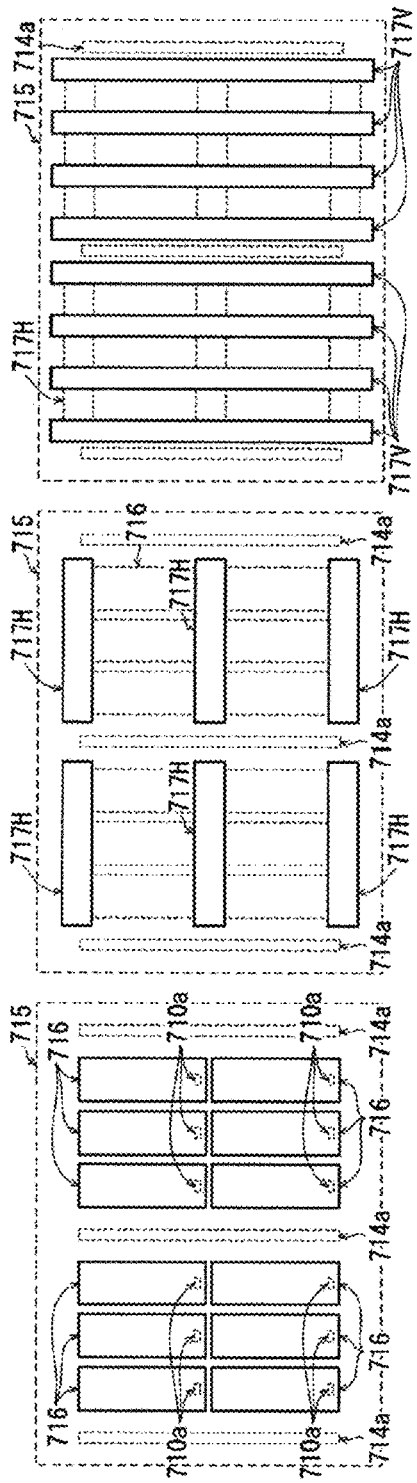

ORGANIC EL DISPLAY PANEL AND METHOD OF MANUFACTURING ORGANIC EL DISPLAY PANEL

CROSS REFERENCES TO RELATED APPLICATIONS

The present application is a continuation of U.S. patent application Ser. No. 15/945,655, filed on Apr. 4, 2018, which claims priority to Japanese Patent Application No. 2017-075156 filed Apr. 5, 2017, Japanese Patent Application No. 2017-128990 filed Jun. 30, 2017 and Japanese Patent Application No. 2017-132646 filed Jul. 6, 2017. The contents of these applications are incorporated herein by reference in their entirety.

BACKGROUND

The present disclosure relates to an organic EL (Electro Luminescence) display panel which uses organic EL elements utilizing an electroluminescence phenomenon of organic materials, and to a method of manufacturing the same.

In recent years, as a display panel for use in a display device such as a digital television set, an organic EL display panel having a plurality of organic EL elements arranged in a matrix pattern on a substrate has been put to practical use.

In an organic EL display panel, in general, a light emitting layer of each organic EL element and the adjacent organic EL element are partitioned from each other by an insulating layer formed from an insulating material. In an organic EL display panel for color display, organic EL elements form sub-pixels that emit light in R, G and B colors, individually, and the R, G and B sub-pixels adjacent to one another are combined to form a unit pixel in color display.

The organic EL element has a basic structure in which a light emitting layer containing an organic light emitting material is disposed between a pair of electrodes. At the time of driving, a voltage is impressed between the pair of electrodes, and light is emitted attendant on recombination of holes and electrons injected into the light emitting layer.

An organic EL element of the top emission type has an element structure in which a pixel electrode, organic layers (inclusive of a light emitting layer) and a common electrode are sequentially provided over a substrate. Light from the light emitting layer is reflected by the pixel electrode formed from a light reflecting material, and is emitted upward from the common electrode formed from a light transmitting material. The common electrode is often formed over the whole surface of a display pixel section on the substrate. Attendant on an increase in the size of organic EL display panels for use in larger-sized display devices such as television sets, the electric resistance of the common electrode is increased. At parts far from a current feeding part, therefore, sufficient current supply is not attained, due to a voltage drop, and light emission efficiency is thereby lowered. This may lead to generation of irregularities in luminance In view of this problem, for example, Japanese Patent Laid-open No. 2002-318556 proposes a technique for lowering the electric resistance of the common electrode. In the technique, an auxiliary electrode layer is extended in the same layer as pixel electrodes on a substrate, and a common electrode is superposed thereon, for achieving electrical connection with the common electrode. In addition, there have been proposed a technique in which an auxiliary electrode layer and a common electrode are stacked on each other through a hole injection layer formed from a metallic oxide in order to achieve electrical connection between the auxiliary electrode layer and the common electrode (see, for example, Japanese Patent No. 5884224), and a technique in which stacking of the layers is conducted through an electron transport layer containing metallic atoms (see, for example, WO 2015/151415).

SUMMARY

According to an embodiment of the present disclosure, there is provided an organic EL display panel having a plurality of pixel electrodes arranged in a matrix pattern on a substrate, with a light emitting layer disposed on each of the pixel electrodes, the light emitting layer containing an organic light emitting material, the organic EL display panel including: the substrate; the plurality of pixel electrodes disposed in a matrix pattern over the substrate; a first current feeding auxiliary electrode layer disposed to extend in a column or row direction in at least one of gaps between adjacent ones of the pixel electrodes over the substrate; a second current feeding auxiliary electrode layer that contains aluminum as a main constituent and is disposed to be superposed on the first current feeding auxiliary electrode layer; a plurality of light emitting layers disposed on the plurality of pixel electrodes; and a common electrode layer disposed continuously to cover the first current feeding auxiliary electrode layer and the second current feeding auxiliary electrode layer as well as an upper side of the plurality of light emitting layers, in which the first current feeding auxiliary electrode layer and the common electrode layer make contact with each other at least in a partial area on a wall surface perpendicular to an upper surface of the first current feeding auxiliary electrode layer, the second current feeding auxiliary electrode layer contains aluminum as a main constituent, with an oxide of aluminum being formed at least at a surface layer of the second current feeding auxiliary electrode layer, and the first current feeding auxiliary electrode layer is composed of a material that contains a metal different from aluminum as a main constituent and is lower than aluminum in contact resistance in air.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

FIGS. 10A and 10B are schematic sectional views taken at the same position as line A1-A1 of FIG. 3 in a state of each step in manufacture of the organic EL display panel according to at least one embodiment;

FIG. 12A is a schematic plan view of a bank and an auxiliary electrode layer in a display panel according to Modification 1, FIG. 12B is a schematic plan view of a bank and an auxiliary electrode layer in a display panel according to Modification 2, and FIG. 12C is a schematic plan view of a bank and an auxiliary electrode layer in a display panel according to Modification 3;

FIGS. 24A and 24B are schematic sectional views taken along line A1-A1 of FIG. 17 in each step in manufacture of the organic EL display panel according to at least one embodiment;

FIGS. 28A to 28E are schematic views depicting manufacturing steps of the display panel according to at least one embodiment;

FIGS. 29A to 29E are schematic views depicting manufacturing steps of the display panel according to at least one embodiment;

DETAILED DESCRIPTION OF THE PREFERRED EMBODIMENTS

Embodiment 1

Figure 1:
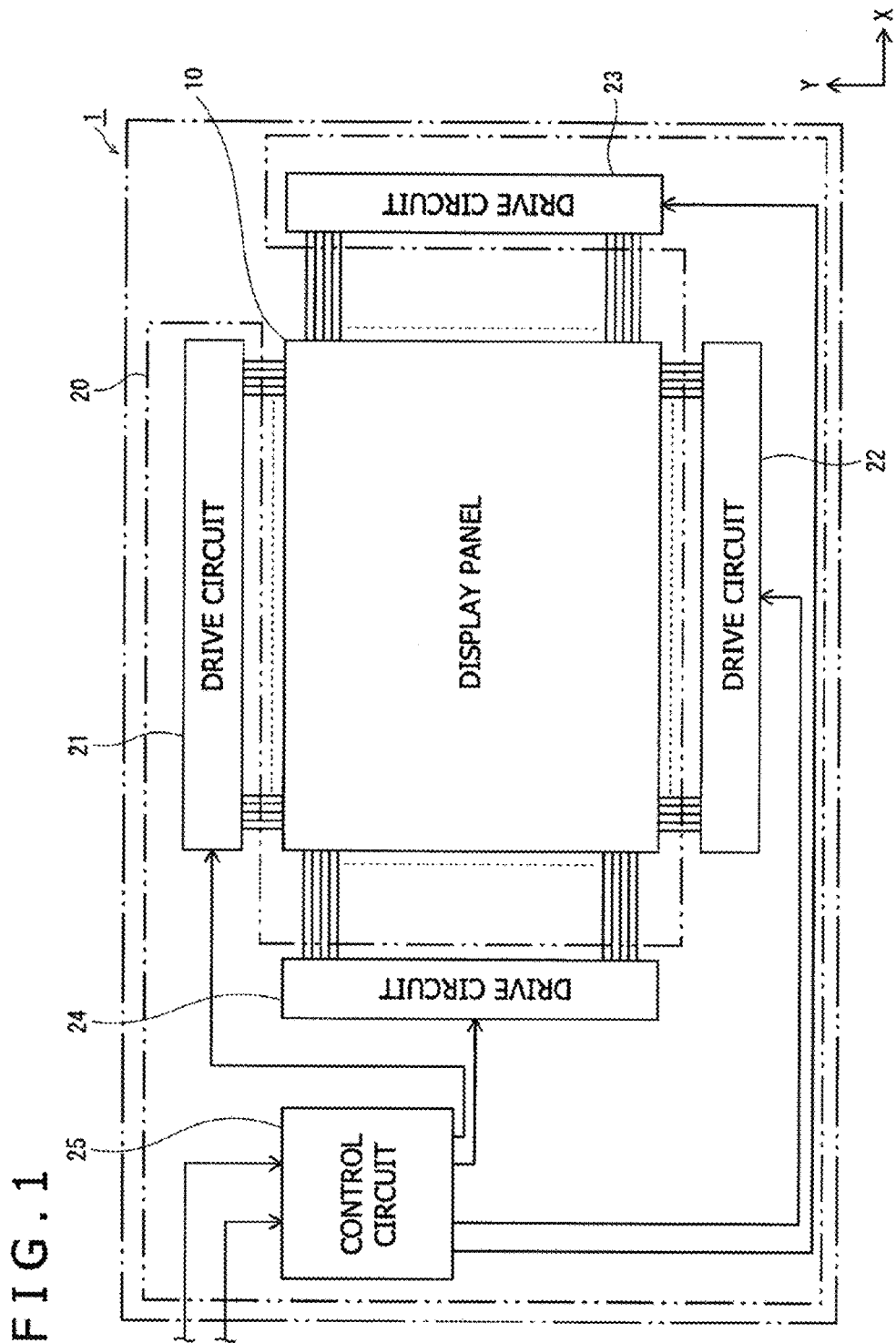
FIG. 1 is a schematic block diagram of a circuit configuration of an organic EL display device according to Embodiment 1.

<How Embodiment 1 of the Present Disclosure has Been Reached>

However, in the case where a metal having a light reflecting property like the pixel electrodes, such as aluminum or silver, is used as the material for the auxiliary electrode layer, there has been a problem that an oxide film is formed at a surface layer of the auxiliary electrode layer in the subsequent manufacturing step, whereby electric contact resistance between the auxiliary electrode layer and the common electrode layer is raised.

Thus, there is a need for an organic EL display panel and a method of manufacturing the same in which while using an inexpensive metallic material having a light reflecting property like pixel electrodes is used as the material for an auxiliary electrode layer, electric contact resistance in electrical connection between a common electrode layer and the auxiliary electrode layer can be reduced, light emission efficiency can be enhanced, and variability in luminance can be restrained.

How an embodiment of the present disclosure has been reached will now be described below.

In a top emission type organic EL element, an optical resonator structure is adopted by setting optimum thicknesses of layers, whereby chromaticity of light emitted is controlled and luminance is enhanced. Therefore, a surface portion of each pixel electrode should be high in light reflecting property. Accordingly, a metal layer, an alloy layer, a transparent conductive film layer or the like is selected for the pixel electrodes. The metal layer can be formed from a metallic material which is low in sheet resistance and high in light reflecting property, such as silver (Ag) or aluminum (Al). Taking materials cost into consideration, it is industrially preferable to use aluminum rather than silver.

On the other hand, a current feeding auxiliary electrode layer is formed simultaneously with, and in the same layer as, the pixel electrodes on a substrate. Therefore, the current feeding auxiliary electrode layer is formed from the same material as the pixel electrodes. Accordingly, a metal layer or an alloy layer containing aluminum as a main constituent is used for the auxiliary electrode layer. In this case, however, it has been found by the present inventors' investigation that in the process of producing upper layers after the formation of the auxiliary electrode layer, an oxide film is formed at a surface layer of the auxiliary electrode layer, whereby the electric contact resistance between the auxiliary electrode layer and the common electrode layer is enhanced. The reason for this is considered to lie in that the metal layer or alloy layer containing aluminum as a main constituent and constituting the auxiliary electrode layer is oxidized in a baking step or a wet process or the like for a hole injection layer and banks which are formed after the formation of the auxiliary electrode layer.

Particularly, it has been found by the present inventors' investigation that not only the electric contact resistance between the auxiliary electrode layer and the common electrode is increased by the intermediate presence of the hole injection layer but also the aluminum alloy of the auxiliary electrode layer becomes susceptible to oxidation, in the case where electrical connection between the auxiliary electrode layer and the common electrode is contrived by stacking the auxiliary electrode layer and the common electrode through the intermediate presence of the hole injection layer formed of a metallic oxide (for example, tungsten oxide: WOx), as described in Japanese Patent No. 5884224. In addition, it has been found by the present inventors' experiments that even in the case where an aluminum alloy, which is generally reported to indicate good electric contact resistance in contact with ITO, is used as the material for the auxiliary electrode layer, an aluminum oxide film is formed at the surface of the auxiliary electrode, increasing the electric contact resistance between the auxiliary electrode and the common electrode. The reason for this is considered to reside in that oxygen contained in tungsten oxide itself is liable to migrate into the auxiliary electrode layer, or, because of tungsten oxide having higher pore density than other materials, that a chemical liquid such as a developing liquid and/or water may penetrate into the auxiliary electrode layer from upper layers in the wet process or baking step, or that passage of oxygen at the time of baking leads to easy penetration of oxygen into the auxiliary electrode layer.

It has been also found that in the case where an aluminum alloy of the auxiliary electrode layer is oxidized and where electrical connection between the auxiliary electrode layer and the common electrode is locally made without intermediate presence of the oxide film therebetween due to the presence of a defect or foreign matter in the auxiliary electrode layer, there is a possibility that concentrated flow of current may occur in the local site, causing local heat generation or material deterioration or the like.

Furthermore, for increasing carrier mobility at a light emitting element part, a configuration in which an auxiliary electrode layer and a common electrode are stacked through an electron transport layer containing a high-resistance fluoride and metallic atoms has been proposed, as described in WO 2015/151415. However, since the electric polarity between the auxiliary electrode layer and the common electrode is opposite to that between the pixel electrode and the common electrode, the intermediate presence of the electron transport layer which contains the high-resistance fluoride and the metallic atoms but is not a metal layer per se would lead to a further increase in electric contact resistance between the auxiliary electrode layer and the common electrode. For further enhancement of carrier mobility, an increase in film thickness of the electron transport layer should also be taken into consideration.

On the other hand, Japanese Patent Laid-open No. 2009-283304 proposes an organic EL element having a light emission functional layer interposed between an auxiliary electrode layer and a counter electrode, in which the auxiliary electrode layer makes contact with the counter electrode without intermediate presence therebetween of an electron transport layer, at a side surface, as viewed in sectional view. In this configuration, however, electric contact resistance between the auxiliary electrode layer and the counter electrode is raised in the case where an oxide film is formed at a surface layer of the auxiliary electrode layer, as aforementioned.

In view of the foregoing, the present inventors made extensive and intensive investigations in regard of a configuration in which an inexpensive metallic material having a light reflecting property like the material of pixel electrodes is used as the material for an auxiliary electrode layer and in which electric contact resistance between a common electrode layer and the auxiliary electrode layer can be lowered. As a result of their investigations, they have reached the following embodiments.

<Outline of Embodiment 1 of the Present Disclosure>

An organic EL display panel according to a mode of the present disclosure is an organic EL display panel having a plurality of pixel electrodes arranged in a matrix pattern on a substrate, with a light emitting layer disposed on each of the pixel electrodes, the light emitting layer containing an organic light emitting material, the organic EL display panel including: the substrate; the plurality of pixel electrodes disposed in a matrix pattern over the substrate; a first current feeding auxiliary electrode layer disposed to extend in a column or row direction in at least one of gaps between adjacent ones of the pixel electrodes over the substrate; a second current feeding auxiliary electrode layer that contains aluminum as a main constituent and is disposed to be superposed on the first current feeding auxiliary electrode layer; a plurality of light emitting layers disposed on the plurality of pixel electrodes; and a common electrode layer disposed continuously to cover the first current feeding auxiliary electrode layer and the second current feeding auxiliary electrode layer as well as an upper side of the plurality of light emitting layers, in which the first current feeding auxiliary electrode layer and the common electrode layer make contact with each other at least in a partial area on a wall surface perpendicular to an upper surface of the first current feeding auxiliary electrode layer, and the first current feeding auxiliary electrode layer is composed of a material that contains a metal different from aluminum as a main constituent and is lower than aluminum in contact resistance in air.

In another mode, in the above configuration, an oxide of aluminum may be formed at least at a surface layer of the second current feeding auxiliary electrode layer.

According to such a configuration, electric contact resistance in electrical connection between the common electrode layer and the auxiliary electrode layer can be reduced even in the case where an inexpensive metallic material having a light reflecting property like the material of the pixel electrodes is used as a material for the auxiliary electrode layer. As a result, light emission efficiency can be enhanced, and variability in luminance can be restrained.

In another mode, in any of the above modes, a configuration may be adopted in which a functional layer composed of at least one layer disposed continuously to cover the first current feeding auxiliary electrode layer and the second current feeding auxiliary electrode layer as well as an upper side of the plurality of light emitting layers is further provided between the second current feeding auxiliary electrode layer and the common electrode layer, the functional layer is lacking or thinned in a vicinity of a partial area of the first current feeding auxiliary electrode layer, and the thickness of the first current feeding auxiliary electrode layer is greater than the thickness of the functional layer on the light emitting layer.

According to such a configuration, it is ensured that even in the case where the auxiliary electrode layer and the common electrode are stacked through a hole injection layer composed of a metallic oxide (WOx) or the case where the auxiliary electrode layer and the common electrode are stacked through an electron transport layer containing metallic atoms for the purpose of increasing carrier mobility at a light emitting element part, the first current feeding auxiliary electrode layer and the common electrode layer can be made to contact each other at least at a partial area on the wall surface perpendicular to the upper surface of the first current feeding auxiliary electrode layer.

In another mode, in any of the above modes, the resistance in a vicinity of a surface layer of the second current feeding auxiliary electrode layer may be higher than the resistance in a vicinity of a surface layer of the first current feeding auxiliary electrode layer. In another mode, in any of the above modes, the contact resistance between the first current feeding auxiliary electrode layer and the common electrode layer may be lower than the contact resistance between the second current feeding auxiliary electrode layer and the common electrode layer. In another mode, in any of the above modes, the sheet resistance of the material may be higher than the sheet resistance of aluminum.

In another mode, in any of the above modes, the metal different from aluminum may be at least one metal selected from among tungsten, chromium, titanium, molybdenum, nickel, copper, lanthanum, and indium, or a stacked layer of metals including them.

According to such a configuration, it is ensured that since these metals are chemically stable at room temperature, an oxide of metal is less liable to be formed at a surface layer part of the first auxiliary electrode layer as compared to the case of aluminum.

In another mode, in any of the above modes, the first current feeding auxiliary electrode layer may be composed of ITO or IZO.

According to such a configuration, it is ensured that since these oxides are chemically stable at room temperature, an oxide of metal is less liable to be formed at a surface layer part of the first current feeding auxiliary electrode layer. Alternatively, notwithstanding ITO, IZO or the like is an oxide per se, a configuration with conductivity can be realized. Therefore, a contact resistance in air which is lower than that of aluminum is realized. In other words, a configuration in which the resistance in the vicinity of a surface layer of the second current feeding auxiliary electrode layer is higher than the resistance in the vicinity of a surface layer of the first current feeding auxiliary electrode layer can be realized.

In another mode, in any of the above modes, a configuration may be adopted in which when the functional layer is referred to as a first functional layer, a second functional layer disposed discontinuously under the plurality of light emitting layers and over the first current feeding auxiliary electrode layer and the second current feeding auxiliary electrode layer is further provided between the second current feeding auxiliary electrode layer and the first functional layer.

According to such a configuration, the auxiliary electrode layer and the common electrode can be stacked through a hole injection layer composed of a metallic oxide (WOx).

In another mode, in any of the above modes, a transparent conductive layer composed of ITO or IZO and disposed discontinuously under the plurality of light emitting layers and over the first current feeding auxiliary electrode layer and the second current feeding auxiliary electrode layer is further provided between the second current feeding auxiliary electrode layer and the functional layer.

According to such a configuration, the transparent conductive layer can be utilized as an optical adjustment layer for securing an optical length required for an optical resonator structure between the pixel electrodes and the common electrode.

In another mode, in any of the above modes, the common electrode layer may include a transparent conductive layer composed of ITO or IZO.

According to such a configuration, the common electrode layer can be formed by a sputtering method, and the first current feeding auxiliary electrode layer and the common electrode layer can be made to contact each other at least in a partial area on a wall surface perpendicular to an upper surface of the first current feeding auxiliary electrode layer.

In another mode, in any of the above modes, the common electrode layer may include a metal electrode layer containing silver as a main constituent.

According to such a configuration, the sheet resistance of the common electrode layer can be reduced.

In another mode, in any of the above modes, a configuration may be adopted in which a planarizing layer composed of a planarizing lower layer and a planarizing upper layer which contain a resin as a main constituent is provided over the substrate, a third current feeding auxiliary electrode layer is disposed to extend in a column or row direction between the planarizing lower layer and the planarizing upper layer, the planarizing upper layer is formed therein with a contact hole penetrating to an upper surface of the third current feeding auxiliary electrode layer, with the first current feeding auxiliary electrode layer being electrically connected to the third current feeding auxiliary electrode layer through the contact hole, the common electrode layer is disposed to be continuous with an inner peripheral surface and a bottom surface of the contact hole, and the third current feeding auxiliary electrode layer and the common electrode layer are electrically connected to each other through the first current feeding auxiliary electrode layer.

According to such a configuration, the sectional area of the auxiliary electrode can be increased by an amount corresponding to the section in the row direction of the third current feeding auxiliary electrode layer, the sheet resistance of the auxiliary electrode can be thereby reduced, and a lowering in light take-out efficiency attendant on an increase in pixel density (increase in resolution) can be restrained. In addition, the configuration in which the auxiliary electrode is provided between the planarizing lower layer and the planarizing upper layer on the substrate ensures that there is little positional limitation due to pixel electrodes and the like on the substrate and that the degree of freedom in plan-view layout of the third current feeding auxiliary electrode layer is enhanced.

In another mode, a configuration may be adopted in which a functional layer is further disposed between the bottom surface of the contact hole and the common electrode layer in the contact hole, the depth of the contact hole is greater than the thickness of the functional layer, and the first current feeding auxiliary electrode layer and the common electrode layer are in contact with each other at least in a partial area on the inner peripheral surface of the contact hole in the first current feeding auxiliary electrode layer.

According to such a configuration, the area of contact between the common electrode layer and the first current feeding auxiliary electrode layer can be increased, and the sectional area of a conducting path to the third current feeding auxiliary electrode layer can be increased. As a result, contact resistance from the common electrode layer to the current feeding auxiliary electrode can be reduced. In another mode, in any of the above modes, a configuration may be adopted in which the substrate includes a TFT (Thin Film Transistor) substrate and an insulating layer provided over the TFT substrate, the insulating layer containing a resin as a main constituent, a planarizing layer containing a resin as a main constituent is provided over the substrate, a fourth current feeding auxiliary electrode layer disposed to extend in a column or row direction is provided between the TFT substrate and the insulating layer, the planarizing layer is formed therein with a contact hole penetrating from an upper surface of the planarizing layer to a lower surface of the fourth current feeding auxiliary electrode layer, with the first current feeding auxiliary electrode layer being electrically connected to the fourth current feeding auxiliary electrode layer through the contact hole, the common electrode layer is disposed to be continuous with an inner peripheral surface and a bottom surface of the contact hole, and the fourth current feeding auxiliary electrode layer and the common electrode layer are electrically connected to each other through the first current feeding auxiliary electrode layer.

According to such a configuration, the sectional area of the auxiliary electrode can be increased by an amount corresponding to the section in the row direction of the fourth current feeding auxiliary electrode layer, the sheet resistance of the auxiliary electrode can be thereby reduced, and a lowering in light take-out efficiency attendant on an increase in pixel density (increase in resolution) can be restrained. In addition, the configuration in which the auxiliary electrode is provided between a channel protection layer and an inorganic insulating layer in the substrate ensures that there is little positional limitation due to the pixel electrodes and the like on the substrate and that the degree of freedom in plan-view layout of the fourth current feeding auxiliary electrode layer is enhanced.

In another mode, in any of the above modes, a configuration may be adopted in which a functional layer is further disposed between a bottom surface of the contact hole in the substrate and the common electrode layer in the contact hole, the depth of the contact hole is greater than the thickness of the functional layer, and the first current feeding auxiliary electrode layer and the common electrode layer are in contact with each other at least in a partial area on the inner peripheral surface of the contact hole in the first current feeding auxiliary electrode layer.

According to such a configuration, the area of contact between the common electrode layer and the first current feeding auxiliary electrode layer can be increased, and the sectional area of a conducting path to the fourth current feeding auxiliary electrode layer can be increased. As a result, the contact resistance from the common electrode layer to the current feeding auxiliary electrode can be reduced.

In another mode, in any of the above modes, a configuration may be adopted in which the substrate includes a TFT substrate and an insulating layer provided over the TFT substrate, the insulating layer containing a resin as a main constituent, a planarizing layer composed of a planarizing lower layer and a planarizing upper layer which contain a resin as a main constituent is provided over the substrate, a third current feeding auxiliary electrode layer disposed to extend in a column or row direction is provided between the planarizing lower layer and the planarizing upper layer, a fourth current feeding auxiliary electrode layer disposed to extend in the column or row direction is provided between the TFT substrate and the insulating layer, the planarizing lower layer, the planarizing upper layer and the insulating layer are formed therein with a contact hole which penetrates to an upper surface of the fourth current feeding auxiliary electrode layer, the first current feeding auxiliary electrode layer is electrically connected to the third current feeding auxiliary electrode layer through the contact hole, the third current feeding auxiliary electrode layer is electrically connected to the fourth current feeding auxiliary electrode layer through the contact hole, the common electrode layer is disposed to be continuous with an inner peripheral surface and a bottom surface of the contact hole, and the third current feeding auxiliary electrode layer and the fourth current feeding auxiliary electrode layer are electrically connected to the common electrode layer through the first current feeding auxiliary electrode layer.

According to such a configuration, the common electrode layer and the third current feeding auxiliary electrode layer are electrically connected, and, further, the fourth current feeding auxiliary electrode layer is electrically connected, through the first current feeding auxiliary electrode layer. Therefore, the third current feeding auxiliary electrode layer and the fourth current feeding auxiliary electrode layer can be made to function as a current feeding auxiliary electrode for the common electrode layer. As a result, sheet resistance can be further reduced, which is effective for realizing a higher resolution.

In another mode, in any of the above modes, a configuration may be adopted in which a functional layer is further disposed between a bottom surface of the contact hole and the common electrode layer in the contact hole, and the depth of the contact hole is greater than the thickness of the functional layer, and the first current feeding auxiliary electrode layer and the common electrode layer are in contact with each other at least in a partial area on an inner peripheral surface of the contact hole in the first current feeding auxiliary electrode layer.

According to such a configuration, the area of contact between the common electrode layer and the first current feeding auxiliary electrode layer can be increased, the sectional area of a conducting path to the third current feeding auxiliary electrode layer and the fourth current feeding auxiliary electrode layer can be thereby increased, and contact resistance from the common electrode layer to the current feeding auxiliary electrode can be reduced.

<Details of Embodiment 1>

1.1 Circuit Configuration of Display Device 1

A circuit configuration of an organic EL display device 1 (hereinafter referred to as "display device 1") according to Embodiment 1 will be described below, referring to FIG. 1.

As illustrated in FIG. 1, the display device 1 includes an organic EL display panel 10 (hereinafter referred to as "display panel 10"), and a drive control circuit section 20 connected thereto.

The display panel 10 is an organic EL (Electro Luminescence) panel utilizing an electroluminescence phenomenon of organic materials, in which a plurality of organic EL elements are arranged, for example, in a matrix pattern. The drive control circuit section 20 includes four drive circuits 21 to 24 and a control circuit 25.

Note that in the display device 1, the layout of each circuit of the drive control circuit section 20 in relation to the display panel 10 is not limited to the one depicted in FIG. 1.

1.2 Circuit Configuration of Display Panel 10

In the display panel 10, a plurality of unit pixels 100e are arranged in a matrix pattern, to constitute a display region. Each unit pixel 100e is composed of three organic EL elements, namely, three sub-pixels 100se that emit light in R (red), G (green) and B (blue). A circuit configuration of each sub-pixel 100se will be described referring to FIG. 2.

Figure 2:
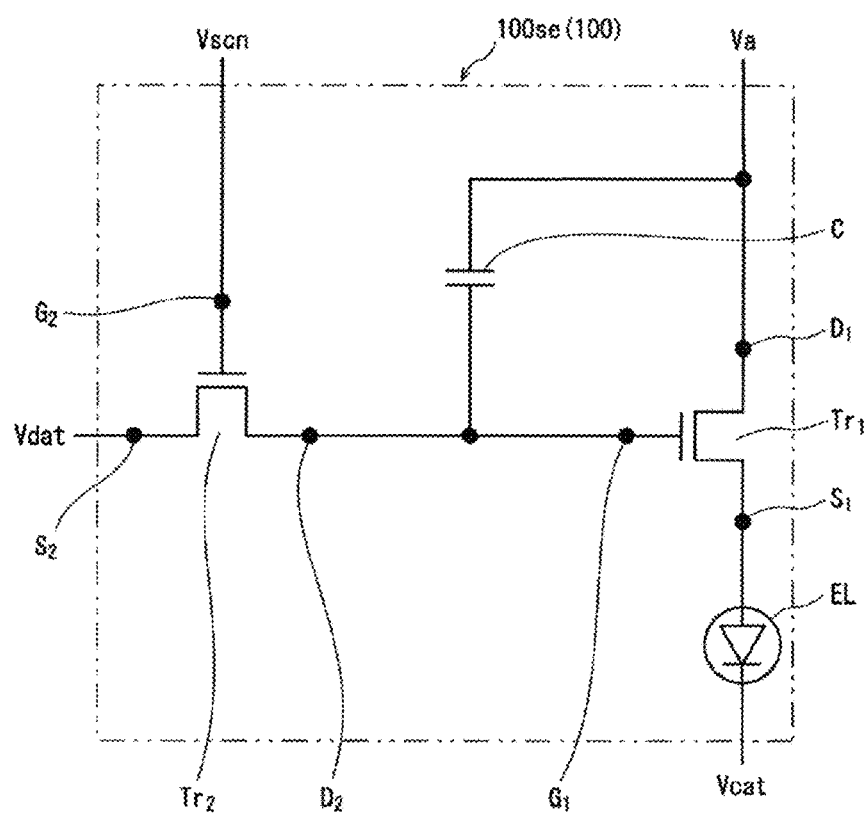
FIG. 2 is a schematic circuit diagram of each sub-pixel in an organic EL display panel used in the organic EL display device according to Embodiment 1.

FIG. 2 is a circuit diagram depicting the circuit configuration in an organic EL element 100 corresponding to each sub-pixel 100se in the display panel 10 used for the display device 1.

As depicted in FIG. 2, in the display panel 10 according to the present embodiment, each sub-pixel 100se includes two transistors Tr1 and Tr2, one capacitor C, and an organic EL element section EL as a light emitting section. The transistor Tr1 is a drive transistor, whereas the transistor Tr2 is a switching transistor.

A gate G2 of the switching transistor Tr2 is connected to a scan line Vscn, whereas a source S2 of the switching transistor Tr2 is connected to a data line Vdat. A drain D2 of the switching transistor Tr2 is connected to a gate G1 of the drive transistor Tr1.

A drain D1 of the drive transistor Tr1 is connected to a power supply line Va, whereas a source Si of the drive transistor Tr1 is connected to a pixel electrode (anode) of the organic EL element section EL. A common electrode layer (cathode) in the organic EL element section EL is connected to a ground line Vcat. In addition, a first auxiliary electrode layer 135 and a second auxiliary electrode layer 200, which will be described later, are also connected to the ground line Vcat, and the common electrode layer, the first auxiliary electrode layer 135 and the second auxiliary electrode layer 200 are interconnected.

Note that a first end of the capacitor C is connected to the drain D2 of the switching transistor Tr2 and the gate G1 of the drive transistor Tr1, whereas a second end of the capacitor C is connected to the power supply line Va.

In the display panel 10, a plurality of sub-pixels 100se (for example, three sub-pixels 100se that emit light in red (R), green (G) and blue (B)) adjacent to one another are combined to constitute a single unit pixel 100e, and such unit pixels 100e are arranged in a distributed manner to constitute the pixel region. Besides, a gate line is led out from the gate G2 of each sub-pixel 100se, and is connected to the scan line Vscn which is connected from the exterior of the display panel 10. Similarly, a source line is led out from the source S2 of each sub-pixel 100se, and is connected to the data line Vdat which is connected from the exterior of the display panel 10.

In addition, the power supply lines Va of the sub-pixels 100se and the ground lines Vcat of the sub-pixels 100se are collectively connected to a power supply line and a ground line of the display device 1.

1.3 General Configuration of Display Panel 10

The display panel 10 according to the present embodiment will be described referring to the drawings. Note that the drawings are schematic, and the magnification used therein may be different from actual magnification.

Figure 3:
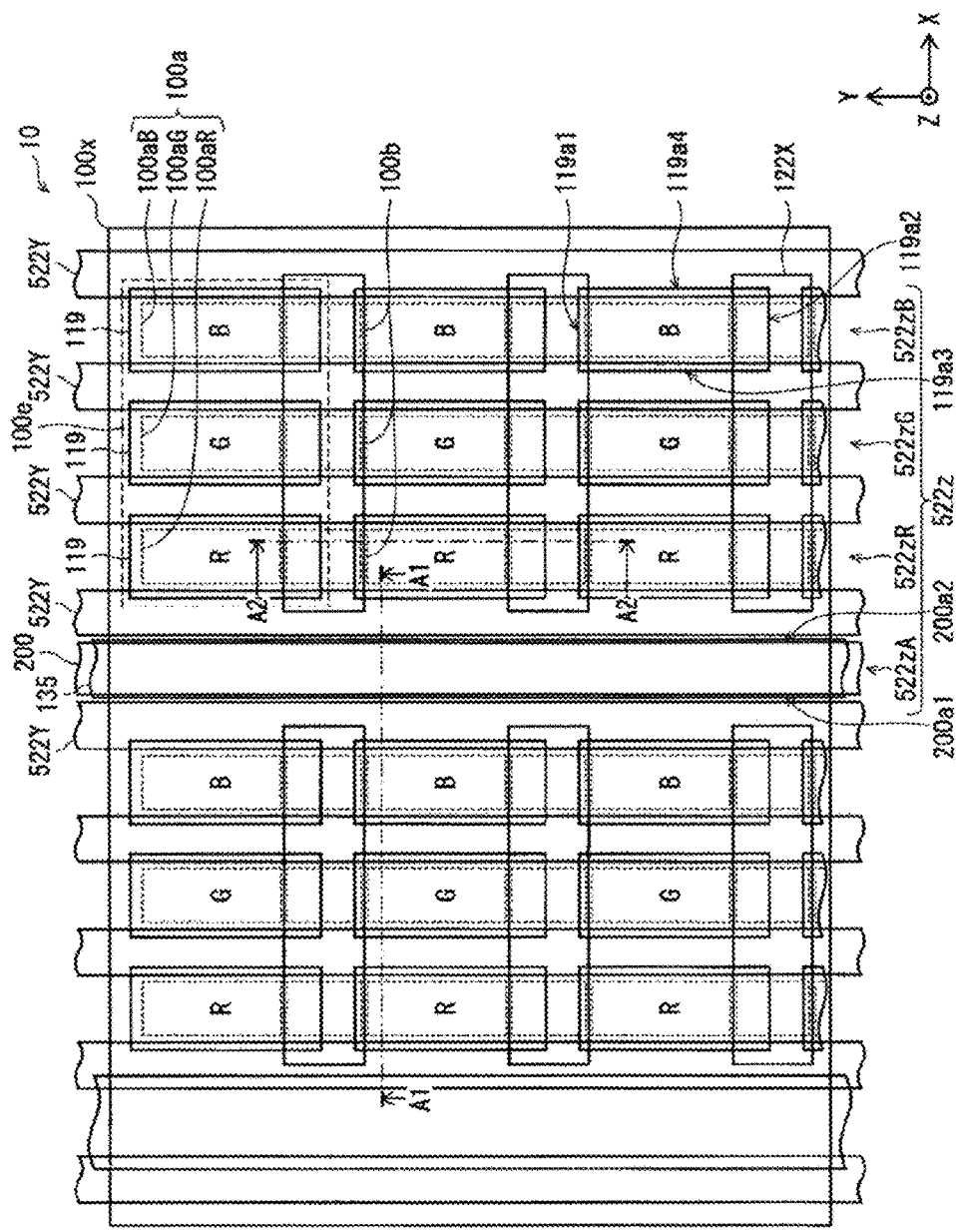
FIG. 3 is a schematic plan view depicting a part of the organic EL display panel according to at least one embodiment.

FIG. 3 is a schematic plan view depicting a part of the display panel according to the embodiment.

The display panel 10 is an organic EL display panel utilizing an electroluminescence phenomenon of organic materials, and has a top emission type configuration in which a plurality of organic EL elements 100 arranged in a matrix pattern on a substrate 100x (TFT substrate) formed with TFTs emit light through an upper surface. Herein, an X-direction, a Y-direction and a Z-direction in FIG. 3 are respectively a row direction, a column direction and a thickness direction in the display panel 10.

In a display region of the display panel 10, a plurality of unit pixels 100e composed of organic EL elements 100 are arranged in a matrix pattern. In each unit pixel 100e, there are formed three kinds of self-luminescence regions 100a of 100aR which emits light in red, 100aG which emits light in green, and 100aB which emits light in blue (where 100aR, 100aG and 100aB are not discriminated from one another, they will hereinafter be referred to simply as "100a") as regions for emitting light by an organic compound. Specifically, three sub-pixels 100se (where they are discriminated from one another, they will hereinafter be referred to as "red sub-pixel 100seR," "green sub-pixel 100seG" and "blue sub-pixel 100seB") corresponding respectively to the self-luminescence regions 100aR, 100aG and 100aB arrayed in the row direction are combined into a set to constitute a unit pixel 100e in color display.

In the display panel 10, a plurality of auxiliary pixel electrodes 150 (depicted in FIG. 4 to be described later) and a plurality of pixel electrodes 119 are arranged on the substrate 100x in the state of being spaced at predetermined intervals in the row and column directions. The pluralities of auxiliary pixel electrodes 150 and pixel electrodes 119 are, for example, substantially rectangular in plan-view shape, and the pixel electrodes 119 are formed of a light reflecting material. The auxiliary pixel electrodes 150 and pixel electrodes 119 arrayed orderly in threes in the row direction correspond to the three self-luminescence regions 100aR, 100aG and 100aB arrayed orderly in the row direction.

Figure 4:
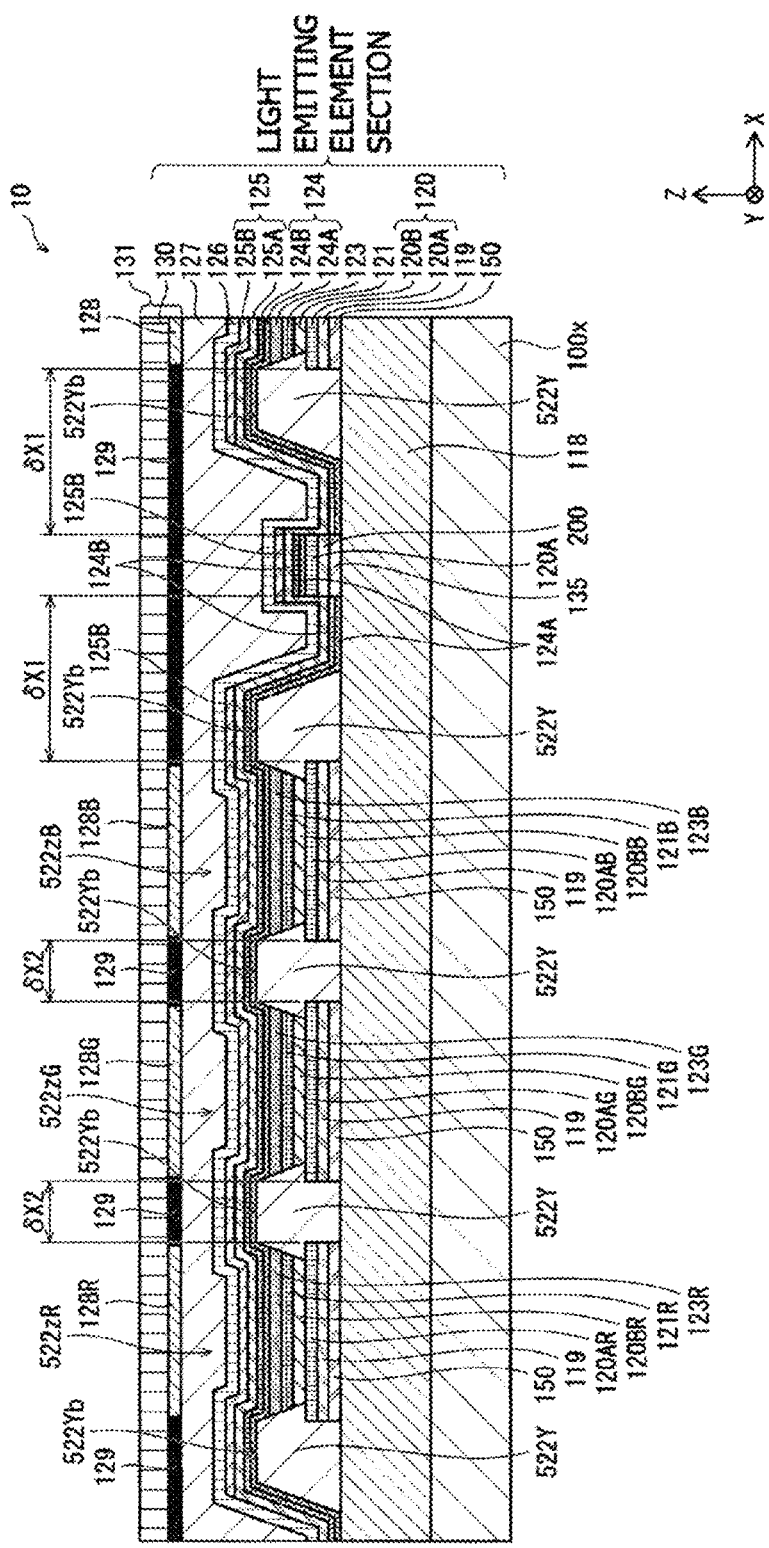
FIG. 4 is a schematic sectional view taken along line A1-A1 of FIG. 3, according to at least one embodiment.

In addition, as depicted in FIGS. 3 and 4, in the display panel 10, a plurality of first current feeding auxiliary electrode layers 135 (hereinafter referred to as "first auxiliary electrode layer 135") are disposed continuously over the column direction between the unit pixels 100e on the substrate 100x. The first auxiliary electrode layers 135 are formed of a light reflecting material different from that of the pixel electrodes 119. Besides, on the respective first auxiliary electrode layers 135, second current feeding auxiliary electrode layers 200 (hereinafter referred to as "second auxiliary electrode layers 200") are disposed continuously over the column direction between the unit pixels 100e on the substrate 100x. The second auxiliary electrode layers 200 are formed of the same light reflecting material as that of the pixel electrodes 119. The width of the first auxiliary electrode layer 135 in the row direction, exclusive of minute differences which may be generated due to influences of a manufacturing step to be described later, is the same as the width of the second auxiliary electrode layer 200 in the row direction.

Between the adjacent pixel electrodes 119 is provided a bank which is of an insulating layer type and extends in a line shape. In addition, between the pixel electrode 119 and the first auxiliary electrode layer 135 adjacent to each other, also, there is provided a bank which is of an insulating layer type and extends in a line shape.

The pixel electrode 119 and the pixel electrode 119 adjacent thereto are insulated from each other. In addition, the pixel electrode 119 and the second auxiliary electrode layer 200 or first auxiliary electrode layer 135 adjacent thereto are also insulated from each other.

Over those regions on the substrate 100x which are located between one pixel electrode 119 and the pixel electrode 119 adjacent to thereto in the row direction (between a row-directional outer edge 119a3 of one pixel electrode 119 and a row-directional outer edge 119a4 of the pixel electrode 119 adjacent to the one pixel electrode in the row direction) and between one pixel electrode 119 and the first auxiliary electrode layer 135 adjacent thereto in the row direction (between a row-directional outer edge 119a3 of one pixel electrode 119 and a row-directional outer edge 135a2 of the first auxiliary electrode layer 135 adjacent to the pixel electrode in the row direction, and between a row-directional outer edge 119a4 of one pixel electrode 119 and a row-directional outer edge 135a1 of the first auxiliary electrode layer 135 adjacent to the pixel electrode 119 in the row direction), there are juxtaposedly provided a plurality of column banks 522Y which each extend in the column direction (the Y-direction in FIG. 3). Therefore, row-directional outer edges of the self-luminescence regions 100a are defined by row-directional outer edges of the column banks 522Y.

On the other hand, over those regions on the substrate 100x which are each located between one pixel electrode 119 and the pixel electrode 119 adjacent thereto in the column direction (between a column-direction outer edge 119a2 of one pixel electrode 119 and a column-direction outer edge 119a1 of the pixel electrode 119 adjacent to the one pixel electrode 119), there are juxtaposedly provided a plurality of row banks 122X which each extend in the row direction (the X-direction in FIG. 3). The region in which the row bank 122X is formed becomes a non-self-luminescence region 100b, since organic electroluminescence is not generated in the light emitting layer 123 over the pixel electrode 119 in the region. Therefore, column-direction outer edges of the self-luminescence regions 100a are defined by column-direction outer edges of the row banks 122X.

Where a space between the adjacent column banks 522Y is defined as a gap 522z, the gaps 522z include red gaps 522zR corresponding to the self-luminescence regions 100aR, green gaps 522zG corresponding to the self-luminescence regions 100aG, blue gaps 522zB corresponding to the self-luminescence regions 100aB, and auxiliary gaps 522zA corresponding to regions in which the first auxiliary electrode layers 135 are disposed (where the gap 522zR, the gap 522zG, the gap 522zB and the gap 522zA are not discriminated from one another, they will hereinafter be referred to as "gaps 522z"), and the display panel 10 has a configuration in which multiplicities of the column banks 522Y and the gaps 522z are alternately aligned.

In the display panel 10, the pluralities of the self-luminescence regions 100a and non-self-luminescence regions 100b are alternately aligned in the column direction along the gaps 522zR, the gaps 522zG and the gaps 522zB. The non-self-luminescence region 100b is provided with a connection recess (contact hole, not illustrated) for connection between the pixel electrode 119 and the source S1 of the TFT, and is provided with a contact region (contact window, not illustrated) on the pixel electrode 119 for electrical connection to the pixel electrode 119.

In one sub-pixel 100se, the column bank 522Y provided in the column direction and the row bank 122X provided in the row direction are orthogonal to each other, and the self-luminescence region 100a is located between the row bank 122X and the row bank 122X adjacent to this row bank 122X, in the column direction.

1.4 Configuration of Each Section of Display Panel 10

Figure 5:
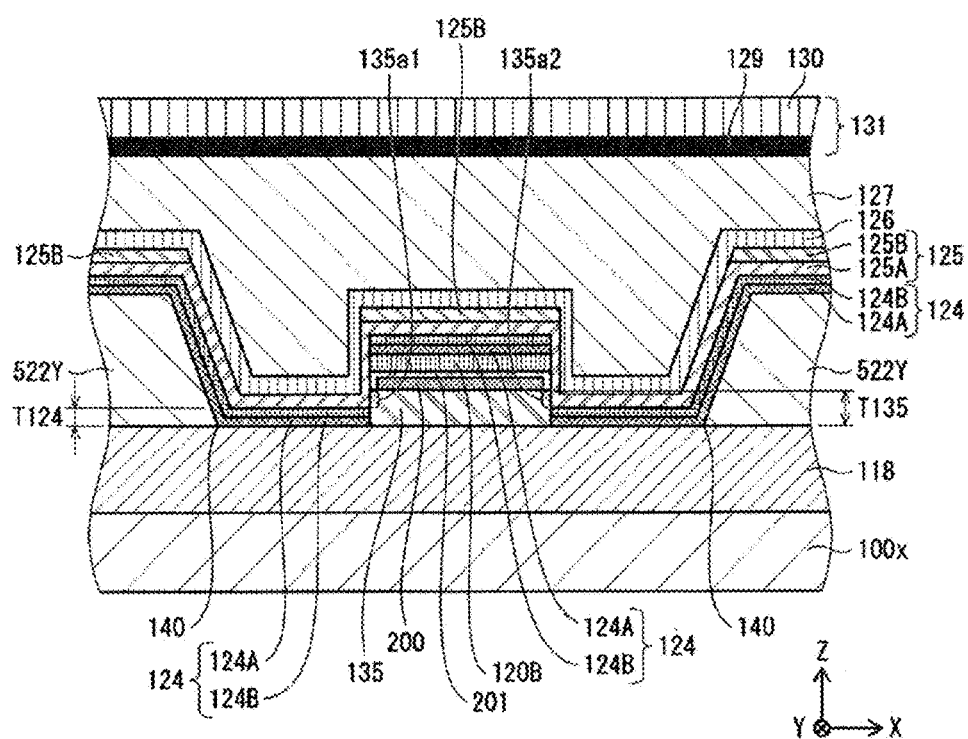
FIG. 5 is a sectional view of the vicinity of a second auxiliary electrode layer depicted in FIG. 4, according to at least one embodiment.

The configuration of the organic EL element 100 in the display panel 10 will be described referring to FIGS. 4 and 5. FIG. 4 is a schematic sectional view taken along A1-A1 of FIG. 3. FIG. 5 is an enlarged view of the vicinity of the second auxiliary electrode layer 200 depicted in FIG. 4.

In the display panel 10 according to the present embodiment, the substrate (TFT substrate) formed with thin film transistors is configured on the lower side in the Z-axis direction, and the organic EL element section is configured thereon.

1.4.1 Substrate (1) Substrate 100x

The substrate 100x is a support member of the display panel 10, and includes a base material (not illustrated) and a TFT layer (not illustrated) formed on the base material.

The base material is a support member of the display panel 10, and is flat plate-like in shape.

The TFT layer includes a plurality of TFTs and a plurality of wirings inclusive of wiring (for connection of the sources S1 of the TFTs and the corresponding pixel electrodes 119) which are formed on the upper side of the base material. The TFT is for electrically connecting the pixel electrode 119 corresponding to itself and an external power supply according to a drive signal from an external circuit for the display panel 10, and has a multilayer structure including electrodes, a semiconductor layer, an insulating layer and the like. The wirings are electrically connecting the TFTs, the pixel electrodes 119, the external power supply, the external circuit and the like.

(2) Planarizing Layer 118

A planarizing layer 118 is provided on the base material and on the upper side of the TFT layer. The planarizing layer 118 located on the upper side of the substrate 100x is for planarizing the upper side of the substrate 100x where ruggedness is present due to the TFT layer. In addition, the planarizing layer 118 fills up spaces between the wirings and the TFTs, thereby electrically insulating the wirings and the TFTs from one another.

The planarizing layer 118 is provided therein with contact holes (not illustrated) for connection between the pixel electrodes 119 and the wirings connected to the sources S1 of the corresponding pixels, the contact holes being opened in part over the wirings corresponding to the pixel electrodes 119.

In the case where an upper limit film thickness of the planarizing layer 118 is not less than 10 μm, variability in film thickness at the time of manufacture is enlarged, and it becomes difficult to control a bottom line width. From the viewpoint of a lowering in productivity due to an increase in tact, the upper limit film thickness of the planarizing layer 118 is desirably not more than 7 μm. In addition, the film thickness of the planarizing layer 118 and the bottom line width should be comparable to each other. When the film thickness of the planarizing layer 118 is reduced, particularly when the lower limit film thickness of the planarizing layer 118 is not more than 1 μm, it becomes difficult to obtain a desired bottom line width, due to limitations as to resolution. In the case of a general flat panel display exposure apparatus, the lower limit film thickness of the planarizing layer 118 is 2 μm. Therefore, the thickness of the planarizing layer 118 is preferably, for example, 1 to 10 μm, more preferably 2 to 7 μm.

1.4.2 Organic EL Element Section (1) Auxiliary Pixel Electrode 150 and Pixel Electrode 119

On the planarizing layer 118 located on the upper side of the substrate 100x, there are provided auxiliary pixel electrodes 150 on a sub-pixel 100se basis, as depicted in FIGS. 4 and 5. Further, the pixel electrodes 119 are stacked on the auxiliary pixel electrodes 150.

The auxiliary pixel electrode 150 and the pixel electrode 119 are for supplying carriers to a light emitting layer 123; for example, in the case where they function as anode, they supply holes to the light emitting layer 123. In addition, since the display panel 10 is of the top emission type, the pixel electrode 119 has a light reflecting property. The shapes of the auxiliary pixel electrode 150 and the pixel electrode 119 are, for example, substantially rectangular flat plate-like shapes. The auxiliary pixel electrode 150 and the pixel electrode 119 are spaced by a spacing λX1 from the adjacent first auxiliary electrode layer 135 in the row direction. In addition, the auxiliary pixel electrode 150 and the pixel electrode 119 are spaced by a spacing λX2 from the adjacent auxiliary pixel electrode 150 and pixel electrode 119 in the row direction. On the contact hole (not illustrated) of the planarizing layer 118, a connection recess (contact hole, not illustrated) of the pixel electrode 119 that is formed by recessing part of the pixel electrode 119 in the direction of the substrate 100x side is formed, and the pixel electrode 119 and the wiring connected to the source 51 of the corresponding pixel are connected at the bottom of the connection recess.

With the auxiliary pixel electrodes 150 formed on the planarizing layer 118, adhesion property (close contact property) is enhanced, whereby penetration of hydrogen into lower layers below the planarizing layer 118 can be prevented. When TAOS (Transparent Amorphous Oxide Semiconductor) is used for the TFT, deterioration of the TFTs by hydrogen can be restrained.

Note that the auxiliary pixel electrodes 150 may not be formed on the planarizing layer 118.

(2) First Auxiliary Electrode Layer 135 and Second Auxiliary Electrode Layer 200

The first auxiliary electrode layer 135 and the second auxiliary electrode layer 200 are auxiliary electrode layers which are disposed to extend in the same layer as that of the auxiliary pixel electrode 150 and the pixel electrode 119 over the substrate 100x, with the common electrode layer 125 stacked thereon to contrive electrical connection with the common electrode layer 125, for the purpose of reducing electric resistance in connection with the common electrode layer 125. On the planarizing layer 118 located on the upper side of the substrate 100x, there are provided the first auxiliary electrode layers 135, as depicted in FIGS. 4 and 5. As depicted in FIG. 4, the first auxiliary electrode layer 135 is spaced by a spacing λX1 from the adjacent pixel electrode 119 in the row direction. Besides, the first auxiliary electrode layer 135 is spaced by a spacing from a base portion of the adjacent bank 522 in the row direction, as depicted in FIG. 5.

Here, the thickness of the first auxiliary electrode layer 135 is preferably 5 to 200 nm; in the present embodiment, the thickness is 50 nm, for example.

In addition, as depicted in FIGS. 4 and 5, the second auxiliary electrode layers 200 are stacked on the first auxiliary electrode layers 135. The width of the second auxiliary electrode layer 200 in the row direction is the same as the width of the first auxiliary electrode layer 135 in the row direction. In other words, the area of the upper surface of the second auxiliary electrode layer 200 is equivalent to the area of the upper surface of the first auxiliary electrode layer 135.

The second auxiliary electrode layer 200 contains aluminum as a main constituent, and a natural oxide layer of aluminum is formed at least at a surface layer 201 of the second auxiliary electrode layer 200. The thickness of the natural oxide layer of aluminum is generally approximately 3 to 4 nm. The natural oxide layer of aluminum is present because of oxidation of aluminum in the surface layer 201 of the second auxiliary electrode layer 200 by oxygen in the atmospheric air in the production process of the substrate and by oxygen supplied from the side of the hole injection layer 120B formed over the second auxiliary electrode layer 200 in the heating step after formation of the hole injection layer 120B.

(3) Hole Injection Layer 120

As depicted in FIG. 4, hole injection layers 120 are stacked on the pixel electrodes 119 and on the second auxiliary electrode layers 200. The hole injection layer 120 has a function of transporting holes, which are injected from the pixel electrode 119, to a hole transport layer 121.

The hole injection layers 120 include hole injection layers 120A formed on the pixel electrodes 119 and on the second auxiliary electrode layers 200 from a metallic oxide, and hole injection layers 120B stacked individually on the hole injection layers 120A in the gap 522zR, gap 522zG and gap 522zB (which will be described later) from an organic matter, in this order from the substrate 100x side. The hole injection layers 120A provided in a blue sub-pixel, a green sub-pixel and a red sub-pixel are referred to a hole injection layer 120AB, a hole injection layer 120AG and a hole injection layer 120AR, respectively, and the hole injection layer 120A formed on the second auxiliary electrode layer 200 is referred to as a hole injection layer 120AA. In addition, the hole injection layers 120B provided in the blue sub-pixel, the green sub-pixel and the red sub-pixel are referred to as a hole injection layer 120BB, a hole injection layer 120BG and a hole injection layer 120BR, respectively.

In the present embodiment, the hole injection layers 120B are provided in a linear shape to extend in the column direction in the gap 522zR, gap 522zG and gap 522zB which will be described later. However, a configuration may be adopted in which the hole injection layers 120B are formed only on the hole injection layers 120A formed on the pixel electrodes 119, and are provided intermittently in the column direction in the gaps 522z.

(4) Bank 122

As depicted in FIGS. 4 and 5, banks composed of an insulating material are formed in such a manner as to cover end edges of the pixel electrodes 119, the hole injection layers 120, the first auxiliary electrode layers 135 and the second auxiliary electrode layers 200. The banks include column banks 522Y extending in the column direction and provided in plurality and juxtaposedly in the row direction, and row banks 122X extending in the row direction and provided in plurality and juxtaposedly in the column direction. As depicted in FIG. 3, the column banks 522Y are provided in the state of being along the column direction orthogonal to the row banks 122X, and the column banks 522Y and the row banks 122X constitute a grid pattern (where the row banks 122X and the column banks 522Y are not discriminated from each other, they will hereinafter referred to as "banks 122").

The shape of the row bank 122X is a linear shape extending in the row direction, and the section of the row bank 122X obtained by cutting in parallel to the column direction is a normal-tapered trapezoid which is tapered upward. The row banks 122X are provided in the state of being along the row direction orthogonal to the column direction in such a manner as to penetrate each column bank 522Y, and each have an upper surface below an upper surface 522Yb of the column bank 522Y. Therefore, openings corresponding to the self-luminescence regions 100a are defined by the row banks 122X and the column banks 522Y.

The row banks 122X are for controlling flow of inks, which contain organic compounds as materials for the light emitting layers 123, in the column direction. Therefore, the row banks 122X should have an affinity for the inks of not less than a predetermined value. By such a configuration, variations in ink coating amount among sub-pixels is restrained. The row banks 122X prevent the pixel electrodes 119 from being exposed, so that light emission does not occur in regions where the row banks 122X are present, and the regions do not contribute to luminance.

The row banks 122X are present over column-directionally outer edges 119a1 and 119a2 of the pixel electrodes 119.

The row banks 122X prevent electric leaks between themselves and the common electrode layer 125, and define column-directional outer edges of the light emitting region 100a of each sub-pixel 100se.

The shape of the column bank 522Y is a linear shape extending in the column direction, and the section of the column bank 522Y obtained by cutting in parallel to the row direction is a normal-tapered trapezoid which is tapered upward. The column banks 522Y are for damming up flow of inks, which contain organic compounds as materials for the light emitting layers 123, in the row direction, thereby defining row-directional outer edges of the light emitting layers 123 to be formed.

The column banks 522Y have row-directional base portions defined by the row-directional outer edges 119a3 and 119a4 of the pixel electrodes 119 and the row-directional outer edges 135a1 and 135a2 of the first auxiliary electrode layers 135. The column banks 522Y prevent electric leaks between themselves and the common electrode layer 125, and define row-directional outer edges of the light emitting region 100a of each sub-pixel 100se. The column banks 522Y should have a repellency to the inks of not less than a predetermined value.

(5) Hole Transport Layer 121

As depicted in FIG. 4, hole transport layers 121 are stacked on the hole injection layers 120 in the gaps 522zR, 522zG and 522zB. In addition, the hole transport layers 121 are staked (not illustrated) also on the hole injection layers 120 at the row banks 122X. The hole transport layer 121 is in contact with the hole injection layer 120B of the hole injection layer 120. The hole transport layer 121 has a function of transporting holes, injected from the hole injection layer 120, to the light emitting layer 123. The hole transport layers 121 provided in the gaps 522zR, 522zG and 522zB are referred to as a hole transport layer 121R, a hole transport layer 121G and a hole transport layer 121B, respectively.

In the present embodiment, in the gaps 522z which will be described later, the hole transport layers 121 are provided in a linear shape such as to extend in the column direction, like the hole injection layers 120B. However, the hole transport layers 121 may be provided intermittently in the column direction in the gaps 522z.

(6) Light Emitting Layer 123

As depicted in FIG. 4, the light emitting layers 123 are stacked on the hole transport layers 121. The light emitting layer 123 is a layer composed of an organic compound, and has a function of emitting light through recombination of holes and electrons therein. In the gap 522zR, gap 522zG and gap 522zB which are defined by the column banks 522Y, the light emitting layers 123 are provided in a linear shape such as to extend in the column direction. In a red gap 522zR corresponding to the self-luminescence region 100aR of the red sub-pixel 100seR, a green gap 522zG corresponding to the self-luminescence region 100aG of the green sub-pixel 100seG and a blue gap 522zB corresponding to the self-luminescence region 100aB of the blue sub-pixel 100seB, there are formed light emitting layers 123R, 123G and 123B which emit light in respective colors.

Of the light emitting layer 123, only that part which is supplied with carriers from the pixel electrode 119 emits light. Therefore, in a range where the row bank 122X as an insulator is present between layers, the electroluminescence phenomenon of the organic compound does not occur. Accordingly, of the light emitting layer 123, only the part where the row bank 122X is absent emits light, and this part constitutes the self-luminescence region 100a. The column-directional outer edges of the self-luminescence region 100a are defined by column-directional outer edges of the row banks 122X.

Of the light emitting layer 123, those parts which are located over side surfaces and an upper surface of the row bank 122X do not emit light, and these parts constitute non-self-luminescence regions. In the self-luminescence region, the light emitting layer 123 is located on an upper surface of the hole transport layer 121, whereas, in the non-self-luminescence regions 100b, the light emitting layer 123 is located on an upper surface of the hole transport layer 121 on the upper surface and side surfaces of the row bank 122X (not illustrated).

Note that the light emitting layer 123 extends continuously, not only in the self-luminescence region 100a but also to the adjacent non-self-luminescence regions 100b. Such a configuration ensures that at the time of forming the light emitting layer 123, the ink applied to the self-luminescence region 100a can flow in the column direction through the ink applied to the non-self-luminescence regions 100b, and the film thickness can be leveled off among the pixels in the column direction. It is to be noted, however, that in the non-self-luminescence regions 100b, the flow of the ink is moderately restrained by the row banks 122X. Therefore, large variability in film thickness is not liable to be generated in the column direction, and variability in luminance from pixel to pixel is improved.

(7) Electron Transport Layer 124

As depicted in FIGS. 3, 4 and 5, an electron transport layer 124 is stackedly formed such as to cover the column banks 522Y and the gaps 522z defined by the column banks 522Y. The electron transport layer 124 is formed in the state of being continuous at least over the whole part of the display region of the display panel 10. The electron transport layer 124 includes an electron transport layer 124A composed of a metallic oxide, fluoride or the like, and an electron transport layer 124B containing an organic matter as a main constituent and stacked on the electron transport layer 124, in this order from the substrate 100x side (where the electron transport layers 124A and 124B are generically referred to, they will hereinafter be generically referred to as "electron transport layer 124").

As depicted in FIGS. 4 and 5, the electron transport layer 124 is formed on the light emitting layers 123. The electron transport layer 124 has a function of transporting electrons, coming from the common electrode layer 125, to the light emitting layers 123 and restricting the injection of electrons into the light emitting layers 123.

As depicted in FIGS. 4 and 5, the electron transport layer 124 is formed also over the first auxiliary electrode layers 135 and the second auxiliary electrode layers 200. In the configuration in the present embodiment in which the hole transport layers 121 are stacked on the second auxiliary electrode layers 200, therefore, the electron transport layer 124 is formed also on upper surfaces of the hole injection layers 121. As depicted in FIG. 5, the electron transport layer 124 is lacking (stepping) or thinned at end portions of the first auxiliary electrode layers 135 and at end portions of the second auxiliary electrode layers 200.

Here, "lacking" refers to a state in which part of the electron transport layer 124 breaks off to be discontinuous and the underlying layer is seen there. Due to the lacking, a structure can be realized in which the common electrode layer 125 and the first auxiliary electrode layer 135 make contact with each other at the lacking part of the electron transport layer 124, and they are electrically connected to each other there. Therefore, the common electrode layer 125 and the first auxiliary electrode layer 135 are connected at a lower electric resistance at the lacking part of the electron transport layer 124 than at the other parts of the electron transport layer 124.

In addition, "thinning" refers to a state in which part of the electron transport layer 124, though not reaching a lacking state, is thinned at sectional portions than on upper flat surfaces of the first auxiliary electrodes 135 and the second auxiliary electrodes 200, to form thinned parts. By the thinning, a structure can be realized in which the common electrode layer 125 and the first auxiliary electrode layer 135 are electrically connected with each other at a lower electric resistance at the thinned part of the electron transport layer 124 than at the other parts of the electron transport layer 124.

Besides, in the electron transport layer 124, the resistance of the electron transport layer 124A composed of a metallic oxide, fluoride or the like is high, and, therefore, a great effect can be obtained by only lacking or thinning of the electron transport layer 124A.

Therefore, a surface layer 201 of the second auxiliary electrode layer 200 and the common electrode layer 125 make contact with each other at side surface portions of the second auxiliary electrode layer 200 which correspond to the lacking or thinned parts of the electron transport layer 124. However, since an oxide of aluminum is formed at the surface layer 201 of the second auxiliary electrode layer 200 as aforementioned, the electric contact resistance between the surface layer 201 of the second auxiliary electrode layer 200 and the common electrode layer 125 is high.

On the other hand, at partial areas 135a1 and 135a2 on side surfaces of the first auxiliary electrode layer 135 which correspond to the lacking or thinned parts of the electron transport layer 124, the first auxiliary electrode layer 135 and at least part of the common electrode layer 125 are in contact with each other. In these areas, an oxide of a metal is not formed at surface layer portions of the first auxiliary electrode layer 135, and, therefore, the electric contact resistance between the partial areas 135a1 and 135a2 on the side surfaces of the first auxiliary electrode layer 135 and the common electrode layer 125 is low.

In this instance, the electron transport layer 124 which is a functional layer composed of at least one layer is disposed between the second auxiliary electrode layer 200 and the common electrode layer 125, and the thickness of the first auxiliary electrode layer 135 is preferably greater than the total thickness of the electron transport layer 124. In other words, the thickness of the first auxiliary electrode layer 135 is preferably greater than the total thickness of the functional layer which is formed by a vacuum deposition method in the state of being stacked on the first auxiliary electrode layer 135 after the formation of the pixel electrodes 119 (first auxiliary electrode layer 135) and which constitutes a high resistance component in electrical contact.

By adopting such a configuration, as depicted in FIG. 5, it is ensured that in the partial areas 135a1 and 135a2 on the side surfaces of the first auxiliary electrode layer 135, the first auxiliary electrode layer 135 and the common electrode layer 125 can be made to contact each other at a lower resistance than on the upper surface of the first auxiliary electrode layer 135.

(8) Common Electrode Layer 125

As depicted in FIGS. 4 and 5, the common electrode layer 125 is formed on the electron transport layer 124. The common electrode layer 125 constitutes an electrode common to the light emitting layers 123. The common electrode layer 125 includes a common electrode layer 125A composed of a metallic oxide, and a common electrode layer 125 containing a metal as a main constituent and stacked on the common electrode layer 125A in this order from the substrate 100x side (where the common electrode layer 125A and the common electrode layer 125B are generically referred to, they will hereinafter be generically referred to as "common electrode layer 125").

As depicted in FIG. 4, the common electrode layer 125 is formed over the pixel electrodes 119 on the electron transport layer 124. The common electrode layer 125 cooperates with the pixel electrode 119 in sandwiching the light emitting layer 123 to form a conducting path, for supplying carriers to the light emitting layer 123; for example, when functioning as a cathode, the common electrode layer 125 supplies electrons to the light emitting layer 123.

As depicted in FIGS. 4 and 5, the common electrode layer 125A is formed also in areas over the first auxiliary electrode layers 135 and the second auxiliary electrode layers 200. In this instance, the common electrode layer 125A makes electrical contact with the partial areas 135a1 and 135a2 on the side surfaces of the first auxiliary electrode layers 135 which correspond to the lacking or thinned parts of the electron transport layer 124.

On the other hand, the common electrode layer 125B is mainly formed only on the upper surface of the common electrode layer 125A, as depicted in FIGS. 4 and 5.

(9) Sealing Layer 126

A sealing layer 126 is stackedly formed such as to cover the common electrode layer 125. The sealing layer 126 is for restraining the light emitting layers 123 from being deteriorated through contact with moisture or air. The sealing layer 126 is provided such as to cover the upper surface of the common electrode layer 125.

(10) Bonding Layer 127

On the upper side in the Z-axis direction of the sealing layer 126, a color filter substrate 131 having color filter layers 128 formed on a main surface on the lower side in the Z-axis direction of an upper substrate 130 is disposed, and is bonded to the sealing layer 126 by a bonding layer 127. The bonding layer 127 has a function of laminating a back panel, composed of layers ranging from the substrate 100x to the sealing layer 126, and the color filter substrate 131 with each other, and preventing each of the layers from being exposed to moisture or air.

(11) Upper Substrate 130

The color filter substrate 131 having the color filter layers 128 formed on the upper substrate 130 is disposed on and bonded to the bonding layer 127. With the upper substrate 130 thus provided, it is possible to enhance rigidity of the display panel 10 and prevent penetration of moisture, air or the like.

(12) Color Filter Layer 128

The upper substrate 130 is formed with the color filter layers 128 at positions corresponding to the color self-luminescence regions 100a. The color filter layers 128 are transparent layers provided for transmitting therethrough visible lights of wavelengths corresponding to R, G and B, and have a function of permitting the light emitted from each color pixel to pass therethrough, thereby correcting chromaticity of the light. For instance, in the present example, red, green and blue filter layers 128R, 128G and 128B are formed on the upper side of the self-luminescence regions 100aR in the red gaps 522zR, the self-luminescence regions 100aG in the green gaps 522zG and the self-luminescence regions 100aB in the blue gaps 522zB, respectively.

(13) Light-shielding Layer 129

The upper substrate 130 is formed with a light-shielding layer 129 at positions corresponding to boundaries between the light emitting regions 100a of the pixels. The light-shielding layer 129 is a black resin layer provided for inhibiting transmission therethrough of visible lights of wavelengths corresponding to R, G and B, and is formed from, for example, a resin material containing a black pigment excellent in light-absorbing and light-shielding properties.

1.4.3 Constituent Material of Each Section

An example of constituent materials of the sections depicted in FIGS. 3, 4 and 5 will be given below.

(1) Substrate 100x (TFT Substrate)

The TFT layer has a TFT circuit formed on a base material 100p, an inorganic insulating layer 116 formed on the TFT circuit, and a planarizing layer 118. The TFT circuit includes a plurality of TFTs and wiring formed on an upper surface of the base material 100p. The TFT is for electrically connecting the pixel electrode 119 corresponding to itself and an external power supply according to a drive signal from an external circuit for a light emitting element 100, and has a multilayer structure including electrodes, a semiconductor layer, an insulating layer and the like. The wiring electrically connects the TFTs, the pixel electrodes 119, the external power supply, the external circuit and the like.

Known materials can be used for a gate electrode, a gate insulating layer, a channel layer, a channel protection layer, a source electrode, a drain electrode and the like which constitute the TFT. As the gate electrode, a laminated body of copper (Cu) and molybdenum (Mo) is adopted, for example.

For the gate insulating layer 103, there can be used any of known organic materials and inorganic materials that have an electrically insulating property such as, for example, silicon oxide ($SiO_2$) and silicon nitride (SiNx). For the channel layer, there can be adopted at least one oxide semiconductor selected from among indium (In), gallium (Ga) and zinc (Zn).

For the channel protection layer 106, there can be used, for example, silicon oxynitride (SiON), silicon nitride (SiNx) or aluminum oxide (AlOx). As the source electrode and the drain electrode, there can be adopted, for example, a laminated body of copper-manganese (CuMn) and copper (Cu) and molybdenum (Mo).

An inorganic insulating layer 116 at an upper portion of the TFT is composed of an inorganic compound having a gas barrier property. For example, silicon oxide ($SiO_2$), silicon nitride (SiN), silicon oxynitride (SiON) and silicon oxide (SiO) can be used.

As a connection electrode layer of the TFT, there can be adopted, for example, a laminated body of molybdenum (Mo), copper (Cu) and copper-manganese (CuMn). Note that the material to be used for constituting the connection electrode layer is not limited to this, and can be appropriately selected from among conductive materials.

As a material for the planarizing layer 118 located on an upper surface of the substrate 100x, there can be used organic compounds such as, for example, polyimide resins, acrylic resins, siloxane resins, and novolak type phenolic resins.

(2) Pixel Electrode 119, Auxiliary Pixel Electrode 150, Second Auxiliary Electrode Layer 200 and First Auxiliary Electrode Layer 135

The pixel electrode 119 is composed of a metallic material. In the case of the display panel 10 according to the present embodiment, which is of the top emission type, by adopting an optical resonator structure through optimum thickness setting, the chromaticity of light to be emitted is adjusted and the luminance is enhanced; therefore, a surface portion of the pixel electrode 119 should have a reflecting property. In the display panel 10 according to the present invention, the pixel electrode 119 may have a structure in which a plurality of films selected from among metal layers, alloy layers and transparent conductive films are stacked. The metal layer can be composed of a material having a low sheet resistance and a high light-reflecting property, for example, a metallic material containing silver (Ag) or aluminum (Al). For instance, aluminum (Al) alloys have a high reflectance of 80% to 95% and a low electric resistivity of $2.82 \times 10^{-8}$ Ωm, and are therefore suitable for use as a material of the second auxiliary electrode layer 200.

Other than the metal layer of an aluminum alloy or the like, there can be used, for example, silver, silver-containing alloys and the like, from the viewpoint of high reflectance. As the constituent material of the transparent conductive layer, there can be used, for example, ITO (Indium Tin Oxide) and IZO (Indium Zinc Oxide) and the like. Further, metal layers and alloy layers containing aluminum as a main constituent are preferably used, from the viewpoint of cost.

The thickness of the second auxiliary electrode layer 200 is preferably 30 to 500 nm, from the viewpoint of reflectance and sheet resistance; in the present embodiment, the thickness is 100 nm, for example.

The reason is as follows. Since the second auxiliary electrode layer 200 is formed simultaneously with, and in the same layer as that of, the pixel electrode 119 on the substrate, the second auxiliary electrode layer 200 is formed of the same material as that of the pixel electrode 119. Therefore, it is the most preferable to use a metal layer or alloy layer containing aluminum as a main constituent as the second auxiliary electrode layer 200.

The first auxiliary electrode layer 135 is formed from a material which contains as a main constituent a metal different from that of the material constituting the second auxiliary electrode layer 200 and which is lower in contact resistance in air than the material constituting the second auxiliary electrode layer 200. Specifically, the first auxiliary electrode layer 135 is preferably formed from a metallic material such as, for example, tungsten (W), chromium (Cr), titanium (Ti), molybdenum (Mo), nickel (Ni), copper (Cu), lanthanum (La), or indium (In). For instance, tungsten (W) has a reflectance of 50% to 60% and an electric resistivity of approximately $5.29 \times 10^{-8}$ Ωm, which are inferior to those of aluminum (Al), but the first auxiliary electrode layer 135 is stacked with the upper layer of the second auxiliary electrode layer 200 and can make electrical contact with the latter. Therefore, the sheet resistance of the auxiliary electrode can be lowered, and high reflection as the pixel electrode 119 formed in the same layer can also be realized. For this reason, tungsten (W) is suitable as a material of the first auxiliary electrode layer 135 serving as a lower layer. Besides, under the same thought, a metallic oxide such as ITO and IZO can be used as the second auxiliary electrode. With such a material used for the first auxiliary electrode layer 135, it is ensured that although the sheet resistance of the first auxiliary electrode alone is inferior to that of aluminum, the stacking with the second auxiliary electrode 200 makes it possible to lower the sheet resistance, and a metallic oxide having a high resistance is not liable to be formed at a surface layer part of the first auxiliary electrode layer 135. As a result, the good electric contact resistance between the common electrode layer 125 and the partial areas 135$a$1 and 135$a$2 on the side surfaces of the first auxiliary electrode layer 135 which make contact with the common electrode layer 125 can be further lowered.

The thickness of the first auxiliary electrode layer 135 is preferably 5 to 200 nm, as aforementioned; in the present embodiment, the thickness is 50 nm, for example.

(3) Hole Injection Layer 120

The hole injection layer 120A is a layer composed of an oxide of, for example, silver (Ag), molybdenum (Mo), chromium (Cr), vanadium (V), tungsten (W), nickel (Ni), iridium (Ir) or the like. In the case where the hole injection layer 120A is composed of an oxide of a transition metal, the transition metal can take a plurality of oxidation numbers and, hence, can take a plurality of levels, with the result that hole injection is facilitated and a driving voltage can be lowered.

In the present embodiment, the hole injection layer 120A included an oxide of tungsten (W) (in the composition formula $WO_x$, x is a real number in the range of approximately $2<x<3$). In this case, in relation to the oxidation number of tungsten (W), as the ratio ($W^{5+}/W^{6+}$) of pentavalent tungsten atoms to hexavalent tungsten atoms is higher, the driving voltage for the organic EL element is lower; therefore, it is preferable that the tungsten oxide contains pentavalent tungsten atoms in a large amount of not less than a predetermined value. The hole injection layer 120A is configured as a tungsten oxide layer having a film thickness of 2 to 30 nm (here, 10 nm, for example). While the hole injection layer 120A is desirably formed of tungsten oxide, it may contain extremely minute amounts of impurities in such an extent as to be mixed ordinarily. When film thickness is not less than 2 nm, uniform film formation can be easily realized, and Schottky ohmic connection between an anode 2 and the hole injection layer 120 (described later) can be easily formed; therefore, a film thickness of not less than 2 nm is preferable. Since the Schottky ohmic connection is formed stably when the tungsten film thickness is not less than 2 nm, if the hole injection layer 120 is formed in a film thickness of not less than 2 nm, stable and efficient injection of holes from the pixel electrode 119 into the hole injection layer 120 can be expected through utilization of the Schottky ohmic connection. Here, "Schottky ohmic connection" refers to connection in which the difference between the Fermi level of the pixel electrode 119 and the lowest binding energy of occupied levels in the vicinity of the Fermi surface of the hole injection layer 120 aforementioned is not more than a predetermined value.

As the hole injection layer 120B, there can be used, for example, a coating film formed from an organic polymer solution of a conductive polymer material such as PEDOT (a mixture of polythiophene and polystyrenesulfonic acid), as aforementioned. In addition, where the hole injection layers 120B provided in the blue sub-pixel, the green sub-pixel and the red sub-pixel are referred to respectively as hole injection layers 120BB, 120BG and 120BR, as depicted in FIG. 4, the thickness of the hole injection layer 120BR is greater than the thickness of the hole injection layer 120BB and the thickness of the hole injection layer 120BG. It is preferable that the thickness of the hole injection layer 120BB is greater than 0 nm and not more than 25 nm, the thickness of the hole injection layer 120BG is greater than 0 nm and not more than 30 nm, and the thickness of the hole injection layer 120BR is 20 to 50 nm.

(4) Bank 122

The banks 122 are formed by use of an organic material such as resin, and has an insulating property.

Alternatively, the banks 122 may be formed by use of an inorganic material; in this case, it is preferable to use, for example, silicon oxide (SiO) from the viewpoint of refractive index. Alternatively, such an inorganic material as silicon nitride (SiN) or silicon oxynitride (SiON) is used to form the banks 122.

Further, since the banks 122 may be subjected to an etching treatment, a baking treatment or the like during manufacturing step, the banks 122 are preferably formed by use of a material high in durability such as not to be excessively deformed or denatured by these treatments.

In addition, surfaces of the banks 122 may be subjected to a fluorine treatment for imparting water repellency to the surfaces. Besides, the banks 122 may be formed using a fluorine-containing material. Further, in order to lower water repellency of the surfaces of the banks 122, the banks 122 may be subjected to irradiation with UV (Ultraviolet) rays or a baking treatment at a low temperature.

(5) Hole Transport Layer 121

The hole transport layers 121 may be formed by use of a high-molecular compound such as, for example, polyolefins and their derivatives, and polyarylamines, which are amine-based organic polymers, and their derivatives. Where the hole transport layers 121 provided in a blue sub-pixel, a green sub-pixel and a red sub-pixel are referred to as a hole transport layer 121B, a hole transport layer 121G and a hole transport layer 121R as depicted in FIG. 4, the film thickness of them is preferably in the range of approximately 10 to 30 nm.

(6) Light Emitting Layer 123

The light emitting layers 123 have a function of emitting light by generation of an excited state through recombination of holes and electrons injected thereinto. The materials to be used for forming the light emitting layers 123 should be light transmitting organic materials which can be formed into a film by a wet type printing method.

(7) Electron Transport Layer 124

For the electron transport layer 124, an organic material having a high electron transporting property is used. The electron transport layer 124A may include a layer formed from sodium fluoride. Examples of the organic material to be used for the electron transport layer 124B include 7E electron low-molecular-weight organic materials. The electron transport layer 124A is formed in a film thickness in the range of 1 to 10 nm.

In addition, the electron transport layer 124B may include a layer formed from a highly electron-transporting organic material doped with a dopant metal selected from among alkali metals and alkaline earth metals. In the embodiment, doping with Ba is adopted. The Ba doping concentration is not more than 40 wt %, preferably not more than 20 wt %, and more preferably not more than 15 wt %. The film thickness of the electron transport layer 124B is in the range of 10 to 50 nm. In the present embodiment, the electron transport layer 124B was formed in a film thickness of approximately 30 nm.

(8) Common Electrode Layer 125

The common electrode layer 125A is formed by use of a light-transmitting conductive material such as, for example, indium tin oxide (ITO) or indium zinc oxide (IZO).

The common electrode layer 125B is formed by use of a thinned electrode of silver (Ag), aluminum (Al) or the like.

(9) Sealing Layer 126

The sealing layer 126 has a function of restraining organic layers such as the light emitting layers 123 from being exposed to moisture or air, and is formed by using a light-transmitting material such as, for example, silicon nitride (SiN) or silicon oxynitride (SiON). In addition, a sealing resin layer composed of a resin material such as acrylic resins and silicone resins may be formed on a layer formed by use of such a material as silicon nitride (SiN) or silicon oxynitride (SiON).

In the case of the display panel 10 according to the present embodiment which is of the top emission type, the sealing layer 126 should be formed of a light-transmitting material.

(10) Bonding Layer 127

The material for forming the bonding layer 127 is, for example, a resin adhesive or the like.

(11) Upper Substrate 130

As the upper substrate 130, there can be adopted substrates of light-transmitting materials such as glass substrates, quartz substrate, and plastic substrates.

(12) Color Filter Layer 128

For the color filter layer 128, there can be adopted known resin materials (commercialized resin materials include Color Resist, made by JSR Corporation).

(13) Light-shielding Layer 129

The light-shielding layer 129 is formed from a resin material containing a UV-curing resin (for example, a UV-curing acrylic resin) as a main constituent to which a black pigment is added. As the black pigment, there can be adopted light-shielding materials such as carbon black pigments, titanium black pigments, metallic oxide pigments, and organic pigments.

2. Method of Manufacturing Display Panel 10

A method of manufacturing the display panel 10 will be described below referring to FIGS. 6A to 11. FIGS. 6A to 11 each depict a schematic sectional view taken at the same position as line A1-A1 of FIG. 3, depicting a state in each step in manufacture of the display panel 10.

(1) Preparation of Substrate 100x

Figure 6A:
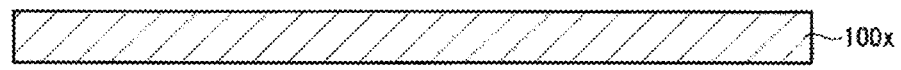
FIGS. 6A to 6D are schematic sectional views taken at the same position as line A1-A1 of FIG. 3 in a state of each step in manufacture of the organic EL display panel according to at least one embodiment.

A substrate 100x formed with a plurality of TFTs and wiring is prepared. The substrate 100x can be manufactured by a known TFT manufacturing method (FIG. 6A).

(2) Formation of Planarizing Layer 118

Figure 6B:

A constituent material (photosensitive resin material) of the aforementioned planarizing layer 118 as a photoresist is applied to the substrate 100x in such a manner as to cover the substrate 100x, to planarize the surface of the substrate 100x, thereby forming a planarizing layer 118 (FIG. 6B).

Formation of contact holes (not illustrated) is conducted by the following process. First, after the planarizing layer 118 is formed, a photomask provided with predetermined openings is placed thereon, and irradiation with UV rays from above is conducted to expose the planarizing layer 118, thereby transferring the pattern possessed by the photomask. Thereafter, development is conducted, to form the planarizing layer 118 in which the contact holes have been patterned. Wiring on the substrate 100x is exposed at bottom portions of the contact holes. While the planarizing layer 118 is formed by use of a positive type photoresist, the planarizing layer 118 may be formed by use of a negative type photoresist.

(3) Formation of Auxiliary Pixel Electrodes 150, First Auxiliary Electrode Layer 135, Pixel Electrodes 119, Second Auxiliary Electrode Layer 200 and Hole Injection Layer 120A After a metal film is stackedly formed by use of a vapor phase growth method such as a sputtering method and a vacuum deposition method, patterning is performed by a photolithographic method and an etching method.

Specifically, first, the planarizing layer 118 formed with the contact holes is formed, after which the surface of the planarizing layer 118 is subjected to a dry etching treatment, thereby performing pre-film-formation cleaning.

Figure 6C:
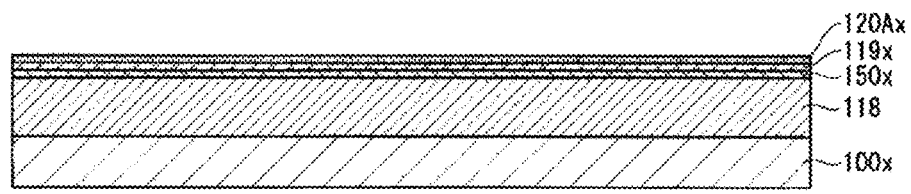

Next, a first metal layer 150x for forming auxiliary pixel electrodes 150 and a first auxiliary electrode layer 135 is formed on the surface of the planarizing layer 118 by a vapor phase growth method such as a sputtering method or a vacuum deposition method (FIG. 6C). In this example, a film of tungsten is formed by a sputtering method.

Further, the surface of the first metal layer 150x is subjected to pre-film-formation cleaning, after which a second metal layer 119x for forming pixel electrodes 119 and a second auxiliary electrode layer 200 is formed on the surface of the first metal layer 150x by a vapor phase growth method (FIG. 6C). In this example, a film of aluminum or an alloy containing aluminum as a main constituent is formed by a sputtering method.

Furthermore, the surface of the second metal layer 119x is subjected to pre-film-formation cleaning, after which a third metal layer 120Ax for forming a hole injection layer 120A is formed on the surface of the second metal layer 119x by a vapor phase growth method (FIG. 6C). In this example, a film of tungsten is formed by a sputtering method.

Figure 6D:
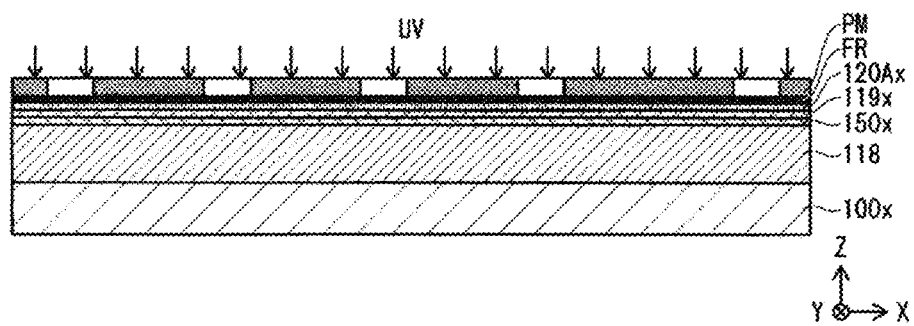

Thereafter, a photoresist layer FR composed of a photosensitive resin is formed by coating, after which a photomask PM formed with predetermined openings is placed thereon, and irradiation with UV rays from above is conducted to expose the photoresist, thereby transferring a pattern possessed by the photomask to the photoresist (FIG. 6D). Next, the photoresist layer FR is patterned by development.

Thereafter, through the photoresist layer FR thus patterned, the third metal layer 120Ax is patterned by a dry etching treatment, thereby forming the hole injection layers 120A.

Subsequently, through the photoresist layer FR and the hole injection layer 120A thus patterned, the second metal layer 119x is patterned by a wet etching treatment, thereby forming the pixel electrodes 119 and the second auxiliary electrode layers 200. In this instance, the second auxiliary electrode layers 200 patterned by the wet etching treatment may be over-etched by several micrometers, as compared to the second metal layer 119x, the hole injection layers 120A and the first auxiliary electrode layers 135 which are patterned by a dry etching treatment. In the present disclosure, it is essential that the second auxiliary electrode layers 200 are superposed on the first auxiliary electrode layers 135. It is natural that the superposed state permits the second auxiliary electrode layers 200 to be over-etched by several micrometers as compared to the first auxiliary electrode layers 135.

Further, subsequently, through the photoresist layer FR, the hole injection layers 120A, the pixel electrodes 119 and the second auxiliary electrode layers 200 thus patterned, the first metal layer 150x is patterned by a drying etching method, to form the auxiliary pixel electrodes 150 and the first auxiliary electrode layers 135. The reason why the dry etching treatment is conducted lies in that tungsten and tungsten oxide film are largely different from the aluminum alloy in wet etching rate and it is therefore difficult to treat them all together. While the dry etching in argon gas or the like is used for tungsten and tungsten oxide and the wet etching is used for the aluminum alloy in the present embodiment, this is not restrictive.

In the present embodiment, by forming and baking the hole injection layer 120A under predetermined conditions, the hole injection layer 120 composed of a tungsten oxide film containing tungsten oxide having an oxygen defect structure is formed, thereby forming the aforementioned occupied levels.

Here, it is preferable to form the film by a reactive sputtering method, since generation of variability in film formation is restrained thereby. Specifically, a reactive sputtering process is conducted with metallic tungsten as a target. Argon gas as a sputtering gas and oxygen gas as a reactive gas are introduced into a chamber. In this state, argon is ionized by a high voltage, and argon atoms are made to collide against the target. Metallic tungsten released by a sputtering phenomenon reacts with oxygen gas to become tungsten oxide, whereby a film is formed. Note that the film forming conditions in this instance are preferably set to a so-called low-rate condition.

Further, the tungsten oxide film thus formed may be subjected to individual baking steps. In this instance, formation of the tungsten oxide film may be conducted in a plurality of runs according to the film thickness, a baking step may be performed after each film forming step, and the film forming step and the baking step may be repeated multiple times. By this, film density is enhanced, and dissolution resistance is imparted to the film. Specifically, the hole injection layers 120A are subjected to a baking step (a step of baking in air at a heating temperature of 200° C. to 230° C. for a heating time of 15 to 45 minutes) under predetermined conditions after the formation of the tungsten oxide film, for realizing vitrification or densification. By this, the film density is increased to within the range of 5.8 to 6.0 g/cm$^3$. With the film density thus increased, dissolution resistance against an etching liquid or a cleaning liquid used in a bank forming step in manufacture is imparted to the film, and film consumption is restrained. Based on the above-mentioned baking conditions, the oxygen defect structure in the film is maintained even upon the baking step, so that the occupied levels are retained, and hole injection characteristic is prevented from being lowered. In this way, a process for realizing both good hole injection characteristics and dissolution resistance is used. However, a process may be adopted in which a tungsten film with a thickness of approximately 2 nm is formed by a sputtering, followed by baking in air at a heating temperature of 200° C. to 230° C., to obtain a monolayer film of tungsten oxide, or in which such tungsten film formation and baking are repeated multiple times to obtain a tungsten oxide film with a desired thickness.

Figure 7A:
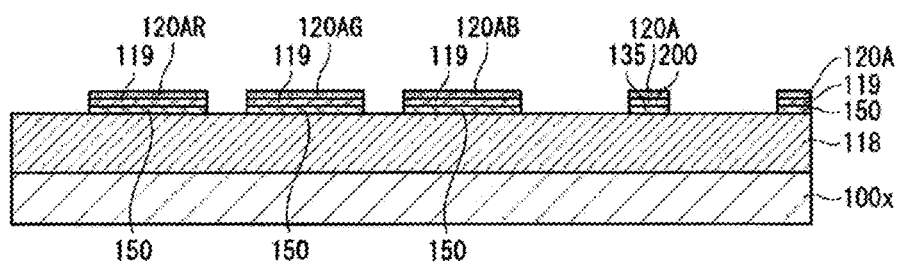
FIGS. 7A to 7C are schematic sectional views taken at the same position as line A1-A1 of FIG. 3 in a state of each step in manufacture of the organic EL display panel according to at least one embodiment.

Finally, the photoresist film FR is peeled, to form stacked bodies of the auxiliary pixel electrodes 150, the pixel electrodes 119 and the hole injection layer 120A which are patterned in the same shape, as well as stacked bodies of the first auxiliary electrode layers 135, the second auxiliary electrode layers 200 and the hole injection layer 120A which are patterned in the same shape (FIG. 7A).

In this instance, a metal film is formed along inner walls of the contact holes, to form connection recesses for the auxiliary pixel electrodes 150.

The auxiliary pixel electrodes 150 make contact with the wiring on the substrate 100x exposed at bottom portions of the contact holes, and are in the state of being electrically connected to the electrodes of the TFTs.

(4) Formation of Banks 122

Figure 7B:
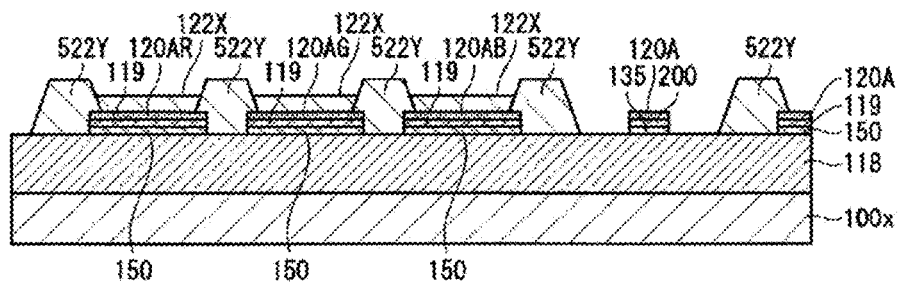

After the hole injection layers 120A of the hole injection layers 120 are formed, the banks 122 are formed such as to over the hole injection layers 120A. In the formation of the banks 122, row banks 122X are first formed, after which column banks 522Y are formed such as to form gaps 522Z (FIG. 7B).

In forming the banks 122, first, a film composed of a constituent material of the banks 122 (for example, a photosensitive resin material) is stackedly formed on the hole injection layers 120A by use of a spin coating method or the like. Then, the resin film is patterned to form the row banks 122X and the column banks 522Y sequentially. The patterning of the row banks 122X and the column banks 522Y is conducted by performing exposure utilizing a photomask on over the resin film, and performing a developing step and a baking step (approximately 230° C., approximately 60 minutes).

Specifically, in the step of forming the row banks 122X, first, a photosensitive resin film composed of an organic photosensitive resin material such as acrylic resin, polyimide resin or novolak type phenolic resin is formed. Thereafter, drying is conducted to volatilize the solvent to a certain extent, after which a photomask provided with predetermined openings is laid on the resin film, and irradiation with UV rays from above is performed to expose the photoresist composed of the photosensitive resin or the like to the light, whereby a pattern possessed by the photomask is transferred to the photoresist. Next, the photosensitive resin is developed, to form an insulating layer in which the row banks 122X have been patterned. A so-called positive type photoresist is used. In the case of the positive type, those parts exposed to light are removed by development. Those parts which are not exposed to light remain without being removed by development.

Here, in forming the hole injection layers 120A, a film composed of a metal (for example, tungsten) is formed by use of a sputtering method or a vapor phase growth method such as a vacuum deposition method, followed by patterning the film on a pixel basis by use of a photolithographic method and an etching method, as aforementioned. In this case, in a baking step of the row banks 122X and the column banks 522Y, the metal is oxidized, to form the hole injection layers 120A completely.

In the step of forming the column banks 522Y, first, a film composed of a constituent material of the column banks 522Y (for example, a photosensitive resin material) is stackedly formed by use of a spin coating method or the like. Then, the resin film is patterned to open gaps 522z, thereby forming the column banks 522Y. The formation of the gaps 522z is conducted by performing exposure to light by disposing a mask over the resin film, followed by development. The column banks 522Y extend in the column direction, and are juxtaposedly arrayed in the row direction through the gaps 522z.

(5) Formation of Organic Functional Layer

Figure 7C:
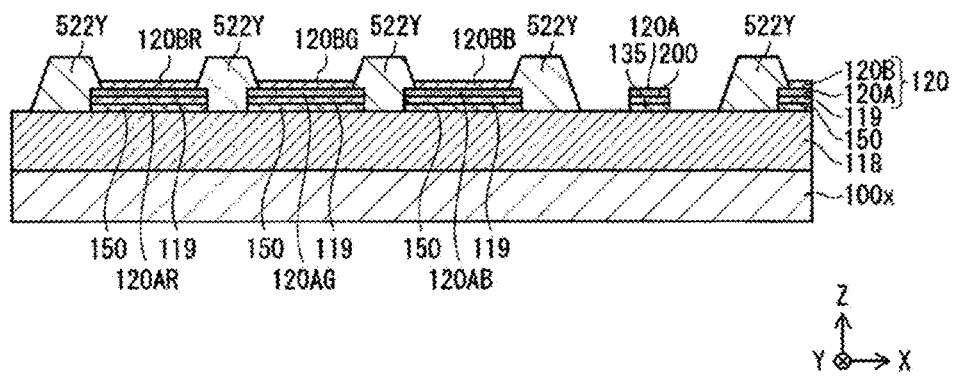

On the hole injection layers 120A of the hole injection layers 120 formed in the gaps 522z defined by the column banks 522Y inclusive of the areas on the row banks 122X, the hole injection layers 120B of the hole injection layers 120 and the hole transport layers 121 and the light emitting layers 123 are sequentially stackedly formed (FIG. 7C).

In forming the hole injection layers 120B, an ink containing a conductive polymer material such as PEDOT (a mixture of polythiophene and polystyrenesulfonic acid) is applied to the inside of the gaps 522z defined by the column banks 522Y by use of an ink jet method, followed by evaporating off the solvent or by baking. Thereafter, patterning on a pixel basis may be performed by use of a photolithographic method and an etching method.

Figure 8A:
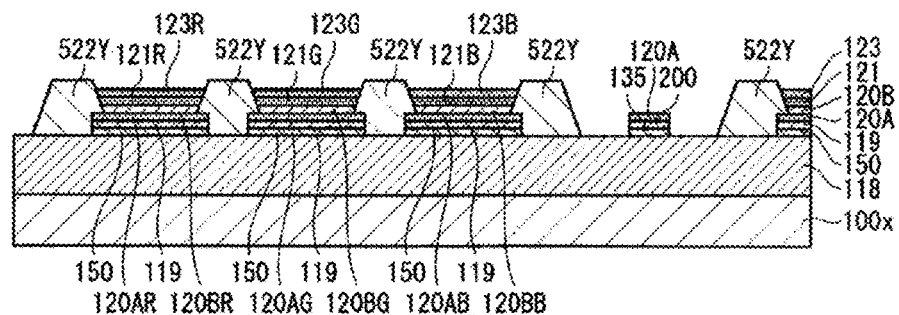
FIGS. 8A to 8D are schematic sectional views taken at the same position as line A1-A1 of FIG. 3 in a state of each step in manufacture of the organic EL display panel according to at least one embodiment.

In forming the hole transport layers 121, an ink containing a constituent material thereof is applied to the inside of the gaps 522z defined by the column banks 522Y by use of a wet process such as an ink jet method or a gravure printing method, followed by evaporating off the solvent or by baking (FIG. 8A). The method for applying the ink of the hole transport layers 121 to the inside of the gaps 522z is the same as that in the case of the hole injection layers 120B mentioned above. Alternatively, a film composed of a metal (for example, tungsten) is deposited by use of a sputtering method, and is oxidized by baking. Thereafter, patterning on a pixel basis may be conducted by use of a photolithographic method and an etching method.

The light emitting layers 123 are formed by applying inks containing the constituent materials thereof to the gaps 522z defined by the column banks 522Y by use of an ink jet method, followed by baking (FIG. 8A). Specifically, in this step, an ink 123RI, 123GI or 123BI containing a material for an organic light emitting layer for one of R, G and B is placed to fill the gaps 522z to be sub-pixel forming regions by an ink jet method, and the ink filling the gaps 522z is dried under a reduced pressure, followed by a baking treatment, to form one kind of the light emitting layers 123R, 123G or 123B. In this instance, in application of the ink of the light emitting layers 123, first, a solution for forming the light emitting layers 123 is applied by use of a droplet jetting device. When the application of the ink for forming one kind of red light emitting layers, green light emitting layers and blue light emitting layers on the substrate 100x is finished, an ink of another color is next applied to the substrate, and, subsequently, an ink of the third color is applied to the substrate; in this way, the ink applying step is repeated, to sequentially apply three color inks. As a result, the red light emitting layers, the green light emitting layers and the blue light emitting layers are formed on the substrate 100x in the state of being repeatedly arrayed in the horizontal direction on the paper surface of the drawing. The details of the method for applying each of the inks of the light emitting layers 123 to the inside of the gaps 522z are the same as those in the method for forming the hole injection layers 120B described above.

The method for forming the hole injection layers 120B of the hole injection layers 120, the hole transport layers 121 and the light emitting layers 123 is not limited to the above-mentioned method. Other than the ink jet method and the gravure printing method, there may also be used such known methods as a dispenser method, a nozzle coating method, a spin coating method, intaglio printing, and relief printing, to drop or apply the inks.

As depicted in FIGS. 3, 4 and 5, the electron transport layer 124 is stackedly formed such as to cover the column banks 522Y and the gaps 522z defined by the column banks 522Y. The electron transport layer 124 is formed in the state of being continuous over at least the whole area of a display region of the display panel 10. The electron transport layer 124 includes an electron transport layer 124A composed of a metallic oxide, fluoride or the like, and an electron transport layer 124B containing an organic matter as a main constituent and stacked on the electron transport layer 124A, in this order from the substrate 100x side (where the electron transport layers 124A and 124B are generically referred to, they will hereinafter be generically referred to as "electron transport layer 124").

(6) Formation of Electron Transport Layer 124

Figure 8B:
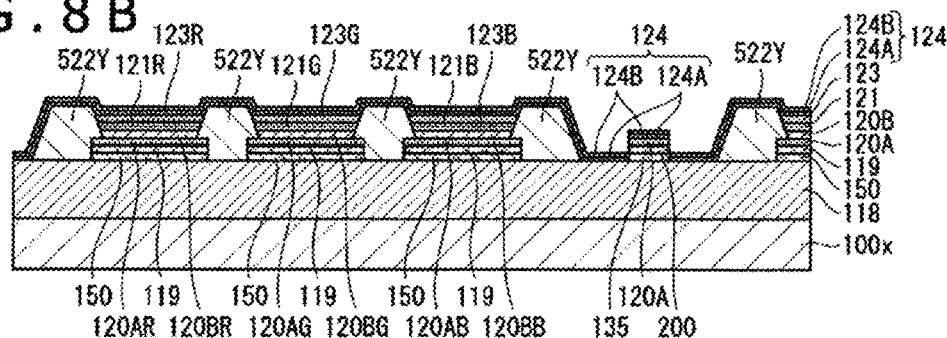

After the light emitting layers 123 are formed, the electron transport layer 124 is formed over the whole area of a light emitting area (display region) of the display panel 10 by a vacuum deposition method or the like (FIG. 8B). The vacuum deposition method is used, on one hand, for preventing the light emitting layers 123, which are organic films, from being damaged. On the other hand, the vacuum deposition method is used for the following reason. In the vacuum deposition method, the molecules relevant to film formation go straight in the vertical direction toward the substrate, to form a film. Therefore, in partial areas 135a1 and 135a2 of stepped surfaces of the first auxiliary electrodes 135 and the second auxiliary electrodes 200 in the present embodiment, film formation is less liable to occur, and the film can be made to be lacking (stepping) or thinned there. The electron transport layer 124 includes the electron transport layer 124A composed of a metallic oxide, fluoride or the like, and the electron transport layer 124B containing an organic matter as a main constituent and stacked on the electron transport layer 124B, in this order from the substrate 100x side. The electron transport layer 124A is formed on the light emitting layers 123 by depositing a metallic oxide or fluoride in a film thickness of, for example, 1 to 10 nm by a vacuum deposition method or the like. On the electron transport layer 124A, the electron transport layer 124B is formed in a film thickness of, for example, 10 to 50 nm by a co-evaporation method of an organic material and a metallic material. The electron transport layer 124 is formed also on the second auxiliary electrode layers 200 and the first auxiliary electrode layers 135 (exclusive of those areas on the first auxiliary electrode layers 135 in which the second auxiliary electrode layers 200 are formed). In this instance, the electron transport layer 124 is formed to be lacking (stepping) or thinned at end portions of the first auxiliary electrode layers 135 and end portions of the second auxiliary electrode layers 200. Note that the film thicknesses of the electron transport layers 124A and 124B are merely illustrative and not restrictive; thus, suitable film thicknesses which are most advantageous from the viewpoint of optical take-out of light are adopted.

(7) Formation of Common Electrode Layer 125

After the electron transport layer 124 is formed, the common electrode layer 125 is formed such as to cover the electron transport layer 124. The common electrode layer 125 includes a common electrode layer 125A composed of a metallic oxide, and a common electrode layer 125B composed of a metal as a main constituent and stacked on the common electrode layer 125A, in this order from the substrate 100x side.

Figure 8C:
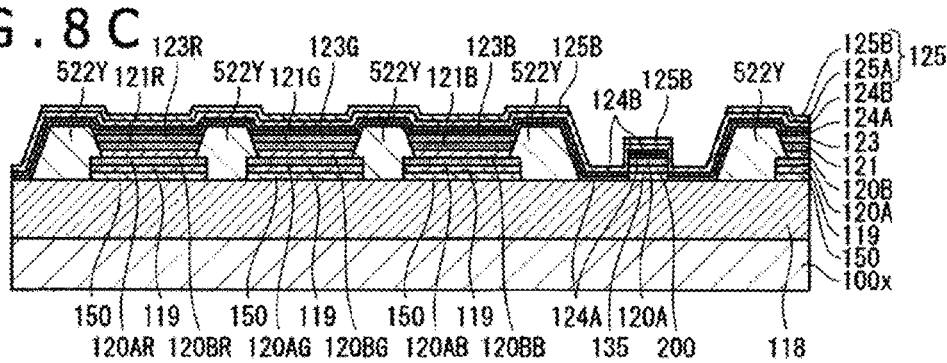

First, the common electrode layer 125A is formed such as to cover the electron transport layer 124 by a sputtering method or the like (FIG. 8C). In this example, as the common electrode layer 125A, a transparent conductive layer of ITO, IZO or the like is formed by a sputtering method or the like. In this instance, the common electrode layer 125A is formed also in areas over the first auxiliary electrode layers 135 and the second auxiliary electrode layers 200. In the film forming technique by sputtering, a film is liable to be isotropically formed through coming-around of atoms. Therefore, the common electrode layer 125A makes contact with those partial areas 135a1 and 135a2 on side surfaces of the first auxiliary electrode layers 135 which corresponding to the lacking or thinned parts of the electron transport layer 124, as depicted in FIGS. 4 and 5. It is important that the electron transport layer 124 is formed to be partially lacking or thinned by use of vacuum deposition, whereas the common electrode layer is formed through coming-around film formation by sputtering which is high in coverage property.

Here, the method of forming the common electrode layer 125 will be described further.

Figure 11:
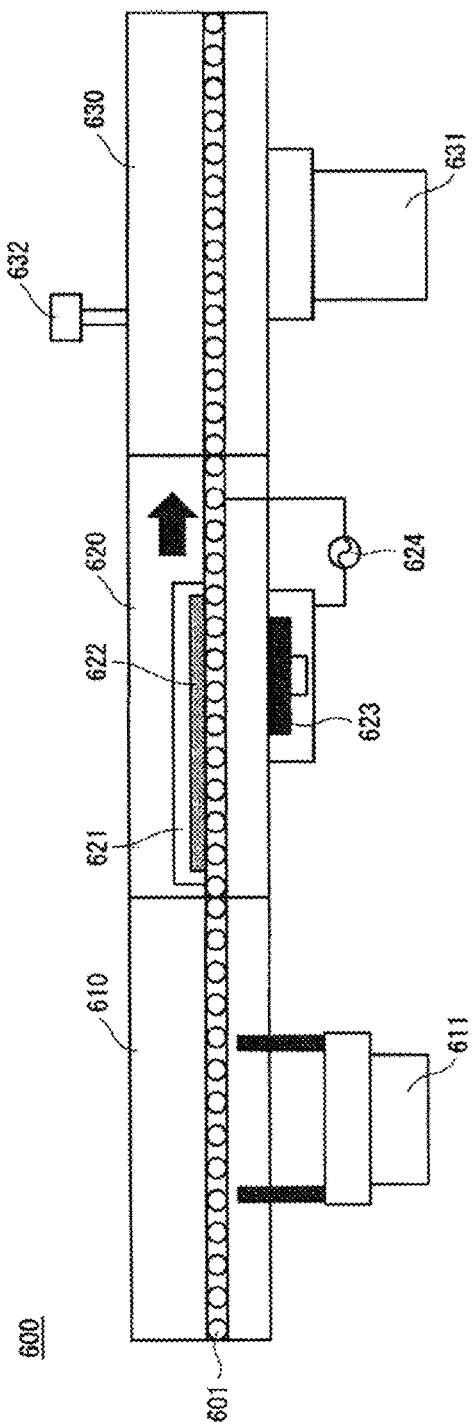
FIG. 11 is a schematic view of a sputtering system used for producing a common electrode layer according to at least one embodiment.

First, referring to FIG. 11, general configuration of a sputtering system 600 will be described. The sputtering system 600 includes a substrate transfer chamber 610, a film forming chamber 620, and a load lock chamber 630, and sputtering is conducted in the film forming chamber 620 by a magnetron sputtering method. A sputtering gas is introduced into the film forming chamber 620. An inert gas such as Ar (argon) gas is used as the sputtering gas. In the present embodiment, Ar (argon) is used.

A substrate 622 on which to form a film is placed on a carrier 621 in the sputtering system 600. In the substrate transfer chamber 610, the substrate 622 is mounted to the carrier 621 by a substrate pushing-up mechanism 611. The carrier 621 with the substrate 622 mounted thereto is moved rectilinearly on a carrying passage 601 at a constant speed, from the substrate transfer chamber 610 through the film forming chamber 620 into the load lock chamber 630. In the present embodiment, the moving speed of the carrier 621 is 30 mm/second. Note that the substrate 622 is not heated, and the sputtering is conducted at normal temperature.

In the film forming chamber 620, a rod-shaped target 623 extending in a direction orthogonal to the carrying passage 601 is disposed. In the present embodiment, the target 623 is ITO or IZO. Note that the target 623 may not necessarily be rod-shaped, and may be, for example, in a powdery form.

A power supply 624 impresses a voltage on the target 623. Note that while the power supply 624 in FIG. 11 is an AC (Alternating Current) power supply, it may be a DC (Direct Current) power supply or a DC/AC hybrid power supply.

The inside of the sputtering system 600 is evacuated by an evacuation system 631, and the sputtering gas is introduced into the film forming chamber 620 by a gas supply system 632. When a voltage is impressed on the target 623 by the power supply 624, a plasma of the sputtering gas is generated, and the surface of the target 623 is sputtered. Then, the sputtered atoms of the target 623 are deposited on the substrate 622, whereby a film is formed.

Note that the gas pressure of Ar (argon) as the sputtering gas is, for example, 0.6 Pa, and its flow rate is 100 sccm.

Next, the common electrode layer 125B is formed on the common electrode layer 125A by a CVD (Chemical Vapor Deposition) method, a sputtering method or a vacuum deposition method (FIG. 8C). In this example, the common electrode layer 125B is formed by depositing silver by a vacuum deposition method. As depicted in FIGS. 4 and 5, the common electrode layer 125B is mainly formed only on the upper surface of the common electrode layer 125A. Here, if the common electrode layer 125A is formed to be able to make sufficient contact with those partial areas 135a1 and 135a2 on the side surfaces of the first auxiliary electrode layers 135 which correspond to the lacking or thinned parts of the electron transport layer 124 by sputtering film formation or the like with high coverage property, the film formation for forming the common electrode layer 125B can be conducted by application of a vacuum deposition method.

(8) Formation of Sealing Layer 126

Figure 8D:
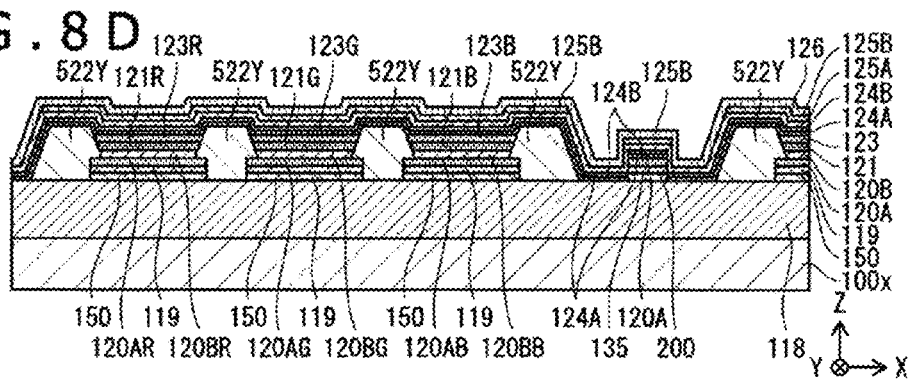

After the common electrode layer 125 is formed, the sealing layer 126 is formed such as to cover the common electrode layer 125 (FIG. 8D). The sealing layer 126 can be formed by a CVD method, a sputtering method or the like.

(9) Formation of Color Filter Substrate 131

Next, a step of producing the color filter substrate 131 will be exemplified.

Figure 9A:
FIGS. 9A to 9G are schematic sectional views taken at the same position as line A1-A1 of FIG. 3 in a state of each step in manufacture of the organic EL display panel according to at least one embodiment.

The transparent upper substrate 130 is prepared, and a material for the light-shielding layer 129, which contains a UV-curing resin (e.g., UV-curing acrylic resin) material as a main constituent with a black pigment added thereto, is applied to a surface on one side of the transparent upper substrate 130 (FIG. 9A).

Figure 9B:
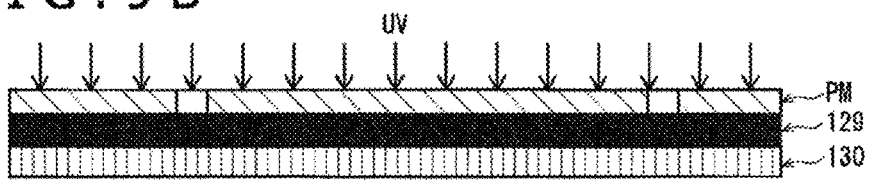

A pattern mask PM provided with predetermined openings is placed on the upper surface of the applied light-shielding layer 129, and irradiation with UV rays is conducted from above (FIG. 9B).

Figure 9C:
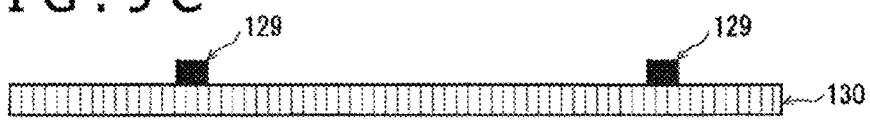

Thereafter, development is conducted by removing the pattern mask PM and uncured portions of the light-shielding layer 129, and curing is performed, whereon the light-shielding layer 129 in a substantially rectangular sectional shape, for example, is completed (FIG. 9C).

Figure 9D:
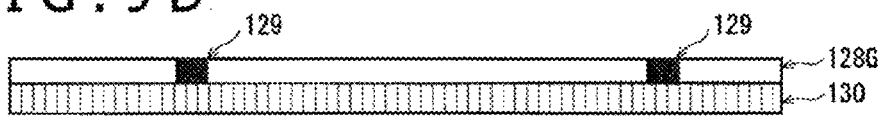
Figure 9E:
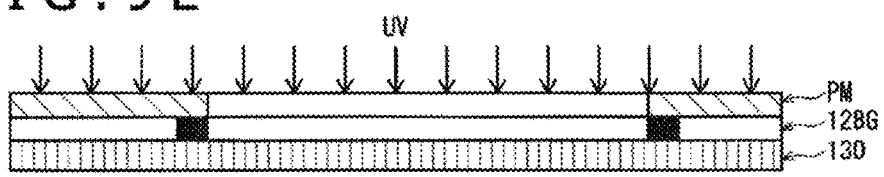

Next, a material 128G for a color filter layer 128 (e.g., 128G), which contains a UV-curing resin component as a main constituent, is applied to the surface of the upper substrate 130 formed with the light-shielding layer 129 (FIG. 9D), a predetermined pattern mask PM is placed thereon, and irradiation with UV rays is conducted (FIG. 9E).

Figure 9F:
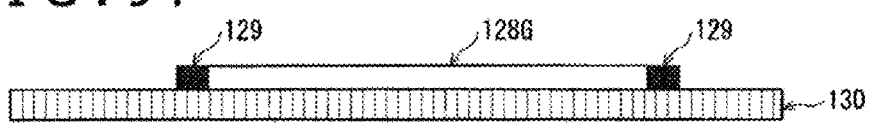

Thereafter, curing is performed, and development is conducted by removing the pattern mask PM and uncured portions of the paste 128R, whereon color filter layers 128G are formed (FIG. 9F).

Figure 9G:
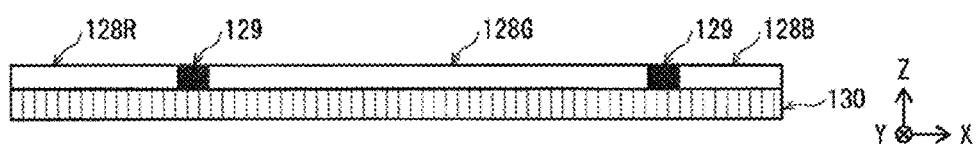

The steps of FIGS. 9D, 9E and 9F are similarly repeated for each of color filter materials, whereby color filter layers 128R and 128B are formed (FIG. 9G). Note that commercially available color filter products may be utilized, instead of using the paste 128R.

In this way, the color filter substrate 131 is formed.

(10) Lamination of Color Filter Substrate 131 and Back Panel

Next, a material for the bonding layer 127, which contains a UV-curing resin such as acrylic resin, silicone resin and epoxy resin as a main constituent, is applied to the back panel including the layers ranging from the substrate 100x to the sealing layer 126 (FIG. 10A).

Subsequently, the applied material is irradiated with UV rays, to laminate the back panel and the color filter substrate 131 in the state in which they are relatively positioned (aligned). In this instance, care should be taken to prevent gas from entering between both substrates. Thereafter, both the substrates are baked to complete the sealing step, whereon the display panel 10 is completed (FIG. 10B).

3. In Regard of Effect of Display Panel 10

Now, effects obtained from the display panel 10 will be described below.

As a material for the auxiliary electrode layers, a metal layer is formed from a material having a low sheet resistance and a high light reflecting property, specifically, from a metallic material containing silver or aluminum. In the case where the auxiliary electrode layers are formed from a metallic material containing aluminum which is inexpensive, there has been a problem that an oxide film is formed at a surface (surface layer) of the auxiliary electrode layers, resulting in that the contact resistance between the auxiliary electrode layer and the common electrode layer is high.

In coping with such a problem, the display panel 10 according to the present embodiment is an organic EL display panel having a plurality of pixel electrodes 119 arranged in a matrix pattern on a substrate 100x, with a light emitting layer 123 disposed on each pixel electrode 119, the light emitting layer 123 containing an organic light emitting material, the organic EL display panel including: the substrate 100x; the plurality of pixel electrodes 119 arranged in a matrix pattern over the substrate 100x; a first auxiliary electrode layer 135 disposed to extend in a column or row direction in at least one of gaps between adjacent ones of the pixel electrodes 119 over the substrate 100x; a second auxiliary electrode layer 200 that contains aluminum as a main constituent and is disposed to be superposed on the first auxiliary electrode layer 135; a plurality of light emitting layers 123 disposed on the plurality of pixel electrodes 119; and a common electrode layer 125 disposed continuously to cover the first auxiliary electrode layer 135 and the second auxiliary electrode layer 200 superposed thereon as well as the upper side of the plurality of light emitting layers 123. In addition, the first auxiliary electrode layer 135 and the common electrode layer 125 are in contact with each other at least in partial areas 135a1 and 135a2 on wall surfaces perpendicular to an upper surface of the first auxiliary electrode layer 135, and the first auxiliary electrode layer 135 is composed of a material that contains a metal different from aluminum as a main constituent and is lower than aluminum in contact resistance in air. Besides, an oxide of aluminum may be formed at least at a surface layer of the second auxiliary electrode layer 200.

Here, the second auxiliary electrode layer 200, on a material basis, contains aluminum as a main constituent, and a natural oxide of aluminum is formed at least at a surface layer 201 of the second auxiliary electrode layer 200. Moreover, in a heating step after film formation for forming a hole injection layer 120B over the second auxiliary electrode layer 200, at least, aluminum in the surface layer 201 of the second auxiliary electrode layer 200 is oxidized by oxygen which is supplied from the hole injection layer 120B side. This is the reason for the presence of aluminum oxide at the surface layer 201.

On the other hand, the first auxiliary electrode layer 135, on a material basis, contains as a main constituent a metal different from the material constituting the second auxiliary electrode layer 200, for example, at least one metal selected from among tungsten, chromium, titanium, molybdenum, nickel, copper, lanthanum and indium. Alternatively, the first auxiliary electrode layer 135 is composed of ITO or IZO. Thus, the first auxiliary electrode layer 135 is composed of a material which is lower in contact resistance in air than the material constituting the second auxiliary electrode layer 200. Since the just-mentioned metals and oxides are chemically stable at room temperature, an oxide of a metal tending to indicate a high resistance is not liable to be formed at a surface layer part of the first auxiliary electrode layer 135. Therefore, this part is lower than aluminum in contact resistance in air. In other words, a configuration is realized in which the resistance in the vicinity of the surface layer 201 of the second auxiliary electrode layer 200 is higher than the resistance in the vicinity of the surface layer of the first auxiliary electrode layer 135.

By the effect of the structure in the present embodiment, contact resistance has been successfully lowered by at least one order of magnitude. Specifically, in the existing case where electrical contact through the stepping (lacking) at sections was not provided, the contact resistance was approximately 1,000 to 2,000 MΩ μm$^2$, and, in contrast, the contact resistance is approximately 50 to 100 MΩ μm$^2$ in the present embodiment.

On the other hand, on a structural basis, the common electrode layer 125 is disposed continuously to cover the first auxiliary electrode layer 135 and the second auxiliary electrode layer 200 superposed thereon; in addition, the first auxiliary electrode layer 135 and the common electrode layer 125 are in contact with each other at least in the partial areas 135a1 and 135a2 on the wall surfaces perpendicular to the upper surface of the first auxiliary electrode layer 135.

As a result, it is possible to further lower the electric contact resistance between the common electrode layer 125 and those partial areas 135a1 and 135a2 of the side surfaces of the first auxiliary electrode layer 135 which make contact with the common electrode layer 125. In other words, the contact resistance between the first auxiliary electrode layer 135 and the common electrode layer 125 can be made lower than the contact resistance between the second auxiliary electrode layer 200 and the common electrode layer 125.

In addition, in the existing configuration, in the case where the aluminum alloy of the auxiliary electrode layer is oxidized and where the auxiliary electrode layer makes electrical contact with the common electrode layer locally without intermediate presence of the oxide film due to the presence of a defect or foreign matter in the auxiliary electrode layer, there arises a fear of concentration of current in that part, possibly causing local heat generation or material deterioration, as aforementioned. In the display panel 10, however, it is possible to further lower the electric contact resistance between the common electrode layer 125 and those partial areas 135a1 and 135a2 of the side surfaces of the first auxiliary electrode layer 135 which make contact with the common electrode layer 125. Therefore, even if the auxiliary electrode layer and the common electrode layer make contact with each other locally without intermediate presence of an oxide film, local concentration of current at that part can be prevented, and local heat generation or material deterioration or the like, which might occur attendant on the current concentration, can be prevented from occurring.

As has been described above, in the display panel 10 according to one mode of the present disclosure, having a configuration in which the same light-reflecting metallic material as that of pixel electrodes is used for the auxiliary electrode layer, the electric contact resistance in electrical connection between the common electrode layer and the auxiliary electrode layer can be reduced. As a result, light emission efficiency can be enhanced, and variability in luminance can be restrained.

In addition, in the above-mentioned mode, a configuration may further be adopted in which a functional layer 124 composed of at least one layer disposed continuously to cover the first auxiliary electrode layer 135 and the second auxiliary electrode layer 200 as well as an upper side of the plurality of light emitting layers 123 is provided between the second auxiliary electrode layer 200 and the common electrode layer 125, the functional layer 124 is lacking or thinned in the vicinity of partial areas 135a1 and 135a2 of the first auxiliary electrode layer 135, and the thickness of the first auxiliary electrode layer 135 is greater than the thickness of the functional layer 124.

Further, the same as above applies also to the case where the film thickness of the electron transport layer is increased to, for example, approximately 100 nm for the purpose of enhancing the optical take-out of light. Where the thickness of the first auxiliary electrode layer 135 is set to be greater than the total thickness of the functional layer 124 disposed continuously to cover the first auxiliary electrode layer 135 and the second auxiliary electrode layer 200 between the second auxiliary electrode layer 200 and the common electrode layer 125, it is naturally possible to thereby ensure reliable contact of the common electrode layer 125 with the first auxiliary electrode layer 135 in the partial areas 135a1 and 135a2 on the wall surfaces perpendicular to the upper surface of the first auxiliary electrode layer 135, and to realize both a high carrier mobility and a reduction in the electric contact resistance between the common electrode layer and the auxiliary electrode layer.

Furthermore, where the auxiliary pixel electrodes 150 and the first auxiliary electrodes 135 have the same film thickness and where the pixel electrodes 119 and the second auxiliary electrodes have the same film thickness, it is thereby possible to reduce process cost through forming the same-thickness electrodes as the same layer and in the same step.

In addition, in the above-mentioned mode, on the basis of optical design of the light emitting section, ITO or IZO or the like may be inserted as an optical adjustment layer between the pixel electrode 119 and the hole injection layer 120A. In this instance, a transparent conductive layer composed of ITO or IZO disposed discontinuously over the first auxiliary electrode layer 135 and the second auxiliary electrode layer 200 may be provided between the second auxiliary electrode layer 200 and the functional layer 124, at an auxiliary electrode section formed as the same layer. According to such a configuration, also, the effects of the present disclosure are exhibited.

Besides, the method of manufacturing the display panel 10 according to the present embodiment is a method of manufacturing an organic EL display panel having a plurality of pixel electrodes 119 arranged in a matrix pattern on a substrate 100x, with a light emitting layer 123 disposed on each of the pixel electrodes 119, the light emitting layer 123 containing an organic light emitting material, the method including the steps of: preparing the substrate 100x; forming the plurality of pixel electrodes 119 in a matrix pattern over the substrate 100x; forming a first auxiliary electrode layer 135 to extend in a column or row direction in at least one of gaps between adjacent ones of the pixel electrodes 119 over the substrate 100x, the first auxiliary electrode layer 135 composed of a material which contains as a main constituent a metal different from aluminum and is lower than aluminum in contact resistance in air; forming a second auxiliary electrode layer 200 containing aluminum as a main constituent on the first auxiliary electrode layer 135 in such a manner as to extend in the same direction as the first auxiliary electrode layer 135 and be superposed on the first auxiliary electrode layer 135; forming the plurality of light emitting layers 123 on the plurality of pixel electrodes 119; and forming, by a sputtering method, a common electrode layer 125 continuously to cover the first auxiliary electrode layer 135 and the second auxiliary electrode layer 200 as well as an upper side of the plurality of light emitting layers 123 in such a manner that the first auxiliary electrode layer 135 and the common electrode layer 125 make contact with each other at least in partial areas 135a1 and 135a2 on wall surfaces perpendicular to an upper surface of the first auxiliary electrode layer 135.

In addition, in the above-mentioned mode, the method of manufacturing the organic EL display panel may include a step of forming a functional layer 124 continuously to cover the first auxiliary electrode layer 135 and the second auxiliary electrode layer 200 as well as an upper side of the plurality of light emitting layers 123, between the second auxiliary electrode layer 200 and the common electrode layer 125, by a vacuum deposition method, the functional layer 124 being composed of at least one layer and being thinner than the first auxiliary electrode layer 135. In this instance, the functional layer 124 may be lacking or thinned in the vicinity of partial areas 135a1 and 135a2 of the first auxiliary electrode layer 135.

According to such a configuration, the thickness of the first auxiliary electrode layer 135 is made to be greater than the total thickness of the functional layer 124 disposed, by a vapor deposition method, continuously between the second auxiliary electrode layer 200 and the common electrode layer 125 (which is formed by the sputtering method), whereby the common electrode layer 125 (formed by the sputtering method) can be reliably put in contact with the functional layer (formed by the vapor deposition method) in those partial areas 135a1 and 135a2 on wall surfaces perpendicular to the upper surface of the first auxiliary electrode layer 135 in which the functional layer 124 is lacking or thinned As a result, it is possible to manufacture a display panel 10 in which electric resistance in electrical connection between a common electrode layer and an auxiliary electrode layer can be reduced, light emission efficiency can be enhanced, and variability in luminance can be suppressed.

4. Modifications

While the display panel 10 according to the present embodiment has been described above, the present disclosure is not to be limited to the above embodiment in any way, except for essential and characteristic constituent elements thereof. For instance, modes obtained by subjecting the embodiment to various modifications conceived by those skilled in the art, and modes realized by arbitrary combinations of configurational elements and functions of the embodiment without departing from the gist of the present invention are also included in the present disclosure. As examples of such modes, modifications of the display panel 10 will now be described below.

(1) Modification 1

In the display panel 10, a single stretch of first auxiliary electrode layer 135 disposed to extend in a column or row direction in at least one of gaps between adjacent ones of pixel electrodes 119 and a single stretch of second auxiliary electrode layer 200 disposed to be superposed on the first auxiliary electrode layer 135 are provided, and the first auxiliary electrode layer 135 and the common electrode layer 125 are in contact with each other at least in the partial areas 135a1 and 135a2 on the side walls perpendicular to the upper surface of the first auxiliary electrode layer 135.

However, the plan-view shape of the first auxiliary electrode layer 135 and the second auxiliary electrode layer 200 is not limited to the above-mentioned, and may be changed variously.

Figure 13A:
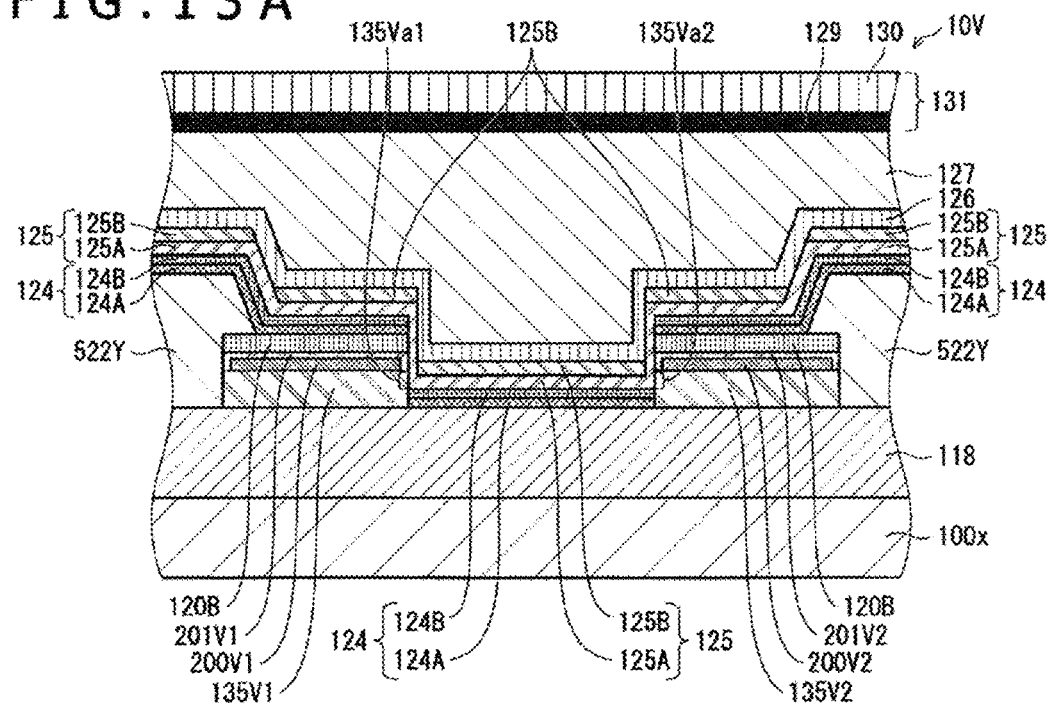
FIG. 13A is a schematic sectional view taken along line A3-A3 of FIG. 12A.

FIG. 12A is a schematic plan view depicting the shapes of banks and auxiliary electrode layers in a display panel 10V according to Modification 1. FIG. 13A is a schematic sectional view taken along line A3-A3 of FIG. 12A. As depicted in FIG. 12A, the display panel 10V according to Modification 1 includes two stretches of first auxiliary electrode layers 135V1 and 135V2 disposed to extend in a column direction in a gap between adjacent banks 522Y, and two stretches of second auxiliary electrode layers 200V1 and 200V2 disposed to be superposed on the first auxiliary electrode layer 135. As depicted in FIG. 13A, two outer edges located on row-directionally outer sides of the two stretches of first auxiliary electrode layers 135V1 and 135V2 and two stretches of second auxiliary electrode layers 200V1 and 200V2 are individually covered by the banks 522Y. In other words, the first auxiliary electrode layer 135 is in contact with a base portion of the bank 522 adjacent thereto. In addition, natural oxide layers are formed at surface layers 201V1 and 201V2 of the second auxiliary electrode layers 200V1 and 200V2.

According to such a configuration, in the display panel 10V, as compared to the display panel 10, it is possible to increase the sectional area of the auxiliary electrode by an amount corresponding to the row-directional sections of the first auxiliary electrode layer 135V1 and the second auxiliary electrode layer 200V1, and to thereby reduce the sheet resistance of the auxiliary electrode. In addition, in the display panel 10V, it is possible to adopt a configuration in which the first auxiliary electrode layer 135 and the common electrode layer 125 are in contact with each other in partial areas 135Va1 and 135Va2 on row-directionally opposed side surfaces of the two stretches of first auxiliary electrode layers 135V1 and 135V2, and it is possible to realize a contact resistance similar to that in the display panel 10.

Note that instead of providing the two stretches of first auxiliary electrode layers 135V1 and 135V2 and the two stretches of second auxiliary electrode layers 200V1 and 200V2, a slit-shaped opening may be provided in each one of a single stretch of first auxiliary electrode layer 135 and a single stretch of second auxiliary electrode layer 200.

(2) Modification 2

Figure 13B:
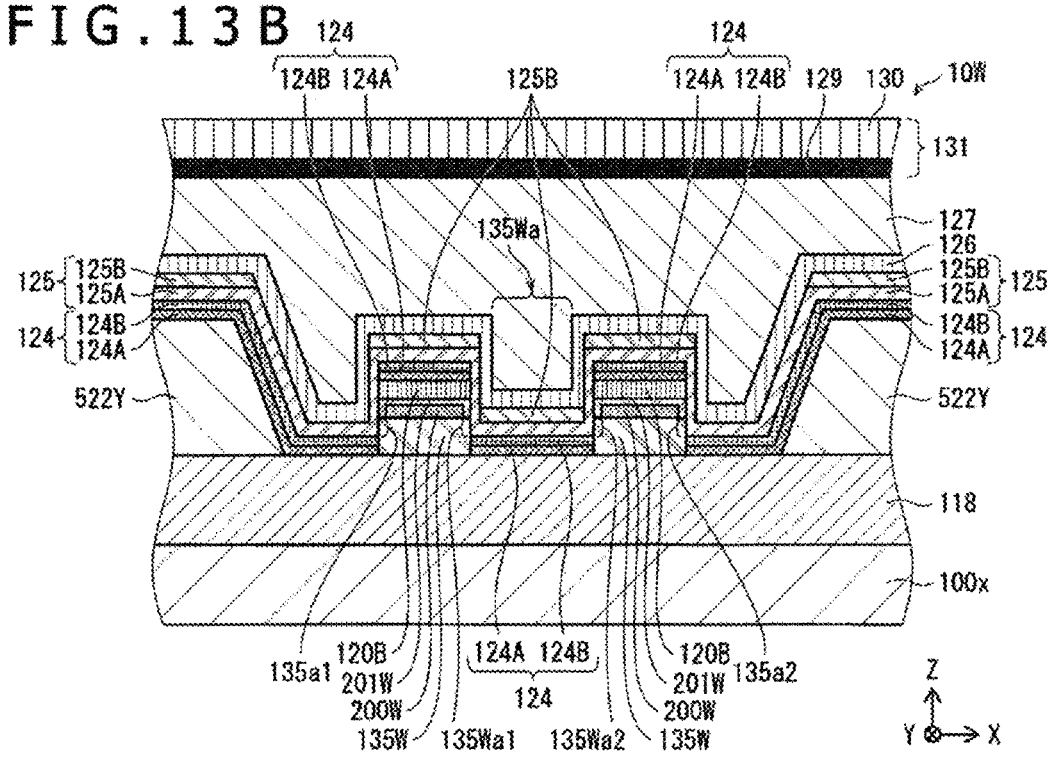
FIG. 13B is a schematic sectional view taken along line A4-A4 of FIG. 12B according to at least one embodiment.

In a display panel 10W according to Modification 2, a second auxiliary electrode layer 200W is provided with through-holes 200X, which are substantially circularly shaped holes and are aligned at a predetermined interval and in a row in the column direction. FIG. 12B is a schematic plan view depicting the shapes of banks and the auxiliary electrode layer in the display panel 10W according to Modification 2. FIG. 13B is a schematic sectional view taken along line A4-A4 of FIG. 12B. As depicted in FIG. 12B, the display panel 10W according to Modification 2 includes a single stretch of first auxiliary electrode layer 135W disposed to extend in the column direction in a gap between adjacent banks 522W, and two stretches of second auxiliary electrode layers 200W disposed to be superposed on the first auxiliary electrode layer 135, and a plurality of holes 200Wa and 135Wa penetrating the second auxiliary electrode layers 200W and the first auxiliary electrode layer 135 are provided, in the state of being aligned in the column direction. As depicted in FIG. 13B, natural oxide layers are formed at surface layers 201W1 and 201W2 of the second auxiliary electrode layers 200W1 and 200W2.

According to such a configuration, in the display panel 10W, the first auxiliary electrode layer 135 and the common electrode layer 125 are in contact with each other, not only in partial areas 135a1 and 135a2 on side surfaces perpendicular to the upper surfaces of the first auxiliary electrode layer 135W but also in partial areas 135Wa1 and 135Wa2 on inner peripheral surfaces of the holes 135Wa bored in the first auxiliary electrode layer 135. For this reason, the contact area can be increased as compared to the display panel 10, and the contact resistance can be reduced as compared to the display panel 10.

(3) Modification 3

In a display panel 10X according to Modification 3, a second auxiliary electrode layer 200X is provided with through-holes 200X, which are substantially circularly shaped holes and are aligned at a predetermined interval and in two rows in the column direction. FIG. 12C is a schematic plan view depicting the shapes of banks and auxiliary electrode layers in the display panel 10 according to Modification 3. Specifically, as the display panel 10X according to Modification 3 depicted in FIG. 12C, a configuration may be adopted in which a single stretch of first auxiliary electrode layer 135X extending in the column direction in a gap between adjacent banks 522Y, and a single stretch of second auxiliary electrode layer 200X disposed to be superposed on the first auxiliary electrode layer 135X, are provided, and a plurality of holes 200Xa, 135Xa and 200Xb, 135Xb penetrating the second auxiliary electrode layer 200X and the first auxiliary electrode layer 135 are aligned in two rows in the column direction.

According to such a configuration, the contact area can be further increased, and the contact resistance can be further reduced, as compared to the display panel 10W.

(4) Modification 4

In the display panel 10, the first auxiliary electrode layer 135 and the second auxiliary electrode layer 200 are disposed to extend in the same layers as the auxiliary pixel electrodes 150 and the pixel electrodes 119, respectively, on the upper surface of the planarizing layer 118 over the substrate 100x, and the common electrode layer 125 is superposed thereon, to ensure electrical contact with the common electrode layer 125.

However, the layers in which the first auxiliary electrode layer 135 and the second auxiliary electrode layer 200 are to be provided on and over the substrate 100x are not limited to the above-mentioned, and may be changed or added appropriately.

Figure 14A:
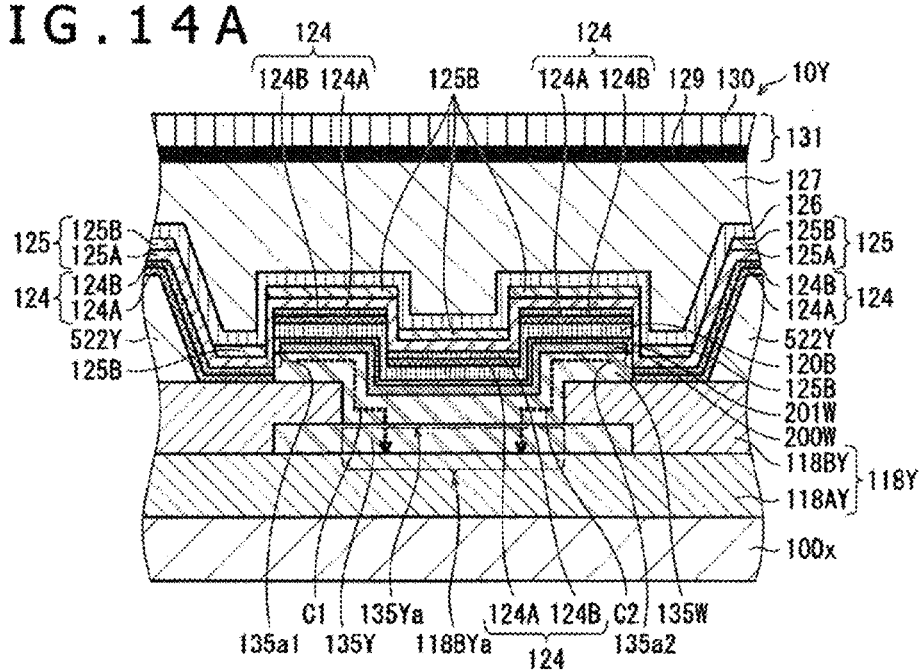
FIG. 14A is a sectional view of the vicinity of a second auxiliary electrode layer in a display panel according to Modification 4.

FIG. 14A is a sectional view of the vicinity of a second auxiliary electrode layer 200 in a display panel 10Y according to Modification 4. The display panel 10Y is characterized in that in addition to the configuration of the display panel 10W, further, a planarizing layer 118Y is composed of two layers consisting of a planarizing lower layer 118AY and a planarizing upper layer 118BY, and a third current feeding auxiliary electrode layer 135Y is provided between the planarizing lower layer 118AY and the planarizing upper layer 118BY.

Specifically, the display panel 10Y includes the planarizing lower layer 118AY and the planarizing upper layer 118BY which contain a resin as a main constituent, over a substrate 100x, and the third current feeding auxiliary electrode layer 135Y which extends in the column direction and is composed of the same material as the first auxiliary electrode layer 135W is provided between the planarizing lower layer 118AY and the planarizing upper layer 118BY. In this instance, the third current feeding auxiliary electrode layer 135Y may be enlarged in width in the row direction to a position where it does not overlap with the pixel electrode 119. In addition, a second auxiliary electrode layer 200W, a hole injection layer 120B, electron transport layers 124A and 124B, common electrode layers 125A and 125B, and a sealing layer 126 are sequentially stacked over the first auxiliary electrode layer 135W. Further, the planarizing upper layer 118BY is provided with a contact hole 118BYa penetrating to the upper surface of the third current feeding auxiliary electrode layer 135Y, and the first auxiliary electrode layer 135W is disposed to be continuous with an inner peripheral surface of the contact hole 118BYa and a bottom surface of the contact hole 118BYa. In addition, the first auxiliary electrode layer 135W is in contact with the third current feeding auxiliary electrode layer 135Y at least in a partial area 135Ya, in the contact hole 118BYa, of the upper surface of the third current feeding auxiliary electrode layer 135Y. In this instance, like in Modification 3 described above, a functional layer 124 is disposed between the first auxiliary electrode layer 135W and the common electrode layer 125, and the thickness of the first auxiliary electrode layer 135W is set greater than the thickness of the functional layer 124. Therefore, the first auxiliary electrode layer 135W is in contact with the common electrode layer 125B in partial areas 135a1 and 135a2 on side surfaces. Further, as aforementioned, the first auxiliary electrode layer 135W is in contact with the partial area 135Ya of the third current feeding auxiliary electrode layer 135Y in the contact hole 118BYa. By this, a configuration can be obtained in which, even in the case where a natural oxide layer of aluminum is formed at a surface layer 201W of the second current feeding auxiliary electrode layer 200W on the first auxiliary electrode layer 135W, the common electrode layer 125 and the third current feeding auxiliary electrode layer 135Y are electrically connected to each other through the first auxiliary electrode layer 135Y, along routes C1 and C2 depicted in FIG. 14A, and the third current feeding auxiliary electrode layer 135Y can be made to function as a current feeding auxiliary electrode for the common electrode layer 125.

As a result, in the display panel 10Y, the sectional area of the auxiliary electrode can be increased by an amount corresponding to the row-directional section of the third current feeding auxiliary electrode layer 135Y, and the sheet resistance can be reduced, as compared to the display panel 10W. This is effective as means for restraining a lowering in light take-out efficiency which might be generated attendant on an increase in pixel density (an increase in resolution). In addition, the configuration in which the auxiliary electrodes are provided in a layer between the planarizing lower layer 118AY on the substrate 100x and the planarizing upper layer 118BY ensures that there are is little positional limitation due to TFT wiring, and that the degree of freedom in plan-view layout of the third current feeding auxiliary electrode layer 135Y is enhanced.

Note that the position at which to provide the contact hole 118BYa is not limited to the above-mentioned one; for example, the contact hole 118BYa may be provided at a position different from that in FIG. 14A.

Figure 14B:
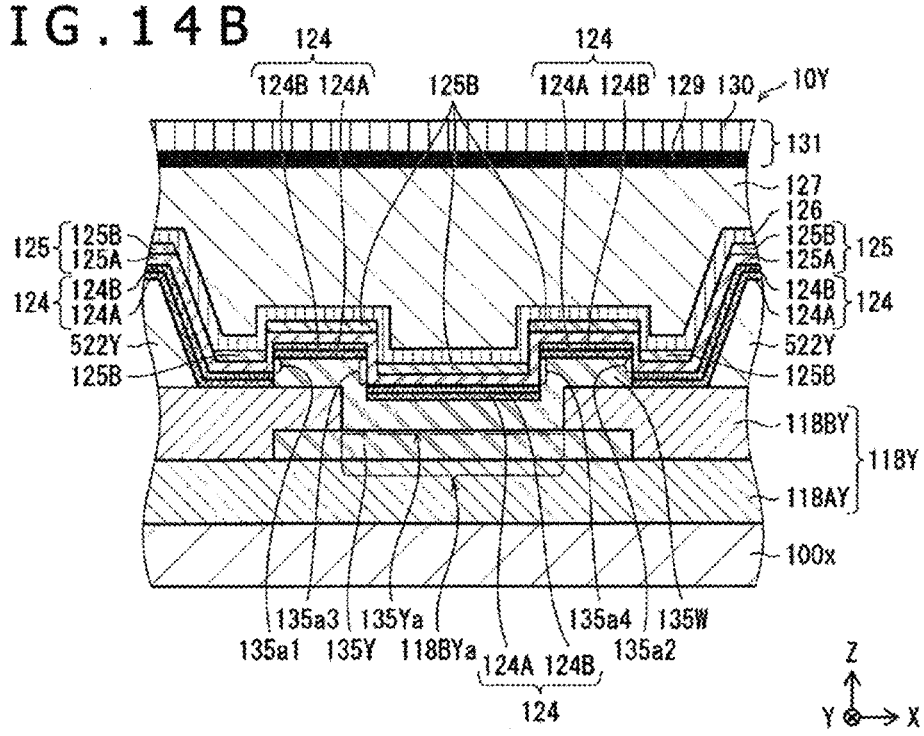
FIG. 14B is a sectional view of Modification 4A in which a second auxiliary electrode layer and a hole injection layer are not provided on a first auxiliary electrode layer in the display panel.

Further, in Modification 4A, by further modifying Modification 4, a configuration may be adopted in which the second auxiliary electrode layer 200W and the hole injection layer 120B are formed by masking the upper surface of the first auxiliary electrode layer 135W in a film forming step, whereby it is ensured that the second auxiliary electrode layer 200W and the hole injection layer 120B are not provided on the first auxiliary electrode layer 135W. FIG. 14B is a sectional view of a display panel 10Y in Modification 4A in which the second auxiliary electrode layer 200W and the hole injection layer 120B are not provided on the first auxiliary electrode layer 135W. In such a configuration, electron transport layers 124A and 124B, common electrode layers 125A and 125B, and a sealing layer 126 are sequentially stacked over the first auxiliary electrode layer 135W. In the case where the electron transport layers 124A and 124B are formed by vapor deposition, they are not formed on the inner peripheral surface of the contact hole 118BYa. Therefore, by setting the depth of the contact hole 118BYa to be greater than the thickness of the common electrode layers 125A and 125B, a configuration can be adopted in which partial areas 135a3 and 135a4 of the first auxiliary electrode layer 135 make direct contact with the common electrode layer 125B on the inner peripheral surface of the contact hole 118BYa. Alternatively, in the case where the electron transport layers 124A and 124B are formed by a sputtering method or a CVD method, a configuration can be adopted in which the first auxiliary electrode layer 135W is electrically connected to the common electrode layer 125B through the electron transport layers 124A and 124B.

According to such a configuration, the contact area between the common electrode layer 125 and the first current feeding auxiliary electrode layer 135W can be increased, and the sectional area of a conducting path to the third current feeding auxiliary electrode layer 135Y can be increased. As a result, connection resistance from the common electrode layer 125 to the current feeding auxiliary electrode can be reduced.

(5) Modification 5

Figure 15A:
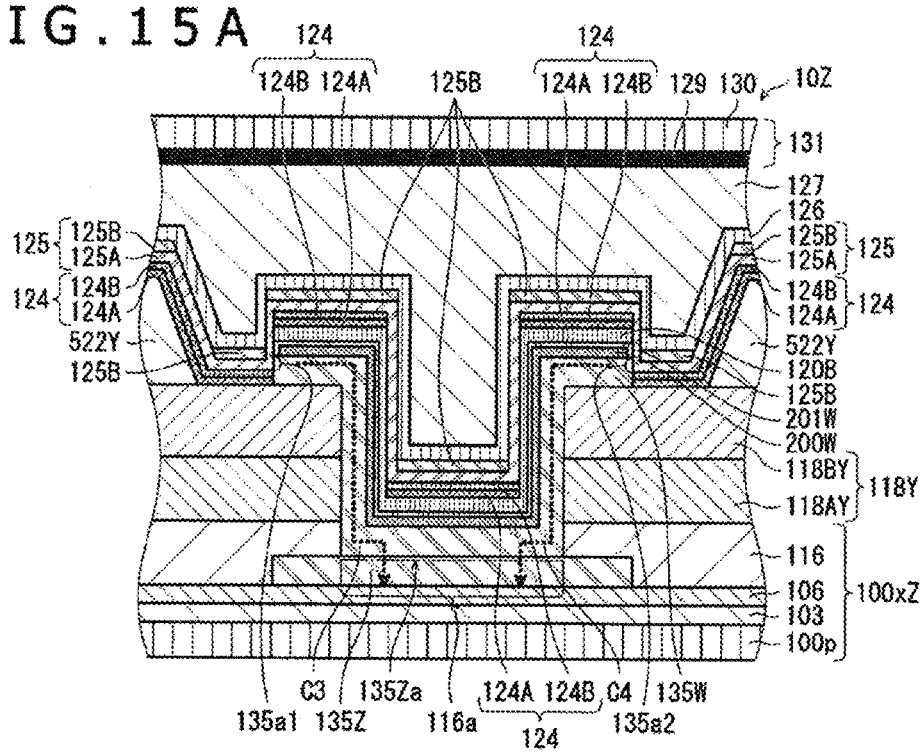
FIG. 15A is a sectional view of the vicinity of a second auxiliary electrode layer in a display panel according to Modification 5.

In addition to the configuration of the display panel 10W, further, a fourth current feeding auxiliary electrode layer 135Z may be provided between a layer and a layer which constitute the substrate 100x. FIG. 15A is a sectional view of the vicinity of a second auxiliary electrode layer 200 in a display panel 10Z according to Modification 5.

As depicted in FIG. 15A, in the display panel 10Z, the substrate 100x includes a base material 100p, a gate insulating layer 103 and a channel protection layer 106 which constitute a TFT circuit, and an inorganic insulating layer 116 provided over them and containing an inorganic material as a main constituent. A planarizing layer 118Y containing a resin as a main constituent is formed over the substrate 100x. The planarizing layer 118 may have a two-layer structure composed of a planarizing lower layer 118AY and a planarizing upper layer 118BY, or may have a monolayer structure.

In the display panel 10Z, the fourth current feeding auxiliary electrode layer 135Z disposed to extend in a column or row direction is provided between layers of a plurality of layers constituting the substrate 100x, for example, between the channel protection layer 106 and the inorganic insulating layer 116. Note that the position at which to provide the fourth current feeding auxiliary electrode layer 135Z between the layers of the plurality of layers in the substrate 100x is not limited to the position between the channel protection layer 106 and the inorganic insulating layer 116. In addition, the fourth current feeding auxiliary electrode layer 135Z may be enlarged in width in the row direction to a position where it does not overlap with a pixel electrode 119.

A second auxiliary electrode layer 200W, a hole injection layer 120B, electron transport layers 124A and 124B, common electrode layers 125A and 125B, and a sealing layer 126 are sequentially stacked over the first auxiliary electrode layer 135W. Further, the planarizing upper layer 118BY, the planarizing lower layer 118AY and the inorganic insulating layer 116 are provided therein with a contact hole 116athat penetrates from the upper surface of the planarizing upper layer 118BY to the upper surface of the fourth current feeding auxiliary electrode layer 135Z, and the first auxiliary electrode layer 135W is disposed to be continuous with an inner peripheral surface of the contact hole 116aand a bottom surface of the contact hole 116a. In addition, the fourth current feeding auxiliary electrode layer 135Z and the first auxiliary electrode layer 135W are in contact with each other at least in a partial area 135Za, in the contact hole 116a, of the upper surface of the fourth current feeding auxiliary electrode layer 135Z. In this instance, like in Modifications 3 and 4 described above, the first auxiliary electrode layer 135W is in contact with the common electrode layer 125B in partial areas 135a1 and 135a2 on side surface, and is also in contact with the partial area 135Za of the fourth current feeding auxiliary electrode layer 135Z in the contact hole 116a.

By this, it is ensured that even in the case where a natural oxide layer of aluminum is formed at a surface layer 201W of the second current feeding auxiliary electrode layer 200W on the first auxiliary electrode layer 135W, the common electrode layer 125 and the fourth current feeding auxiliary electrode layer 135Z are electrically connected to each other through the first auxiliary electrode layer 135W, along the routes C3 and C4 depicted in FIG. 15A. Therefore, the fourth current feeding auxiliary electrode layer 135Z can be made to function as a current feeding auxiliary electrode for the common electrode layer 125.

As a result, in the display panel 10Z, the sectional area of the auxiliary electrode can be increased by an amount corresponding to the row-directional section of the fourth current feeding auxiliary electrode layer 135Z, and the sheet resistance can be thereby reduced, as compared to the display panel 10W. This is effective as means for restraining a lowering in light take-out efficiency which might be generated attendant on an increase in pixel density (an increase in resolution). In addition, the configuration in which the auxiliary electrode is provided between the channel protection layer 106 and the inorganic insulating layer 116 in the substrate 100x ensures that there is little positional limitation due to the pixel electrodes 119 or the like on the substrate 100x, and that the degree of freedom in plan-view layout of the fourth current feeding auxiliary electrode layer 135Z is enhanced.

Here, also, the position at which to provide the contact hole 116ais not limited to the above-mentioned one; for example, the contact hole 116amay be provided at a position different from that in FIG. 15A.

Note that in Modification 5A, by further modifying Modification 5, a configuration may be adopted in which the second auxiliary electrode layer 200W and the hole injection layer 120B are formed by masking the upper surface of the first auxiliary electrode layer 135W in a film forming step, whereby it is ensured that the second auxiliary electrode layer 200W and the hole injection layer 120B are not provided on the first auxiliary electrode layer 135W.

Figure 15B:
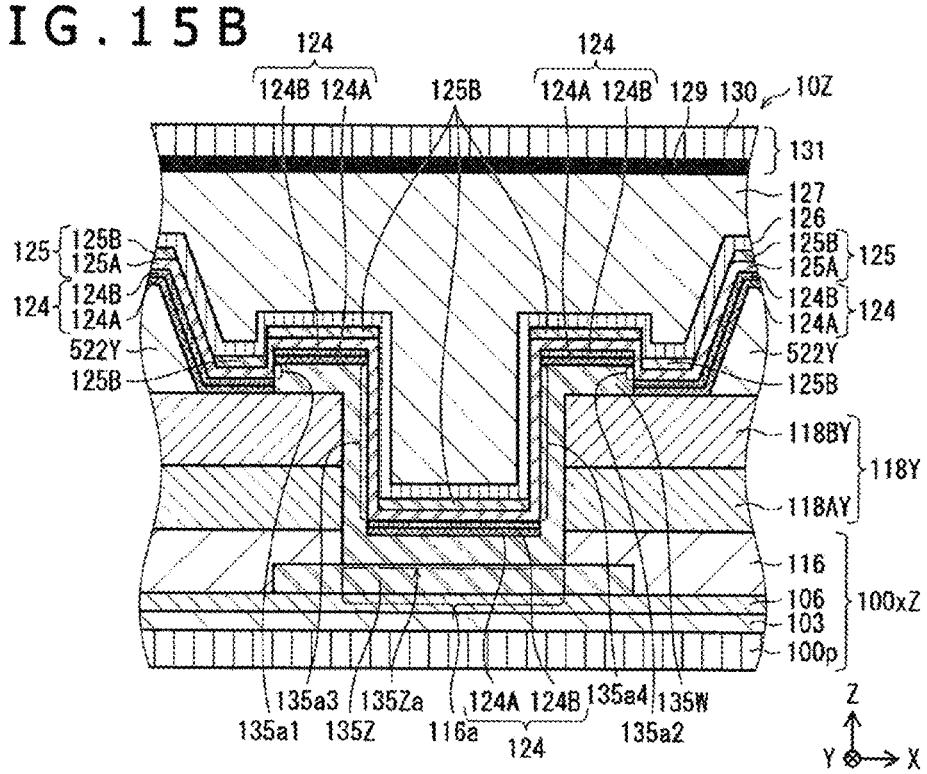
FIG. 15B is a sectional view of Modification 5A in which a second auxiliary electrode layer and a hole injection layer are not provided on a first auxiliary electrode layer in the display panel.

FIG. 15B is a sectional view of Modification 5A in which the second auxiliary electrode layer 200W and the hole injection layer 120B are not provided on the first auxiliary electrode layer 135W in the display panel 10Z. In such a configuration, electron transport layers 124A and 124B, common electrode layers 125A and 125B, and a sealing layer 126 are sequentially stacked over the first auxiliary electrode layer 135W. In the case where the electron transport layers 124A and 124B are formed by vapor deposition, they are not formed on the inner peripheral surface of the contact hole 116a. Therefore, like in Modification 4A, partial areas 135a3 and 135a4 of the first auxiliary electrode layer 135W make direct contact with the common electrode layer 125B on the inner peripheral surface of the contact hole 116a, and the area of the partial areas 135a3 and 135a4 can be increased, as compared to Modification 4 depicted in FIG. 14B.

According to such a configuration, the contact area between the common electrode layer 125 and the fourth current feeding auxiliary electrode layer 135Z can be increased, and the sectional area of a conducting path to the fourth current feeding auxiliary electrode layer 135Z can be increased. As a result, connection resistance from the common electrode layer 125 to the current feeding auxiliary electrode can be reduced.

(6) Modification 6

A configuration may be adopted which is obtained by combining the configuration of the display panel 10W according to Modification 4 and the display panel 10Z according to Modification 5 with each other.

Figure 16A:
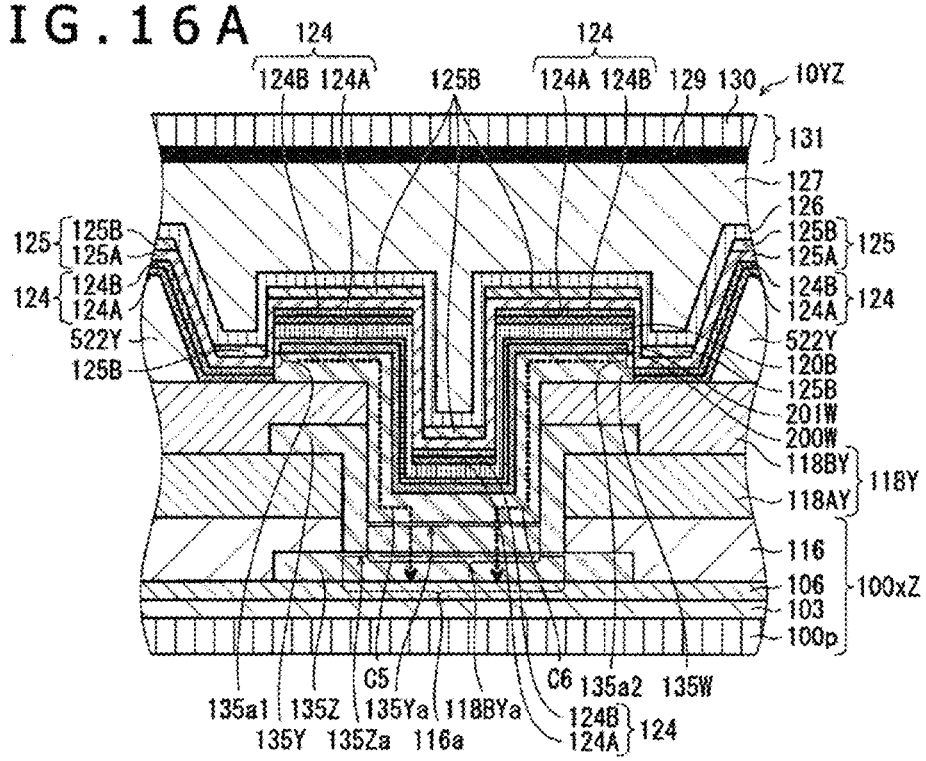
FIG. 16A is a sectional view of the vicinity of a second auxiliary electrode layer in a display panel according to Modification 6.

FIG. 16A is a sectional view of the vicinity of a second auxiliary electrode layer 200 in a display panel 10YZ according to Modification 6. The display panel 10YZ is characterized in that a third current feeding auxiliary electrode layer 135Y is provided between a planarizing lower layer 118AY and a planarizing upper layer 118BY, and, further, a fourth current feeding auxiliary electrode layer 135Z is provided between layers of a plurality of layers constituting a substrate 100x, for example, between a channel protection layer 106 and an inorganic insulating layer 116. Here, also, the position at which to provide the fourth current feeding auxiliary electrode layer 135Z between layers of the plurality of layers in the substrate 100x is not limited to the position between the channel protection layer 106 and the inorganic insulating layer 116. A second auxiliary electrode layer 200W, a hole injection layer 120B, electron transport layers 124A and 124B, common electrode layers 125A and 125B, and a sealing layer 126 are sequentially stacked over the first auxiliary electrode layer 135W, like in Modifications 3 and 4.

In addition, the planarizing lower layer 118AY and the inorganic insulating layer 116 are provided therein with a contact hole 116athat penetrates from the upper surface of the planarizing upper layer 118BY to the upper surface of the fourth current feeding auxiliary electrode layer 135Z, and the third current feeding auxiliary electrode layer 135Y is disposed to be continuous with the inner peripheral surface of the contact hole 116aand the bottom surface of the contact hole 116a. Besides, the third current feeding auxiliary electrode layer 135Y and the fourth current feeding auxiliary electrode layer 135Z are in contact with each other at least in a partial area 135Za, in the contact hole 116a, of the upper surface of the fourth current feeding auxiliary electrode layer 135Z. Further, the planarizing upper layer 118BY is provided therein with a contact hole 118BYa that penetrates to the upper surface of the third current feeding auxiliary electrode layer 135Y, and the first auxiliary electrode layer 135W is disposed to be continuous with the inner peripheral surface of the contact hole 118BYa and the bottom surface of the contact hole 118BYa. Besides, the first auxiliary electrode layer 135W is in contact with the common electrode layer 125B in partial areas 135a1 and 135a2 on side surfaces, and the first auxiliary electrode layer 135W and the third current feeding auxiliary electrode layer 135Y are in contact with each other at least in a partial area 135Ya, in the contact hole 118BYa, of the upper surface of the third current feeding auxiliary electrode layer 135Y, like in Modifications 3 and 4 described above.

By this, it is ensured that even in the case where a natural oxide layer of aluminum is formed at a surface layer 201W of the second current feeding auxiliary electrode layer 200W on the first auxiliary electrode layer 135W, the common electrode layer 125 and the third current feeding auxiliary electrode layer 135Y and, further, the fourth current feeding auxiliary electrode layer 135Z are electrically connected through the first auxiliary electrode layer 135W, along routes C5 and C6 depicted in FIG. 16A. Therefore, the third and fourth current feeding auxiliary electrode layers 135Y and 135Z can be made to function as a current feeding auxiliary electrode for the common electrode layer 125. Accordingly, sheet resistance can be further reduced, and this is effective in enhancing resolution. In addition, in a layer between the channel protection layer 106 and the insulating layer 116, the fourth current feeding auxiliary electrode layer 135Z can be freely laid out on a plan-view basis, in a range in which positional limitation due to wiring of the TFT circuit is absent.

Note that in Modification 6A, by further modifying Modification 6, a configuration may be adopted in which the second auxiliary electrode layer 200W and the hole injection layer 120B are not provided on the first auxiliary electrode layer 135W.

Figure 16B:
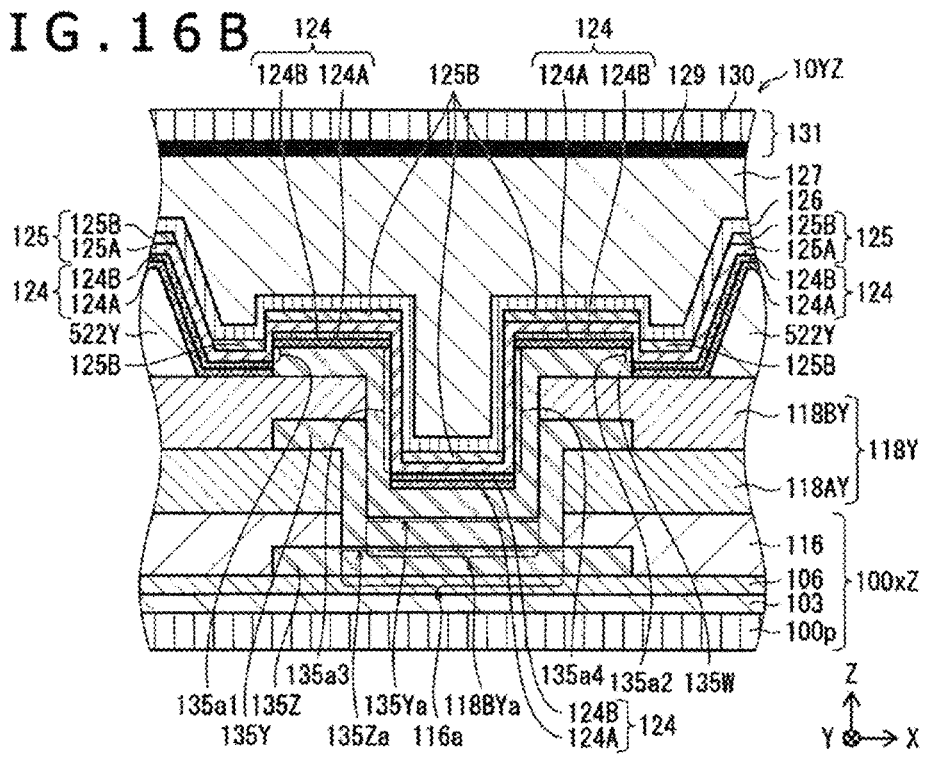
FIG. 16B is a sectional view of Modification 6A in which a second auxiliary electrode layer and a hole injection layer are not provided on a first auxiliary electrode layer in the display panel.

FIG. 16B is a sectional view of Modification 6A in which the second auxiliary electrode layer 200W and the hole injection layer 120B are not provided on the first auxiliary electrode layer 135W in the display panel 10YZ. In such a configuration, electron transport layers 124A and 124B, common electrode layers 125A and 125B, and a sealing layer 126 are sequentially stacked over the first auxiliary electrode layer 135W. In the case where the electron transport layers 124A and 124B are formed by vapor deposition, they are not formed on the inner peripheral surface of the contact hole 116a. Therefore, like in Modifications 4 and 5, partial areas 135a3 and 135a4 of the first auxiliary electrode layer 135W make direct contact with the common electrode layer 125B on the inner peripheral surface of the contact hole 116a, and the area of the partial areas 135a3 and 135a4 can be increased, as compared to Modification 4A depicted in FIG. 14B.

According to such a configuration, the contact area between the common electrode layer 125 and the first current feeding auxiliary electrode layer 135W can be increased, the sectional area of the conducting path to the third current feeding auxiliary electrode layer 135Y and the fourth current feeding auxiliary electrode layer 135Z can be increased, and the connection resistance from the common electrode layer 125 to the current feeding auxiliary electrode can be reduced.

Embodiment 2

<How Embodiment 2 of the Present Disclosure has Been Reached>

However, in the case where a metal such as aluminum, copper and silver is used for the auxiliary electrode layer, there arises a problem that an oxide film is formed at the surface of the auxiliary electrode layer, and the thus formed oxide film leads to an increase in electric resistance between the auxiliary electrode layer and the common electrode layer.

Thus, there is a need for an organic EL display panel, and a manufacturing method suitable for manufacturing the organic EL display panel, by which the above-mentioned problem can be solved, that is, electric resistance in electrical connection between a common electrode layer and an auxiliary electrode layer can be reduced, light emission efficiency can be enhanced, and variability in luminance can be restrained.

<Outline of Embodiment 2 of the Present Disclosure>

According to Embodiment 2 of the present disclosure, there is provided an organic EL display panel having a plurality of pixel electrodes arranged in a matrix pattern on a substrate, with a light emitting layer disposed on each of the pixel electrodes, the light emitting layer containing an organic light emitting material, the organic EL display panel including: the substrate; the plurality of pixel electrodes arranged in a matrix pattern over the substrate; a first current feeding auxiliary electrode layer disposed to extend in a column or row direction in at least one of gaps between adjacent ones of the pixel electrodes, over the substrate; a second current feeding auxiliary electrode layer disposed to extend in the same direction as the first current feeding auxiliary electrode layer in a partial area on the first current feeding auxiliary electrode layer; a plurality of light emitting layers disposed on the plurality of pixel electrodes; and a common electrode layer disposed continuously to cover an upper surface exclusive of the partial area of the first current feeding auxiliary electrode layer and an upper surface of the second current feeding auxiliary electrode layer, as well as an upper side of the plurality of light emitting layers, in which the first current feeding auxiliary electrode layer contains a first metal as a main constituent, whereas the second current feeding auxiliary electrode layer contains as a main constituent a second metal different from the first metal, and the resistance of a surface layer of the second current feeding auxiliary electrode layer is higher than the resistance of a surface layer of the first current feeding auxiliary electrode layer.

According to this configuration, the electric resistance in electrical connection between the common electrode layer and the auxiliary electrode layer can be reduced, light emission efficiency can be enhanced, and variability in luminance can be restrained.

Here, a metallic oxide layer may be formed at a surface layer of the second current feeding auxiliary electrode layer.

In addition, the sheet resistance of the first current feeding auxiliary electrode layer may be higher than the sheet resistance of the second current feeding auxiliary electrode layer.

Besides, the contact resistance between the first current feeding auxiliary electrode layer and the common electrode layer may be lower than the contact resistance between the second current feeding auxiliary electrode layer and the common electrode layer.

In addition, the surface area of the first current feeding auxiliary electrode layer may be greater than the surface area of the second current feeding auxiliary electrode layer.

Besides, the first metal may be tungsten or molybdenum, and the second metal may be aluminum.

In addition, according to a mode of the present disclosure, there is provided a method of manufacturing an organic EL display panel having a plurality of pixel electrodes arranged in a matrix pattern on a substrate, with a light emitting layer disposed on each of the pixel electrodes, the light emitting layer containing an organic light emitting material, the method including the steps of: forming the plurality of pixel electrodes arranged in a matrix pattern over the substrate by a vapor phase growth method; forming a first current feeding auxiliary electrode layer disposed to extend in a column or row direction in at least one of gaps between adjacent ones of the pixel electrodes over the substrate by a vapor phase growth method; forming a second current feeding auxiliary electrode layer disposed to extend in the same direction as the first current feeding auxiliary electrode layer in a partial area on the first current feeding auxiliary electrode layer by a vapor phase growth method; forming the plurality of light emitting layers on the plurality of pixel electrodes by a wet film forming method; and forming a common electrode layer continuously to cover an upper surface, exclusive of the partial area, of the first current feeding auxiliary electrode layer and an upper surface of the second current feeding auxiliary electrode layer as well as an upper side of the plurality of light emitting layers by a sputtering method or a CVD method.

By this method, it is possible to manufacture an organic EL display panel such that the electric resistance in electrical connection between the common electrode layer and the auxiliary electrode layer can be reduced, light emission efficiency can be enhanced, and variability in luminance can be restrained.

<Details of Embodiment 2>

1.1 Circuit Configuration of Display Device 1000

A circuit configuration of an organic EL display device according to Embodiment 2 is the same as that of the display device 1 according to Embodiment 1 depicted in FIG. 1. Therefore, the description of the circuit configuration will be omitted.

1.2 Circuit Configuration of Display Panel 3010

A circuit configuration of a display panel 3010 according to Embodiment 2 is the same as that of the display panel 10 according to Embodiment 1 depicted in FIG. 1. Therefore, the description of the circuit configuration will be omitted.

In a display panel 3010 according to the present embodiment, a substrate (TFT substrate) formed with thin film transistors is configured on the lower side in the Z-axis direction, and an organic EL element section is configured thereon.

1.4.1 Substrate (1) Substrate 300x and Interlayer Insulating Layer 318

For connection with wirings connected to sources 51 of pixels corresponding to pixel electrodes 319, an interlayer insulating layer 318 has contact holes (not illustrated) opened at its parts over the wirings, correspondingly to the pixel electrodes 319.

In the case where an upper limit film thickness of the interlayer insulating layer 318 is not less than 10 μm, variability in film thickness at the time of manufacture is enlarged, and it becomes difficult to control a bottom line width. From the viewpoint of a lowering in productivity due to an increase in tact, the upper limit film thickness of the interlayer insulating film 318 is desirably not more than 7 μm. In addition, the film thickness of the interlayer insulating layer 318 and the bottom line width should be comparable to each other; when the film thickness of the interlayer insulating layer 318 is reduced, particularly, when the lower limit film thickness of the interlayer insulating layer 318 is not more than 1 μm, it becomes difficult to obtain a desirable bottom line width due to limitations as to resolution. In the case of a general exposure apparatus for flat panel displays, the lower limit film thickness of the interlayer insulating layer 318 is 2 μm. Therefore, the thickness of the interlayer insulating layer 318 is preferably, for example, 1 to 10 μm, more preferably 2 to 7

1.4.2 Organic EL Element Section (1) Auxiliary Pixel Electrode 350 and Pixel Electrode 319

Figure 18:
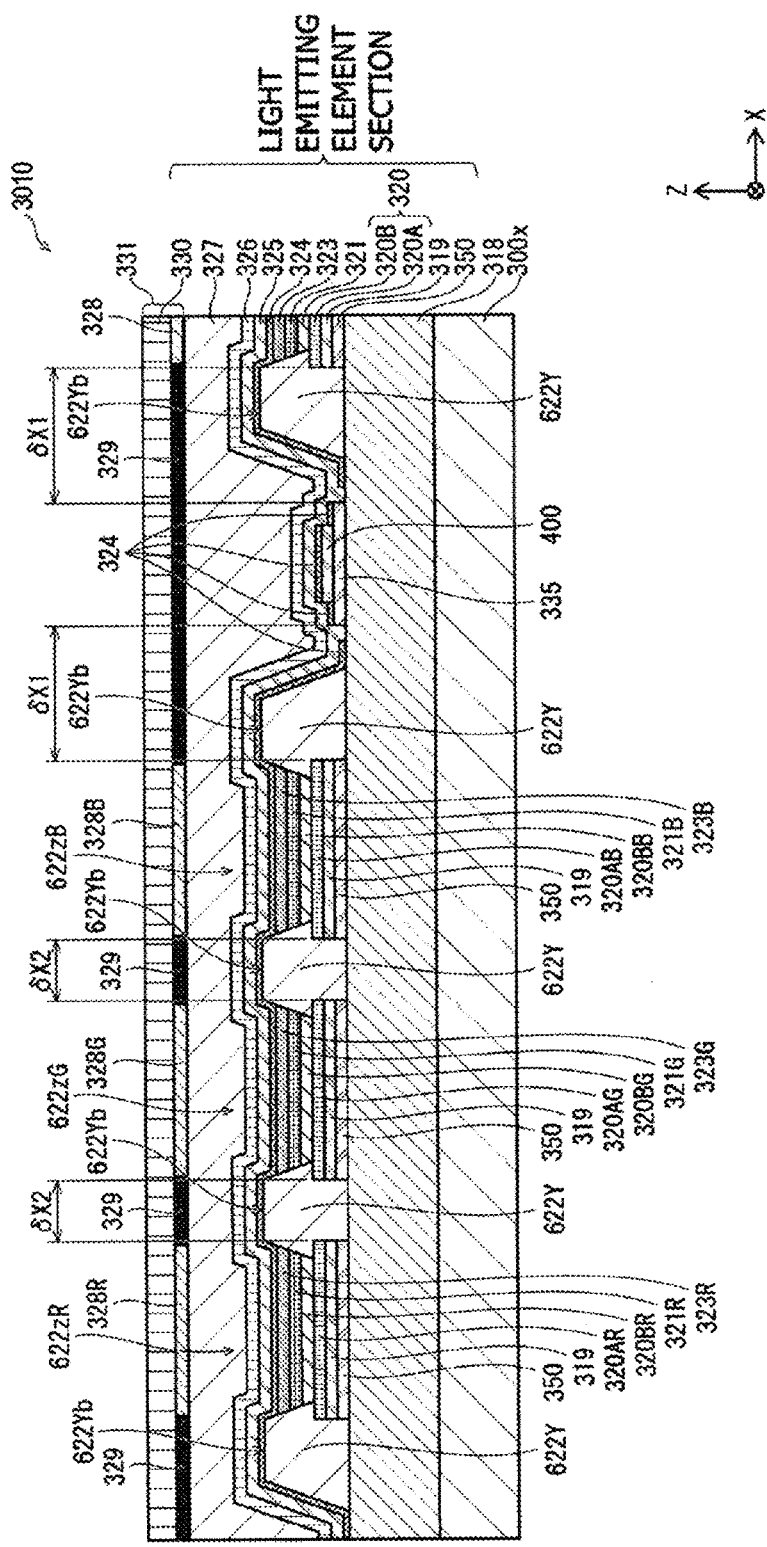
FIG. 18 is a schematic sectional view taken along line A1-A1 of FIG. 17.
Figure 19:
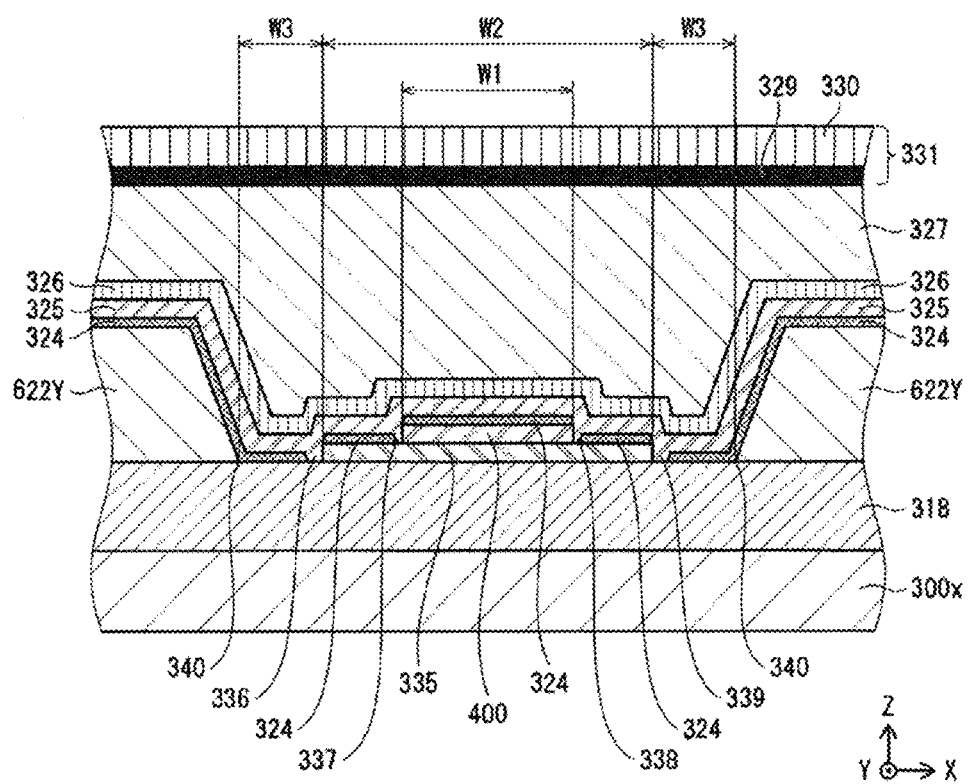
FIG. 19 is an enlarged view of the vicinity of the second auxiliary electrode layer depicted in FIG. 18.

As depicted in FIGS. 18 and 19, the interlayer insulating layer 318 located at the upper surface of the substrate 300x is provided with auxiliary pixel electrodes 350 on a sub-pixel 350se basis. Further, pixel electrodes 319 are stacked on the auxiliary pixel electrodes 350.

The auxiliary pixel electrode 350 and the pixel electrode 319 are for supplying carriers to a light emitting layer 323; for example, when they function as anode, they supply holes to the light emitting layer 323. In addition, since the display panel 3010 is of the top emission type, the pixel electrode 319 has a light reflecting property. The shapes of the auxiliary pixel electrode 350 and the pixel electrode 319 are a rectangular flat plate-like shape. The auxiliary pixel electrode 350 and the pixel electrode 319 are disposed with a spacing λX1 from the adjacent first auxiliary electrode layer 335 in the row direction. In addition, the auxiliary pixel electrode 350 and the pixel electrode 319 are disposed with a spacing λX2 from the adjacent auxiliary pixel electrode 350 and pixel electrode 319 in the row direction. The interlayer insulating layer 318 is formed, on the upper side of the contact hole (not illustrated), with a connection recess (contact hole; not illustrated) for the pixel electrode 319, by recessing a part of the pixel electrode 319 in the direction of the substrate 300x. At the bottom of the connection recess, the pixel electrode 319 and the wiring connected to the source 51 of the corresponding pixel are connected to each other.

With the auxiliary pixel electrodes 350 formed on the interlayer insulating layer 318, adhesion property (close contact property) is enhanced, whereby penetration of hydrogen into layers below the interlayer insulating layer 318 can be prevented.

Note that the auxiliary pixel electrodes 350 may not necessarily be formed on the interlayer insulating layer 318.

(2) First Auxiliary Electrode Layer 335 and Second Auxiliary Electrode Layer 300

As depicted in FIGS. 18 and 19, the interlayer insulating layer 318 located at the upper surface of the substrate 300x is provided with first auxiliary electrode layers 335. As depicted in FIG. 19, the first auxiliary electrode layer 335 is disposed with a spacing λX1 in the row direction from the adjacent pixel electrode 319. In addition, as depicted in FIG. 19, the first auxiliary electrode layer 335 is disposed with a spacing W3 in the row direction from a base portion 340 of the adjacent bank 622.

Note that the first auxiliary electrode layer 335 may be in contact with the base portion 340 of the adjacent bank 622, without the presence of the spacing W3 therebetween.

Here, the thickness of the first auxiliary electrode layer 335 is, for example, 50 nm.

Besides, as depicted in FIGS. 18 and 19, a second auxiliary electrode layer 400 is stacked on the first auxiliary electrode layer 335. The width W1 in the row direction of the second auxiliary electrode layer 400 is smaller than the width W2 in the row direction of the first auxiliary electrode layer 335. In other words, the surface area of the second auxiliary electrode layer 400 is smaller than the surface area of the first auxiliary electrode layer 335.

(3) Hole Injection Layer 320

As depicted in FIG. 18, hole injection layers 320 are stacked on the pixel electrodes 319. The hole injection layer 320 has a function of transporting hole, injected from the pixel electrode 319, into the hole transport layer 321.

The hole injection layer 320 includes a lower layer 320A formed on the pixel electrode 319 and formed from a metallic oxide, and an upper layer 320B stacked at least on the lower layer 320A and formed of an organic matter, in this order from the substrate 300x side. The lower layers 320A provided in the blue sub-pixel, the green sub-pixel and the red sub-pixel are referred to a lower layer 320AB, a lower layer 320AG and a lower layer 320AR, respectively. In addition, the upper layers 320B provided in the blue sub-pixel, the green sub-pixel and the red sub-pixel are referred to as an upper layer 320BB, an upper layer 320BG and an upper layer 320BR, respectively.

In the present embodiment, the upper layers 320B are provided to extend in a linear shape in the column direction in the gaps 622zR, the gaps 622zG and the gaps 522zB, which will be described later. However, a configuration may be adopted in which the upper layers 320B are formed only on the lower layers 320A formed on the pixel electrodes 319, and are provided intermittently in the column direction in the gaps 622z.

(4) Bank 322

Figure 17:
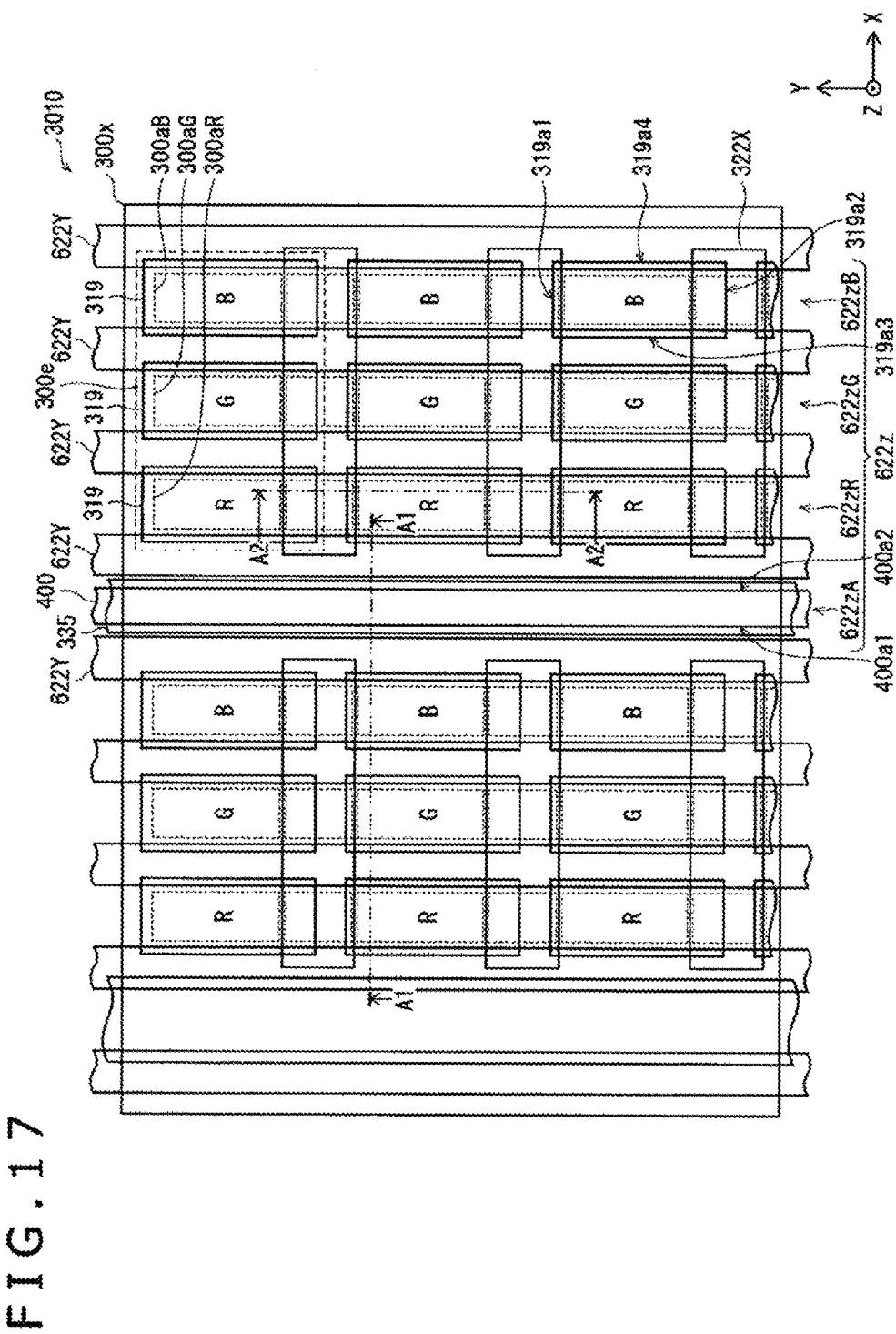
FIG. 17 is a schematic plan view of a part of the organic EL display panel according to at least one embodiment.

As depicted in FIGS. 18 and 19, banks formed from an insulator are formed such as to cover end edges of the pixel electrodes 319, the hole injection layers 320, the first auxiliary electrode layers 335 and the second auxiliary electrode layers 400. The banks include column banks 622Y extending in the column direction and provided in plurality and juxtaposedly in the row direction, and row banks 322X extending in the row direction and provided in plurality and juxtaposedly in the column direction. As depicted in FIG. 17, the column banks 622Y are provided in the state of being along the column direction orthogonal to the row banks 322X, and the column banks 622Y and the row banks 322X together form a grid pattern (where the row banks 322X and the column banks 622Y are not discriminated from each other, they will hereinafter be referred to as "banks 322").

The shape of the row bank 322X is a linear shape extending in the row direction, and its section obtained by cutting in parallel to the column direction is a normal-tapered trapezoid tapered upward. The row banks 322X are provided in the state of being along the row direction orthogonal to the column direction, in such a manner as to penetrate each column bank 622Y, and each row bank 322X has an upper surface at a position below upper surfaces 622Yb of the column banks 622Y. Therefore, openings corresponding to self-luminescence regions 300a are defined by the row banks 322X and the column banks 622Y.

The row banks 322X are for controlling flow, in the column direction, of inks containing organic compounds as materials of the light emitting layers 323. Therefore, the row banks 322X should have an affinity for the inks of not less than a predetermined value. By such a configuration, variations in ink coating amount from sub-pixel to sub-pixel are restrained. The row banks 322X prevent the pixel electrodes 319 from being exposed, and the regions where the row banks 322X are present do not emit light, and these regions do not contribute to luminance.

The row banks 322X are present on the upper side of column-directionally outer edges 319a1 and 319a2 of the pixel electrodes 319.

The row banks 322X prevent electric leaks between themselves and the common electrode layer 325, and define outer edges of the light emitting region 300a of each sub-pixel 300se in the column direction.

The shape of the column bank 622Y is a linear shape extending in the column direction, and its section obtained by cutting in parallel to the row direction is a normal-tapered trapezoid tapered upward. The column banks 622Y dams up row-directional flow of inks containing organic compounds as materials of the light emitting layers 323, thereby defining row-directional outer edges of the light emitting layers 323 to be formed.

The column banks 622Y have row-direction base portions defined by the upper side of row-directional outer edges 319a3 and 319a4 of the pixel electrodes 319 and row-directional outer edges 400a1 and 400a2 of the first auxiliary electrode layers 335. The column banks 622Y prevent electric leaks between themselves and the common electrode layer 325, and define outer edges of the light emitting region 300a of each sub-pixel 300se in the row direction. The column banks 622Y should have a repellency to the inks of not less than a predetermined value.

(5) Hole Transport Layer 321

As depicted in FIG. 18, hole transport layers 321 are stacked on the hole injection layers 320 in the gaps 622zR, 622zG and 622zB. In addition, the hole transport layers 321 are stacked (not illustrated) also on the hole injection layers 320 at the row banks 322X. The hole transport layer 321 is in contact with the upper layer 320B of the hole injection layer 320. The hole transport layer 321 has a function of transporting holes, injected from the hole injection layer 320, into the light emitting layer 323. The hole transport layers 321 provided in the gaps 622zR, 622zG and 622zB are referred to as a hole transport layer 321R, a hole transport layer 321G and a hole transport layer 321B, respectively.

In the present embodiment, like the upper layers 320B, the hole transport layers 321 are provided in a linear shape such as to extend in the column direction in the gaps 622z, which will be described later. However, a configuration may be adopted in which the hole transport layers 321 are provided intermittently in the column direction in the gaps 622z.

(6) Light Emitting Layer 323

As depicted in FIG. 18, the light emitting layers 323 are stacked on the hole transport layers 321. The light emitting layer 323 is a layer formed from an organic compound, and has a function of emitting light through recombination of holes and electrons therein. The light emitting layers 323 are provided in a linear shape such as to extend in the column direction in the gaps 622zR, the gaps 622zG and the gaps 622zB which are defined by the column banks 622Y. Light emitting layers 323R, 323G and 323B that emit light in respective colors (R, G and B) are formed in the red gaps 622zR corresponding to self-luminescence regions 300aR in red sub-pixels 300seR, the green gaps 622zG corresponding to self-luminescence regions 300aG in green sub-pixels 300seG, and the blue gaps 622zB corresponding to self-luminescence regions 300aB in blue sub-pixels 300seB, respectively.

(8) Common electrode Layer 325

As depicted in FIGS. 18 and 19, the common electrode layer 325 is formed on the electron transport layer 324. The common electrode layer 325 is formed over the whole surface of the display panel 3010, and serves as a common electrode for the light emitting layers 323.

As depicted in FIG. 18, the common electrode layer 325 is formed also in those regions on the electron transport layer 324 which are located on the upper side of the pixel electrodes 319. The common electrode layer 325 sandwiches the light emitting layer 323 together with the pixel electrode 319 to form a conducting path, thereby supplying carriers to the light emitting layer 323; for example, where the common electrode layer 325 functions as a cathode, it supplies electrons to the light emitting layer 323.

As depicted in FIGS. 18 and 19, the common electrode layer 325 is formed also in regions over the first auxiliary electrode layers 335 (exclusive of the parts on the first auxiliary electrode layers 335 at which the second auxiliary electrode layers 400 are formed) and the second auxiliary electrode layers 400. The common electrode layer 325 is formed such as to make direct contact with the first auxiliary electrode layers 335 and the second auxiliary electrode layers 400 at lacking parts 336, 337, 338 and 339 of the electron transport layer 324.

(9) Sealing Layer 326, Bonding Layer 327, Upper Substrate 330, Color Filter Layer 328, and Light-shielding Layer 329

The descriptions of the same configurations as those in Embodiment 1 will be omitted.

1.5 Method of Manufacturing Display Panel 3010

A method of manufacturing the display panel 3010 will be described referring to FIGS. 20A to 24.

(1) Preparation of Substrate 300x

Figure 20A:
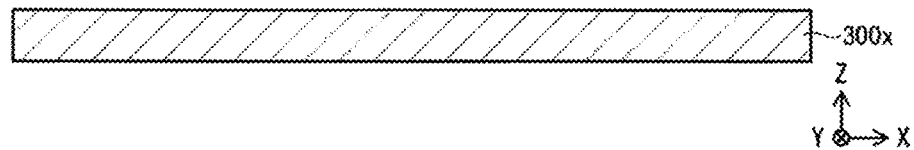
FIGS. 20A and 20B are schematic sectional views taken along line A1-A1 of FIG. 17 in each step in manufacture of the organic EL display panel according to at least one embodiment.

The substrate 300x formed with a plurality of TFTs and wiring is prepared. The substrate 300x can be produced by a known TFT production method (FIG. 20A).

(2) Formation of Interlayer Insulating Layer 318

Figure 20B:
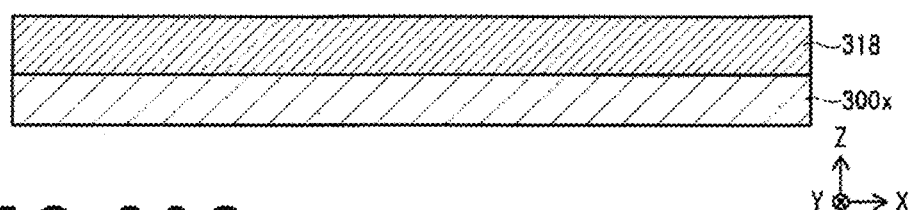

The aforementioned constituent material (photosensitive resin material) of the interlayer insulating layer 318 is applied as a photoresist in such a manner as to cover the substrate 300x, and the surface is planarized, to form the interlayer insulating layer 318 (FIG. 20B).

Figure 20C:
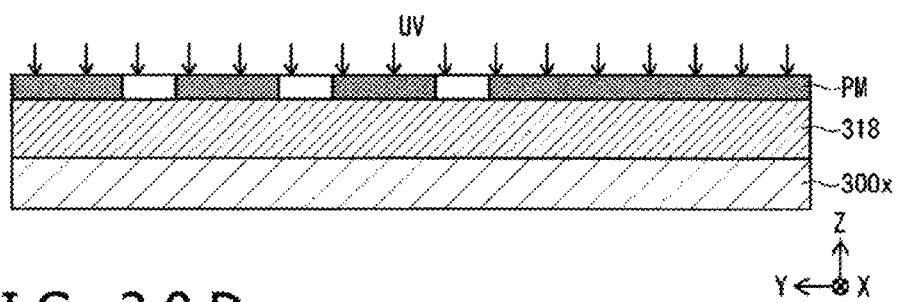
FIGS. 20C and 20D are schematic sectional views taken along line A2-A2 of FIG. 17 in each step in manufacture of the organic EL display panel according to at least one embodiment.

After the interlayer insulating layer 318 is formed, a photomask provided with predetermined openings is placed thereon, and irradiation with UV rays from above is conducted to expose the interlayer insulating layer 318, thereby transferring the pattern possessed by the photomask (FIG. 20C).

Figure 20D:
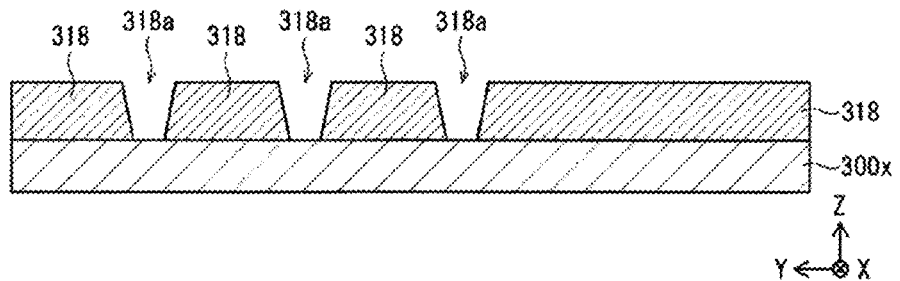

Thereafter, development is performed, to form the interlayer insulating layer 318 in which contact holes 318a are patterned (FIG. 20D). The wiring on the substrate 300x is exposed at bottom portions of the contact holes 318a.

While the interlayer insulating layer 318 is formed by use of a positive type photoresist in the present embodiment, the interlayer insulating layer 318 may be formed by use of a negative type photoresist.

(3) Formation of Auxiliary Pixel Electrode 350 and First Auxiliary Electrode Layer 335

Figure 21A:
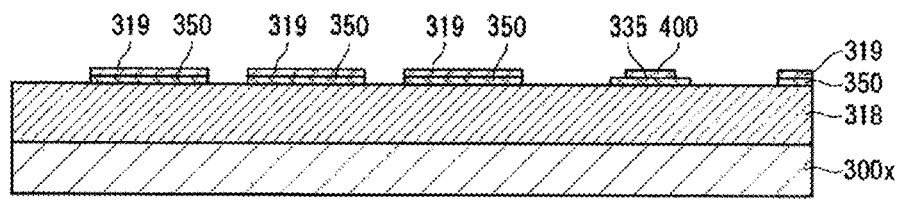
FIGS. 21A to 21D are schematic sectional views taken alone line A1-A1 of FIG. 17 in each step in manufacture of the organic EL display panel according to at least one embodiment.

After the interlayer insulating layer 318 having the contact holes 318a opened therein is formed, the auxiliary pixel electrodes 350 and the first auxiliary electrode layers 335 are formed (FIG. 21A).

Formation of the auxiliary pixel electrodes 350 and the first auxiliary electrode layers 335 is conducted by forming a metallic film by use of a sputtering method or the like, followed by patterning by use of a photolithographic method and an etching method. In this instance, a metallic film is formed along inner walls of the contact holes 318a, whereby the connection recesses of the auxiliary pixel electrodes 350 are formed.

The auxiliary pixel electrode 350 makes direct contact with the wiring on the substrate 300x that is exposed at the bottom portion of the contact hole 318a, to be in electrical connection with the electrode of the TFT.

(4) Formation of Pixel Electrode 319 and Second Auxiliary Electrode Layer 400

After the auxiliary pixel electrodes 350 and the first auxiliary electrode layers 335 are formed, the pixel electrodes 319 and the second auxiliary electrode layers 400 are formed respectively on the auxiliary pixel electrodes 350 and the first auxiliary electrode layers 335 (FIG. 21A).

Formation of the pixel electrodes 319 and the second auxiliary electrode layers 400 is conducted by forming a metallic film by use of a sputtering method or the like, followed by patterning by use of a photolithographic method and an etching method.

(5) Formation of Lower Layer 320A of Hole Injection Layer 320

Figure 21B:
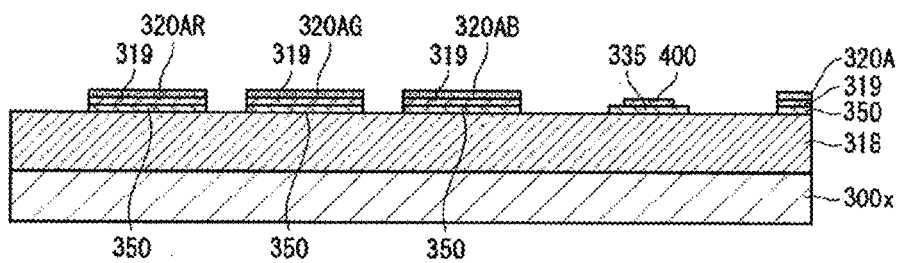

After the pixel electrodes 319 and the second auxiliary electrode layers 400 are formed, the lower layers 320A of the hole injection layers 320 are formed on the pixel electrodes 319 (FIG. 21B).

The lower layers 320A are formed by forming a film of a metal (for example, tungsten) by use of a sputtering method or a vapor phase growth method such as a vacuum deposition method, followed by baking to oxidize the metal film, and patterning the oxidized metal film on a pixel basis by use of a photolithographic method and an etching method.

(6) Formation of Bank 322

Figure 21C:
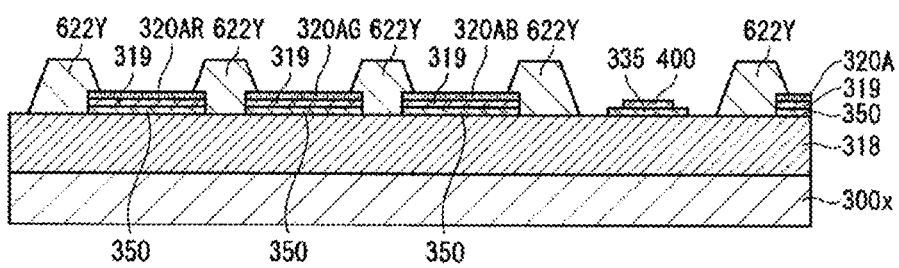

After the lower layers 320A of the hole injection layers 320 are formed, the banks 322 are formed in such a manner as to cover the lower layers 320A (FIG. 21C).

In forming the banks 322, first, the row banks 322X are formed, and thereafter the column banks 622Y are formed in such a manner as to form the gaps 622z.

In forming the banks 322, first, a film of a constituent material (for example, a photosensitive resin material) of the banks 322 is stackedly formed on the lower layers 320A by use of a spin coating method or the like. Then, the resin film is patterned to sequentially form the row banks 322X and the column banks 622Y. The patterning of the row banks 322X and the column banks 622Y is conducted by performing exposure while utilizing a photomask on the upper side of the resin film, followed by a developing step and a baking step (approximately 230° C., approximately 60 minutes).

Specifically, in a step of forming the row banks 322X, first, a photosensitive resin film formed from an organic photosensitive resin material such as acrylic resins, polyimide resins and novolak type phenolic resins is formed, followed by drying to evaporate off the solvent to a certain extent. Then, a photomask provided with predetermined openings is placed thereon, and irradiation with UV rays from above is conducted to expose the photoresist formed of a photosensitive resin or the like, whereby a pattern possessed by the photomask is transferred to the photoresist. Next, the photosensitive resin is developed, to form an insulating layer in which the row banks 322X are patterned. In general, a photoresist called a positive type is used. Of the positive type photoresist, the exposed parts are removed by development, whereas the parts not exposed to light remain without being removed by development.

In a step of forming the column banks 622Y, first, a film of a constituent material (for example, a photosensitive resin material) of the column banks 622Y is stackedly formed by use of a spin coating method or the like. Then, the resin film is patterned to open the gaps 622z, thereby forming the column banks 622Y. The formation of the gaps 622z is conducted by performing exposure while disposing a mask over the resin film, followed by development. The column banks 622Y extend in the column direction, and provided juxtaposedly through the gaps 622z in the row direction.

(7) Formation of Organic Functional Layer

Figure 21D:
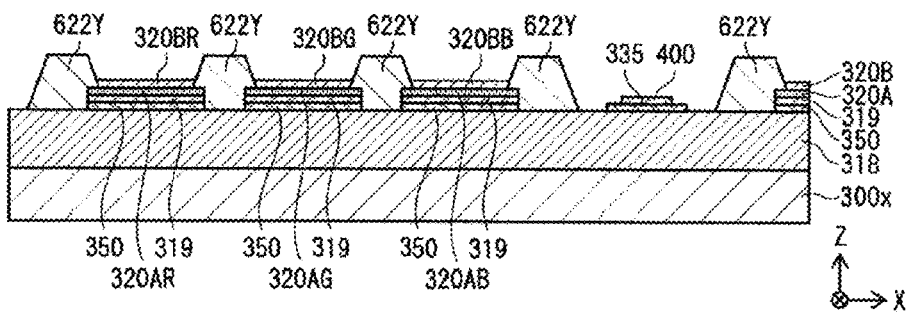
Figure 22A:
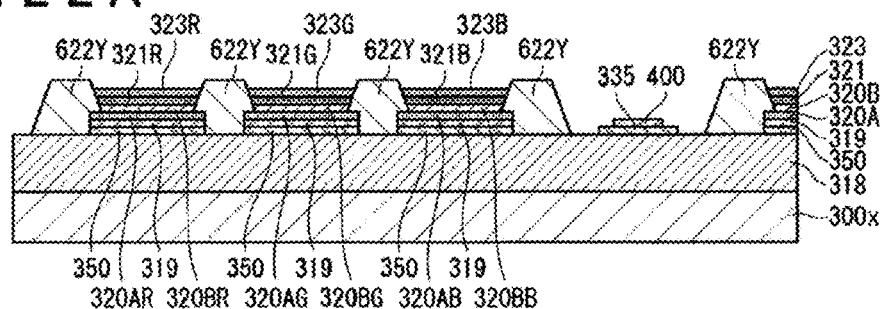
FIGS. 22A to 22D are schematic sectional views taken along line A1-A1 of FIG. 17 in each step in manufacture of the organic EL display panel according to at least one embodiment.

The upper layers 320B of the hole injection layers 320, the hole transport layers 321 and the light emitting layers 323 are sequentially stackedly formed on the lower layers 320A of the hole injection layers 320 formed in the inside of the gaps 622z defined by the column banks 622Y, inclusive of the areas on the row banks 322X (FIGS. 21D and 22A).

In forming the upper layers 320B, inks containing conductive polymer materials such as PEDOT (a mixture of polythiophene and polystyrenesulfonic acid) are applied to the inside of the gaps 622z defined by the column banks 622Y by use of an ink jet method, followed by evaporating off the solvents, or baking. Thereafter, patterning on a pixel basis may be performed by a photolithographic method and an etching method.

In forming the hole transport layers 321, an ink containing a constituent material is applied to the inside of the gaps 622z defined by the column banks 622Y by use of a wet process such as an ink jet process or a gravure printing process, followed by evaporating off the solvent, or baking. The method for applying the ink of the hole transport layers 321 to the inside of the gaps 622z is the same as the method for the upper layers 320B described above. Alternatively, formation of the hole transport layers 321 is conducted by depositing a film of a metal (for example, tungsten) by use of a sputtering method, followed by baking to oxidize the metal film. Thereafter, patterning on a pixel basis may be conducted by use of a photolithographic method and an etching method.

In forming the light emitting layers 323, inks containing constituent materials are applied to the gaps 622z defined by the column banks 622Y by use of an ink jet method, followed by baking. Specifically, in this step, an ink 323RI, 323GI or 323BI containing a material for the organic light emitting layers for one of colors R, G and B is applied by an ink jet method to fill the gaps 622z to be sub-pixel forming regions and the ink filling the gaps 622z is dried under a reduced pressure, followed by a baking treatment, to form the light emitting layers 323R, 323G or 323B. In this instance, in application of the ink for the light emitting layers 323, first, a solution for forming the light emitting layers 323 is applied by use of a droplet jetting apparatus. When the application of the ink for forming one of the red light emitting layers, the green light emitting layers and the blue light emitting layers to the substrate 300x is finished, an ink of another color is next applied to the substrate, then an ink of a third color is applied to the substrate, and thus the ink applying step is conducted repeatedly, to sequentially apply the inks of the three colors. By this, the red light emitting layers, the green light emitting layers and the blue light emitting layers are formed on the substrate 300x in the manner of being aligned repeatedly in a horizontal direction of the paper surface of the drawing. The details of the method for applying the inks for the light emitting layers 323 to the inside of the gaps 622z are the same as those of the method for forming the upper layers 320B described above.

The method for forming the upper layers 320B of the hole injection layers 320, the hole transport layers 321 and the light emitting layers 323 is not limited to the above-mentioned. Other than the ink jet method and the gravure printing method, there may also be used such known methods as a dispenser method, a nozzle coating method, a spin coating method, intaglio printing, and relief printing, to drop or apply the inks.

(8) Formation of Electron Transport Layer 324

Figure 22B:
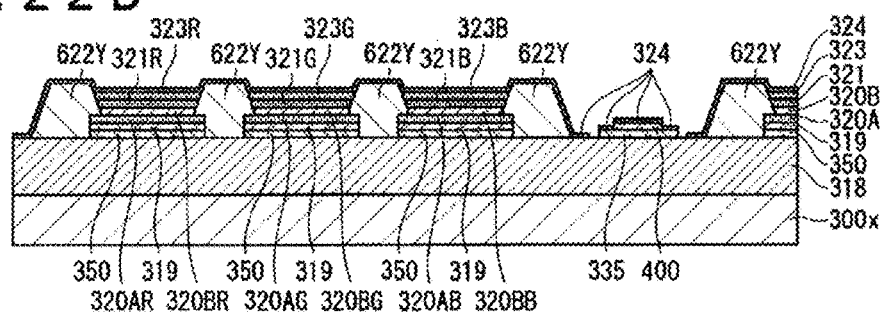

After the light emitting layers 323 are formed, the electron transport layer 324 is formed over the whole surface of the display panel 3010 by a vacuum deposition method or the like (FIG. 22B). The electron transport layer 324 is formed also on the second auxiliary electrode layers 400 and the first auxiliary electrode layers 335 (exclusive of those areas on the first auxiliary electrode layers 335 at which the second auxiliary electrode layers 400 are formed). In this instance, at end portions of the second auxiliary electrode layers 400 and end portions of the first auxiliary electrode layers 335, lacking (stepping) is intentionally generated in the electron transport layer 323, so that the end portions of the second auxiliary electrode layers 400 and the end portions of the first auxiliary electrode layers 335 are exposed at the lacking parts 336, 337, 338 and 339 (FIG. 19).

(9) Formation of Common Electrode Layer 325

Figure 22C:
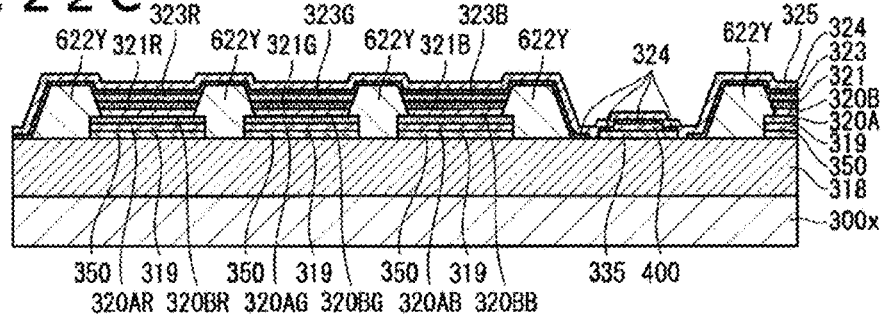

After the electron transport layer 324 is formed, the common electrode layer 325 is formed in such a manner as to cover the electron transport layer 324 by a CVD method, a sputtering method or the like (FIG. 22C). The common electrode layer 325 is formed also in those areas on the electron transport layer 324 which are located over the second auxiliary electrode layers 400 and the first auxiliary electrode layers 335 (exclusive of those parts on the first auxiliary electrode layers 335 at which the second auxiliary electrode layers 400 are formed). In this case, the common electrode layer 325 comes around into the lacking parts 336, 337, 338 and 339 (FIG. 19) of the electron transport layer 324, to be formed to make direct contact with the end portions of the second auxiliary electrode layers 400 and the end portions of the first auxiliary electrode layers 335 that are exposed at the lacking parts of the electron transport layer 324.

(10) Formation of Sealing Layer 326

Figure 22D:
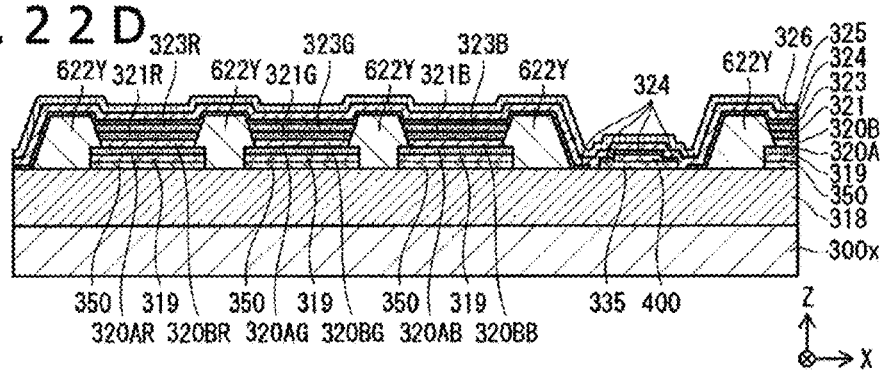

After the common electrode layer 325 is formed, the sealing layer 326 is formed in such a manner as to cover the common electrode layer 325 (FIG. 22D). The sealing layer 326 can be formed by a CVD method, a sputtering method or the like.

(11) Formation of Color Filter Substrate 331

A step of manufacturing the color filter substrate 331 will be exemplified below.

Figure 23A:
FIGS. 23A to 23G are schematic sectional views taken long line A1-A1 of FIG. 17 in each step in manufacture of the organic EL display panel according to at least one embodiment.

The transparent upper substrate 330 is prepared, and a material for the light-shielding layer 329, which contains a UV-curing resin (e.g., UV-curing acrylic resin) material as a main constituent with a black pigment added thereto, is applied to a surface on one side of the transparent upper substrate 330 (FIG. 23A).

Figure 23B:
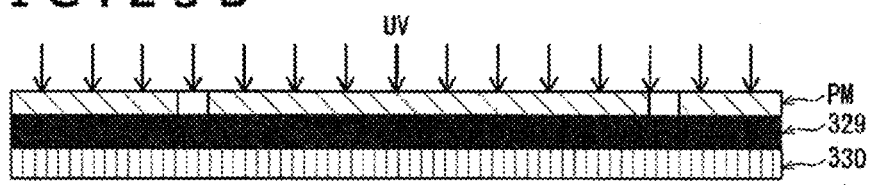

A pattern mask PM provided with predetermined openings is placed on the upper surface of the applied light-shielding layer 329, and irradiation with UV rays is conducted from above (FIG. 23B).

Figure 23C:
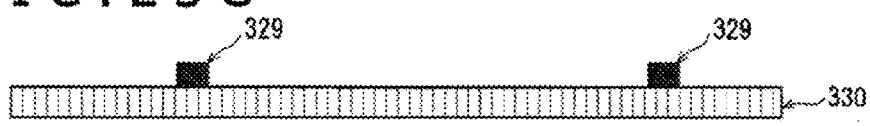

Thereafter, development is conducted by removing the pattern mask PM and uncured portions of the light-shielding layer 329, and curing is performed, whereon the light-shielding layers 329 in a rectangular sectional shape are completed (FIG. 23C).

Figure 23D:
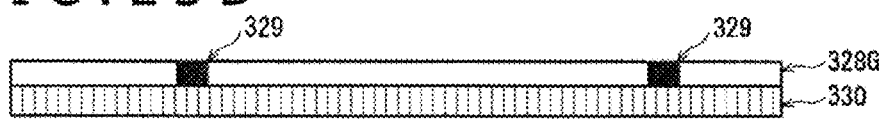
Figure 23E:
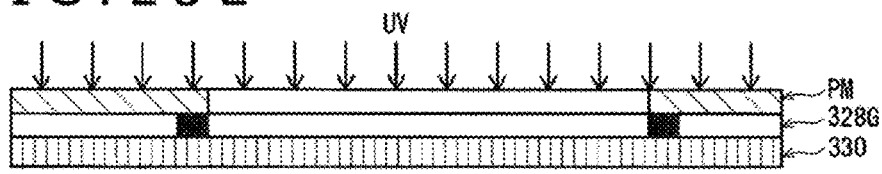

Next, a material 328G for a color filter layer 328 (e.g., 328G), which contains a UV-curing resin component as a main constituent, is applied to the surface of the upper substrate 330 formed with the light-shielding layers 329 (FIG. 23D), a predetermined pattern mask PM is placed thereon, and irradiation with UV rays is conducted (FIG. 23E).

Figure 23F:
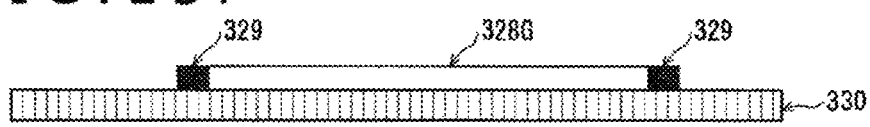

Thereafter, curing is performed, and development is conducted by removing the pattern mask PM and uncured portions of the paste 328R, whereon the color filter layers 328G are formed (FIG. 23F).

Figure 23G:
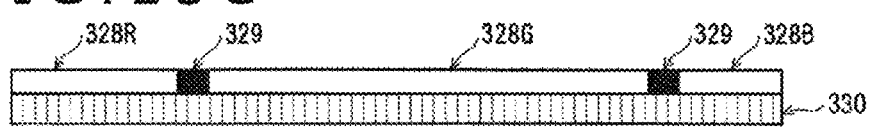

The steps of FIGS. 23D, 23E and 23F are similarly repeated for each of color filter materials, whereby color filter layers 328R and 328B are formed (FIG. 23G). Note that commercially available color filter products may be utilized, instead of using the paste 328R.

In this way, the color filter substrate 331 is formed.

(12) Lamination of Color Filter Substrate 331 and Back Panel

Next, a material for the bonding layer 327, which contains a UV-curing resin such as acrylic resin, silicone resin and epoxy resin as a main constituent, is applied to the back panel including the layers ranging from the substrate 300x to the sealing layer 326 (FIG. 24A).

Subsequently, the applied material is irradiated with UV rays, to laminate the back panel and the color filter substrate 331 in the state in which they are relatively positioned (aligned). In this instance, care should be taken to prevent gas from entering between both substrates. Thereafter, both the substrates are baked to complete the sealing step, whereon the display panel 3010 is completed (FIG. 24B).

1.6 Summary

In the case where a metal such as aluminum, copper and silver is used as a material for the auxiliary electrode layer, an oxide film is formed at the surface (surface layer) of the auxiliary electrode layer, whereby the contact resistance between the auxiliary electrode layer and the common electrode layer is raised.

In order to solve this problem, the display panel 3010 has the plurality of pixel electrodes 319 arranged in a matrix pattern on the substrate 300x, and the light emitting layer 323 containing an organic light emitting material is disposed on each pixel electrode 319. The display panel 3010 includes: the substrate 300x; the plurality of pixel electrodes 319 arranged in a matrix pattern over the substrate 300x; the first auxiliary electrode layer 335 disposed over the substrate 300x to extend in the column or row direction in at least one of the gaps between the adjacent ones of the pixel electrodes 319; the second auxiliary electrode layer 400 disposed to extend in the same direction as the first auxiliary electrode layer 335 in a partial region on the first auxiliary electrode layer 335; the plurality of light emitting layers 323 disposed on the plurality of pixel electrodes 319; and the common electrode layer 325 disposed continuously to cover the upper surface exclusive of a partial region of the first auxiliary electrode layer 335 and the upper surface of the second auxiliary electrode layer 400 as well as the upper side of the plurality of light emitting layers 323. Here, the first auxiliary electrode layer 335 contains a first metal as a main constituent, while the second auxiliary electrode layer 400 contains as a main constituent a second metal different from the first metal. The resistance of the surface layer of the second auxiliary electrode layer 400 is higher than the resistance of the surface layer of the first auxiliary electrode layer 335.

According to this configuration, the common electrode layer 325 makes contact with the first auxiliary electrode layer 335 (exclusive of the partial region mentioned above), and the first auxiliary electrode layer 335 makes contact with the second auxiliary electrode layer 400. In other words, the common electrode layer 325 makes contact with the second auxiliary electrode layer 400 through the first auxiliary electrode layer 335. Therefore, even in the case where an oxide film is formed at the surface layer of the second auxiliary electrode layer 400, the electric resistance in electrical connection between the common electrode layer and the second auxiliary electrode layer can be reduced, owing to the electrical connection of the layers through the first auxiliary electrode layer 335. As a result, light emission efficiency can be enhanced, and irregularities in luminance can be restrained.

Here, in the case where tungsten or molybdenum is used as the material for the first auxiliary electrode layer 335, an oxide film is not formed at the surface of the first auxiliary electrode layer 335, since the metal is chemically stable at room temperature.

The contact resistance between the second auxiliary electrode layer 400 and the common electrode layer 325 is higher than a first predetermined value, whereas the contact resistance between the first auxiliary electrode layer 335 and the common electrode layer 325 is lower than the first predetermined value.

In addition, the sheet resistance of the second auxiliary electrode layer 400 is lower than a second predetermined value, while the sheet resistance of the first auxiliary electrode layer 335 is higher than the sheet resistance of the second auxiliary electrode layer 400, and the sheet resistance of the common electrode layer 325 is higher than the second predetermined value.

By putting the common electrode layer 325 and the first auxiliary electrode layer 335 (exclusive of those parts on which the second auxiliary electrode layer 400 is formed) in contact with each other, the resistance can be reduced as compared to the contact resistance between the common electrode layer 325 and the second auxiliary electrode layer 400.

Besides, since the sheet resistance of the second auxiliary electrode layer 400 is lower than the sheet resistance of the first auxiliary electrode layer 335, the sheet resistance of the first auxiliary electrode layer 335 and the second auxiliary electrode layer 400 as a whole can be reduced, as compared to the case where the first metal (for example, tungsten) is used for the first auxiliary electrode layer 335 and the second auxiliary electrode layer 400 as a whole.

In addition, as depicted in FIG. 19, lacking (stepping) is generated in the electron transport layer 324 at end portions of the second auxiliary electrode layers 400 and end portions of the first auxiliary electrode layers 335, and the common electrode layer 325 and the first auxiliary electrode layer 335 are in direct contact with each other, and the common electrode layer 325 and the second auxiliary electrode layer 400 are in direct contact with each other, at the lacking parts 336, 337, 338 and 339. Therefore, a reduction in resistance can be realized.

1.7 Modifications

While the display panel 3010 according to Embodiment 2 has been described above, a thin film of the electron transport layer 324 may be formed without generation of lacking (stepping) at the lacking parts 336, 337, 338 and 339 depicted in FIG. 19.

A configuration may be adopted in which at least part of the lacking parts 336, 337, 338 and 339 depicted in FIG. 19 of the electron transport layer 324 is not come to be lacking but is thinned to a thickness of not more than 1 nm, to form thinned parts (not illustrated). By this configuration, a structure can be realized in which although the electron transport layer 324 is not partly lacking, the common electrode layer 325 is electrically connected to the second auxiliary electrode layer 400 or the first auxiliary electrode layer 335 at a lower electric resistance at the thinned parts of the electron transport layer 324 than at the other parts of the electron transport layer 324. As a result, the electric resistance in electrical connection between the common electrode layer 325 and the second auxiliary electrode layer 400 or between the common electrode layer 325 and the first auxiliary electrode layer 335 can be reduced, light emission efficiency can be enhanced, and irregularities in luminance can be restrained.

Embodiment 3

<How Embodiment 3 of the Present Disclosure has Been Reached>

However, when the auxiliary electrodes are formed in the same layer as the pixel electrodes, there arises a problem that the areas of the pixel electrodes on the substrate are reduced, and the pixel aperture ratio is lowered. In addition, there is a case where a layer having a comparatively high electric resistance is formed between an auxiliary electrode and a common electrode layer depending on the manufacturing step of an organic EL display panel, and, in that case, there is a problem that the electric resistance between the auxiliary electrode and the common electrode is raised.

Thus, there is a need for a solution to the above problems, and for an organic EL display panel and a manufacturing method suitable for manufacturing the organic EL display panel such that in the case where an organic layer having a comparatively high electric resistance is formed between an auxiliary electrode and a common electrode layer, the electric resistance in electrical connection between the common electrode layer and the auxiliary electrode can be reduced without lowering the pixel aperture ratio.

<Details of Embodiment 3>

1.1 Circuit Configuration of Display Device 2000

A circuit configuration of an organic EL display device according to Embodiment 3 is the same as that of the display device 1 according to Embodiment 1 depicted in FIG. 1. Therefore, the description of the circuit configuration will be omitted.

1.2 Circuit Configuration of Display Panel 4010

A circuit configuration of a display panel 4010 according to Embodiment 3 is the same as that of the display panel 10 according to Embodiment 1 depicted in FIG. 1. Therefore, the description of the circuit configuration will be omitted.

1.1.3 Circuit Configuration of Display Panel 4010

Figure 25:
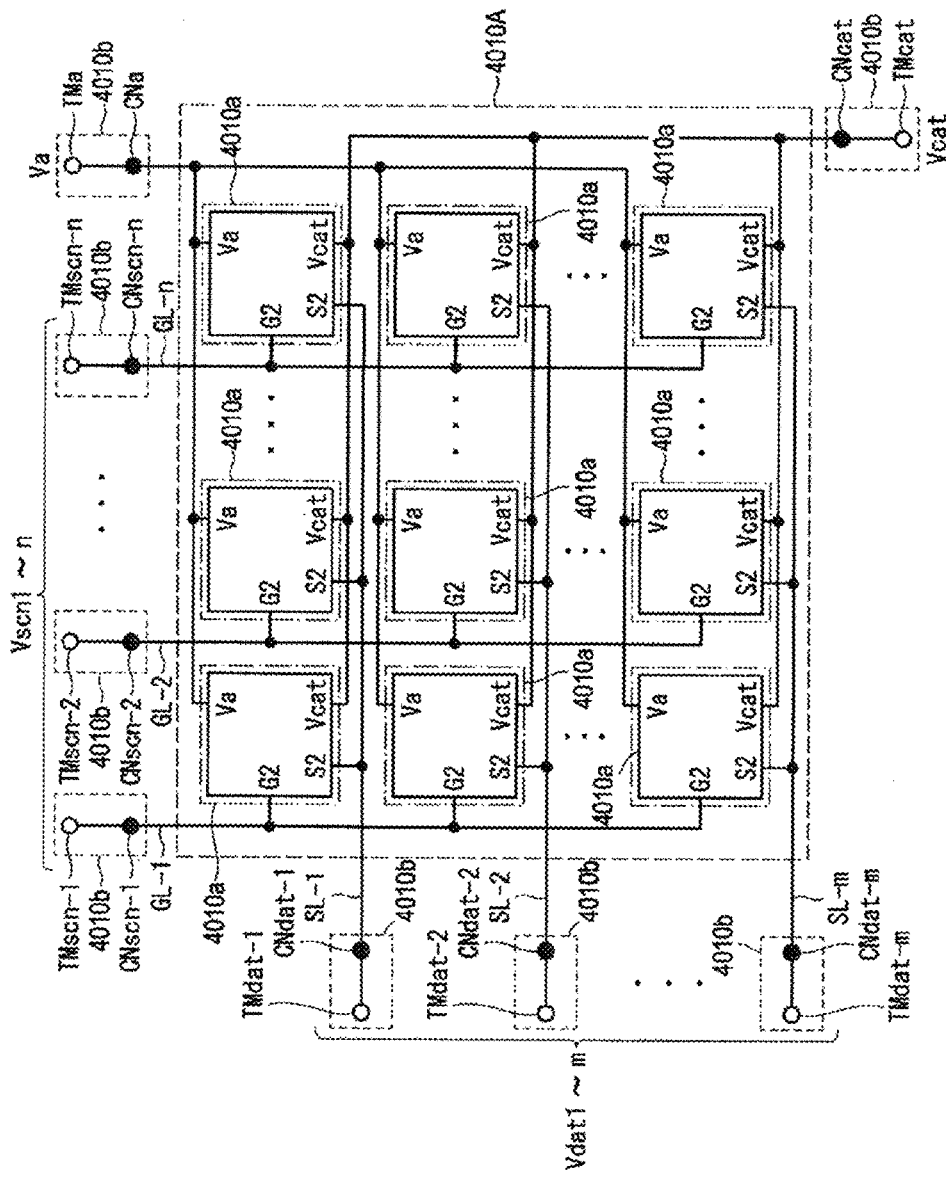
FIG. 25 is a schematic diagram of a circuit configuration of the display panel according to at least one embodiment.

The circuit configuration of the display panel 4010 will be described referring to FIG. 25. In the display panel 4010, the pixels 4010a having the circuit configuration are arranged in a matrix pattern as illustrated in FIG. 25, to constitute a display region 4010A.

Gate lines GL-1 to GL-n are led out from the gates $G_2$ of the pixels 4010a arranged in a matrix pattern, and are connected, at connection sections 4010b present outside of the display region 4010A, to external connection terminals TMscn-1 to TMscn-n through wiring connection sections CNscn-1 to CNscn-n, and are connected to scan lines Vscn-1 to Vscn-n.

Similarly, source lines S1-1 to SL-m are led out from the sources $S_2$ of the pixels 4010a arranged in the matrix pattern, and are connected, at the connection sections 4010b, to external connection terminals TMdat-1 to TMdat-m through wiring connection sections CNdat-1 to CNdat-m, and are connected to data lines Vdat-1 to Vdat-m.

In addition, power supply lines Va of the pixels are integratedly connected, at the connection section 4010b, to an external connection terminal TMa through a wiring connection section CNa.

Note that in the display device 2000 that performs color display, a plurality of adjacent pixels 4010a (for example, three pixels 4010a of luminescent colors of red (R), green (G) and blue (B)) are made to be sub-pixels, which may be combined to constitute one pixel.

1.1.4 Sectional Configuration of Display Panel 4010

The display panel 4010 is a top emission type organic EL display panel, in which a TFT layer is formed on the lower side in the Z-axis direction, a planarizing layer is formed thereon, and an EL layer is further formed thereon. (TFT Layer)

Figure 26:
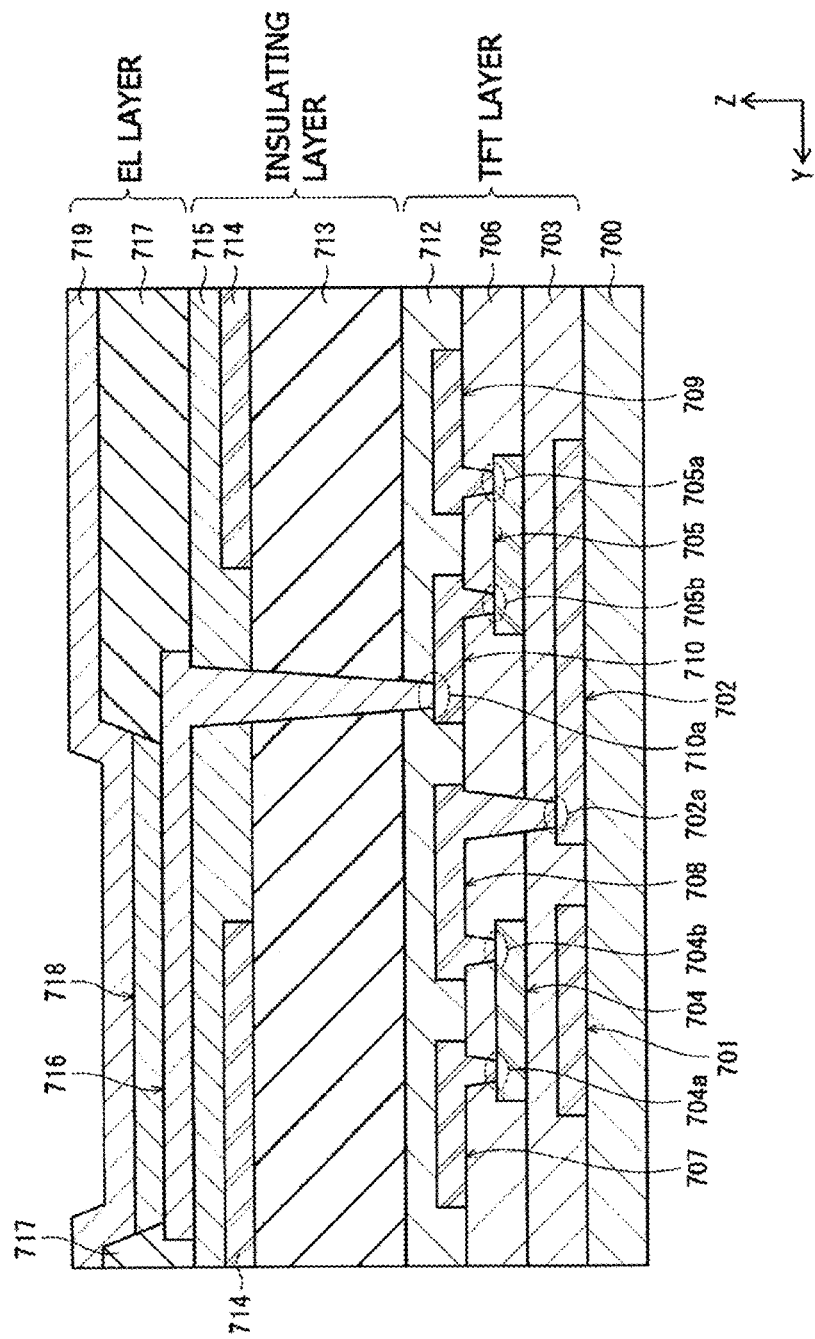
FIG. 26 is a schematic view of a sectional configuration of the display panel according to at least one embodiment.

The TFT layer will be described referring to FIG. 26. FIG. 26 depicts an example of sectional configuration in a YZ plane of the display panel 4010.

On a substrate 700, gate electrodes 701 and 702 are formed with a spacing therebetween. A gate insulating layer 703 is formed in such a manner as to cover the surfaces of the gate electrodes 701 and 702 and the substrate 700.

On the gate insulating layer 703, channel layers 704 and 705 are formed correspondingly to the gate electrodes 701 and 702, respectively. Besides, a channel protection layer 706 is formed in such a manner as to cover the surfaces of the channel layers 704 and 705 and the gate insulating layer 703.

On the channel protection layer 706, a source electrode 707 and a drain electrode 708 are formed with a spacing therebetween and correspondingly to the gate electrode 701 and the channel layer 704. Similarly, a source electrode 710 and a drain electrode 709 are formed with a spacing therebetween and correspondingly to the gate electrode 702 and the channel layer 705. A passivation layer 712 is formed in such a manner as to cover the surfaces of the source electrodes 707 and 710, the drain electrodes 708 and 709, and the channel protection layer 706.

The gate insulating layer 703 and the channel protection layer 706 are provided therein with a contact hole on the upper side of a contact region 702a of the gate electrode 702, and the drain electrode 708 is in contact with the gate electrode 702 at a bottom of the contact hole.

The channel protection layer 706 is provided therein with a contact hole on the upper side of a contact region 704a of the channel layer 704, and the source electrode 707 is in contact with the channel layer 704 at a bottom of the contact hole. Similarly, the channel protection layer 706 is provided therein with a contact hole on the upper side of a contact region 704b of the channel layer 704, and the drain electrode 708 is in contact with the channel layer 704 at a bottom of the contact hole.

The channel protection layer 706 is provided therein with a contact hole on the upper side of a contact region 705a of the channel layer 705, and the drain electrode 709 is in contact with the channel layer 705 at a bottom of the contact hole. Similarly, the channel protection layer 706 is provided therein with a contact hole on the upper side of a contact region 705b of the channel layer 705, and the source electrode 710 is in contact with the channel layer 705 at a bottom of the contact hole.

In addition, the passivation layer 712 is provided therein with a contact hole on the upper side of a contact region 710a of the source electrode 710, and a pixel electrode 716 which will be described later is in contact with the source electrode 710 at a bottom of the contact hole.

Note that the gate electrode 701 corresponds to the gate $G_2$, the source electrode 707 corresponds to the source $S_2$, and the drain electrode 708 corresponds to the drain D2. Similarly, the gate electrode 702 corresponds to the gate $G_1$, the source electrode 710 corresponds to the source S1, and the drain electrode 709 corresponds to the drain $D_1$. (Planarizing Layer)

Figure 27:
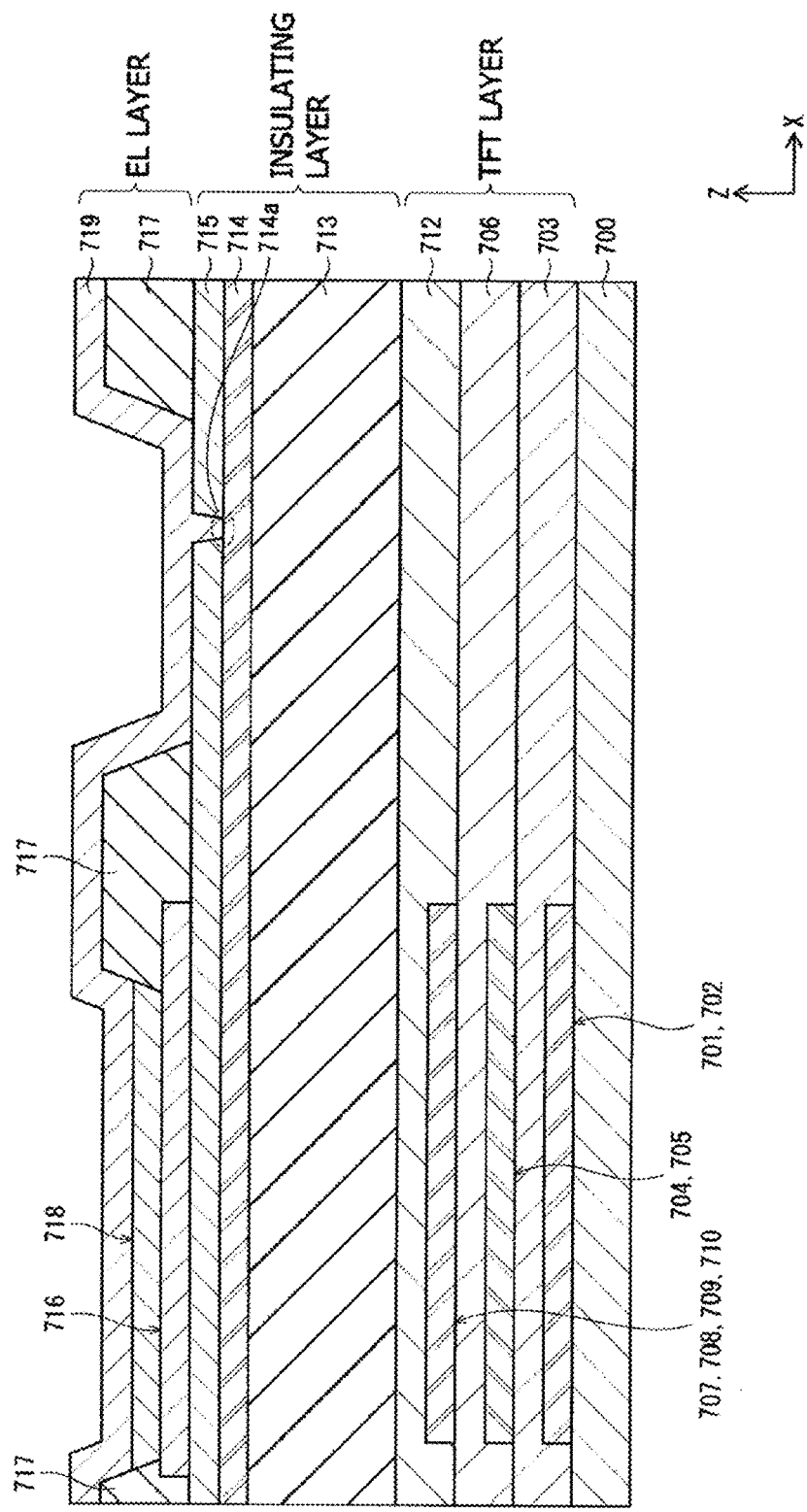
FIG. 27 is a schematic view of a sectional configuration of the display panel according to at least one embodiment.

A planarizing layer will be described referring to FIGS. 26 and 27. FIG. 27 depicts an example of sectional configuration in an XZ plane of the display panel 4010.

A lower interlayer insulating layer 713 is formed on the passivation layer 712, and auxiliary electrodes 714 are formed on the lower interlayer insulating layer 713. In addition, an upper interlayer insulating layer 715 is formed in such a manner as to cover the surfaces of the auxiliary electrode 714 and the lower interlayer insulating layer 713.

As depicted in FIG. 26, the lower interlayer insulating layer 713 and the upper interlayer insulating layer 715 are provided therein with a contact hole on the upper side of a contact region 710a of the source electrode 710.

As depicted in FIG. 27, the upper interlayer insulating layer 715 is provided therein with a contact hole on the upper side of a contact region 714a of the auxiliary electrode 714, and a common electrode layer 719 which will be described later is in contact with the auxiliary electrode 714 at a bottom of the contact hole.

The auxiliary electrode 714 is provided to extend in an X-axis direction and a Y-axis direction, while avoiding the contact hole that is provided in the lower interlayer insulating layer 713 and the upper interlayer insulating layer 715 on the upper side of the contact region 710a of the source electrode 710. Note that the contact regions 714a of the auxiliary electrodes 714 are provided to extend in the Y-axis direction, every a few pixels (for example, every three pixels) in the X-axis direction.

(EL Layer)

An EL layer will be described referring to FIG. 26.

On the upper interlayer insulating layer 715, the pixel electrodes 716 are provided on the pixel 4010a basis at parts where the contact holes on the upper side of the contact regions 714a of the auxiliary electrodes 714 are not opened. The pixel electrode 716 is connected to the source electrode through the contact hole opened in the passivation layer 712, the lower interlayer insulating layer 713 and the upper interlayer insulating layer 715 on the upper side of the contact region 710a of the source electrode 710.

On the pixel electrodes 716, banks 717 are formed in such a manner as to cover end edges of the pixel electrodes 716. By the surrounding by the banks 717, openings each corresponding to each pixel 4010a are defined.

A light emitting layer 718 is formed in the opening defined by the banks 717 on the pixel electrode 716.

The common electrode layer 719 is formed in such a manner as to cover the light emitting layers 718, the banks 717 and the upper interlayer insulating layers 715. The common electrode layer 719 is formed in the state of being continuous over the whole part of the display panel, and is connected to the auxiliary electrodes through the contact holes that are provided in the upper interlayer insulating layer 715 on the upper side of the contact regions 714a of the auxiliary electrodes 714.

1.3 Manufacturing Method

A method of manufacturing the display panel 4010 will be described referring to FIGS. 28A to 29E.

(1) Formation of Gate Electrodes 701 and 702 and Gate Insulating Layer 703

On a surface on the upper side in the Z-axis direction of a substrate 700, the gate electrodes 701 and 702 are formed with a spacing therebetween, as depicted in FIG. 28A, for example. In forming the gate electrodes 701 and 702, for example, a metallic thin film of MoW is formed on the surface of the substrate 700 by use of a metal sputtering method, and a resist pattern is formed thereon by use of a photolithographic method. Next, wet etching is conducted, followed by removing the resist pattern. By this, the gate electrodes 701 and 702 are formed.

Note that wiring 701a depicted in FIG. 28A corresponds to the gate lines GL-1 to GL-n.

The gate insulating layer 703 is formed in such a manner as to cover the surfaces of the gate electrodes 701 and 702 and the substrate 700. The formation of the gate insulating layer 703 is conducted by use of a plasma CVD method or a sputtering method.

(2) Formation of Channel Layers 704 and 705 and Channel Protection Layer 706

On a surface of the gate insulating layer 703, the channel layers 704 and 705 are formed with a spacing therebetween, as depicted in FIG. 28B, for example. The formation of the channel layers 704 and 705 is conducted, for example, by forming an oxide semiconductor film by use of a sputtering method, and patterning the film by use of a photolithographic method and a wet etching method.

The channel protection layer 706 is stackedly formed in such a manner as to cover the surfaces of the channel layers 704 and 705 and the gate insulating layer 703. The formation of the channel protection layer 706 is conducted by stackingly forming a layer of SiO by use of a plasma CVD method or a sputtering method, followed by an annealing treatment at a temperature of not lower than the film forming temperature in a dry air or oxygen atmosphere.

(3) Formation of Source Electrodes 707 and 710 and Drain Electrodes 708 and 709 and Formation of Passivation Layer 712

On a surface of the channel protection layer 706, the source electrodes 707 and 710 and the drain electrodes 708 and 709 are formed, as depicted in FIG. 28C, for example.

First, contact holes are opened in the relevant parts (the parts on the upper side of the contact regions 702a, 704a, 704b, 705a and 705b of the gate electrode 702 and the channel layers 704 and 705) of the gate insulating layer 703 and the channel protection layer 706. The formation of the contact holes is conducted by forming a pattern by use of a photolithographic method, followed by etching by use of a dry etching method. Next, for example, a metallic thin film of Ti, a metallic thin film of Al and a metallic thin film of Ti are sequentially stacked by use of a sputtering method. Then, the source electrodes 707 and 710 and the drain electrodes 708 and 709 are patterned by use of a photolithographic method and a wet etching method.

Note that wiring 707a depicted in FIG. 28C corresponds to the source lines SL-1 to SL-n. In addition, wiring 709a depicted in FIG. 28C corresponds to the power supply lines Va.

The passivation layer 712 is formed in such a manner as to cover the source electrodes 707 and 710, the drain electrodes 708 and 709 and the channel protection layer 706. The formation of the passivation layer 712 is conducted by use of a plasma CVD method, an ALD (Atomic Layer Deposition) method or a sputtering method.

(4) Formation of Lower Interlayer Insulating Layer 713, Auxiliary Electrode 714 and Upper Interlayer Insulating Layer 715

The lower interlayer insulating layer 713 is stackedly formed in such a manner as to cover the passivation layer 712. The formation of the lower interlayer insulating layer 713 is conducted by applying the aforementioned organic material, and planarizing the surface thereof.

The auxiliary electrode 714 is formed by forming a metallic film of tungsten (W) by use of a sputtering method or a vacuum deposition method or the like, followed by patterning the metallic film by use of a photolithographic method and an etching method. For example, as depicted in FIG. 28D, the auxiliary electrode 714 is patterned in such a manner as to have a region 714H extending in the X-axis direction and a region 714V extending in the Y-axis direction, while avoiding the part located on the upper side of the contact region 710a of the source electrode 710. The region 714H is provided to extend in the X-axis direction over a plurality of pixels, whereas the region 714V is provided to extend in the Y-axis direction over a plurality of pixels. A contact region 714a of the auxiliary electrode 714 is provided in the region 714V.

The upper interlayer insulating layer 715 is stackedly formed in such a manner as to cover the lower interlayer insulating layer 713 and the auxiliary electrode 714. The formation of the upper interlayer insulating layer 715 is conducted by applying the aforementioned organic material, and planarizing the surface thereof.

(5) Formation of Pixel Electrode 716

Contact holes are opened in the lower interlayer insulating film 713 and the upper interlayer insulating layer 715 on the upper side of the contact regions 710a of the source electrodes 710, and the pixel electrodes 716 are formed.

The formation of the contact holes is conducted by forming a pattern by use of a photolithographic method, followed by etching by use of a dry etching method. To form the pixel electrodes 716, a thin film of tungsten (W) and a thin film of aluminum (Al) or an aluminum alloy are sequentially stacked to form a metallic film, by use of a sputtering method or a vacuum deposition method or the like, after which patterning is conducted, as depicted in FIG. 28E, for example, by use of a photolithographic method and an etching method. A plurality of pixel electrodes 716 are patterned in a matrix pattern, whereby the plurality of pixel electrodes 716 are formed on the upper interlayer insulating layer 715, as depicted in FIG. 29A.

Note that the pixel electrode 716 makes contact with the contact region of the source electrode 710 through the contact hole, to be electrically connected to the source electrode 710.

In addition, in the same procedure for opening the contact holes in the lower interlayer insulating layer 713 and the upper interlayer insulating layer 715 on the upper side of the contact regions 710a of the source electrodes 710, contact holes are opened in the upper interlayer insulating layer 715 on the upper side of the contact regions 714a of the auxiliary electrodes 714.

(6) Formation of Bank 717

The banks 717 are formed in such a manner as to cover edge portions of the pixel electrodes 716. The banks 717 are provided in such a manner as to surround openings each defining each pixel, and to cause the surfaces of the pixel electrodes 716 to be exposed at bottom portions of the openings.

In forming the banks 717, row banks 717H are formed as depicted in FIG. 29B, after which column banks 717V are formed as depicted in FIG. 29C.

In forming the banks 717, first, a film of a constituent material (for example, a photosensitive resin material) of the banks 717 is stackedly formed on the pixel electrodes 716 and the upper interlayer insulating layer 715 by use of a spin coating method or the like. Then, the resin film is patterned to sequentially form the row banks 717H and the column banks 717V, thereby forming the openings in which the pixel electrodes 716 are exposed. The patterning of the row banks 717H and the column banks 717V is conducted by performing exposure by utilizing a photomask on the upper side of the resin film, followed by a developing step and a baking step.

(7) Formation of Light Emitting Layer 718

The light emitting layers 718 are formed by applying an ink containing the constituent material to the inside of the openings defined by the banks 717 by use of an ink jet method, followed by baking. Specifically, in this step, the ink containing a material for the organic light emitting layer for one of colors R, G and B is placed to fill those areas of the openings in which the pixel electrodes 716 are exposed by an ink jet method, then the filling ink is dried under a reduced pressure, and is baked, whereby the light emitting layers 718 are formed as depicted in FIG. 29D. In this instance, in application of the ink for the light emitting layers 718, first, a solution for forming the light emitting layers 718 is applied by use of a droplet jetting apparatus. After the application of the ink for forming one of the red light emitting layers, the green light emitting layers and the blue light emitting layers is finished, an ink of another color is next applied, and an ink of a third color is then applied, and, thus, the ink applying operation is repeated, thereby sequentially applying the inks of the three colors. By this, the red light emitting layers, the green light emitting layers and the blue light emitting layers are formed in a repeatedly aligned pattern.

(8) Formation of Common Electrode Layer 719

After the light emitting layers 718 are formed, the common electrode layer 719 is formed over the whole surface of the display panel 4010 by a CVD method, a sputtering method or the like.

The common electrode layer 719 is formed also on the contact holes where the contact regions 714a of the auxiliary electrodes 714 on the upper interlayer insulating layer 715 are exposed. The common electrode layer 719 makes contact with the contact regions 714a of the auxiliary electrodes 714 through the contact holes, to be electrically connected to the auxiliary electrodes 714.

1.4 Effect

In the display panel 4010, the auxiliary electrodes 714 are formed in a layer different from that of the pixel electrodes 716. Therefore, a reduction in the area of the pixel electrodes 716 can be restrained, with the result that a lowering in pixel aperture ratio can be restrained.

In addition, since the auxiliary electrodes 714 are formed in the layer for exclusive use, the degree of freedom in wiring of the auxiliary electrodes 714 is high. Specifically, the auxiliary electrodes 714 can be freely patterned on the lower interlayer insulating layer 713, if only the patterning conforms to the restriction that the auxiliary electrodes 714 should be patterned on the lower interlayer insulating layer 713 while avoiding the contact holes for permitting electrical connection between the pixel electrodes 716 and the source electrodes 710. By this, the area of the auxiliary electrodes 714 can be easily enlarged, and, as a result, a lowering in the resistance of the common electrode layer can be realized.

2. Modifications

While the display panel 4010 according to Embodiment 3 has been described above, the present disclosure is not limited to the above embodiment, except for essential and characteristic constituent elements thereof. For instance, modes obtained by subjecting the embodiments to various modifications conceived by those skilled in the art and modes realized by arbitrary combinations of the constituent elements and functions in each of the embodiments without departing from the gist of the present invention are also embraced in the present disclosure. As an example of such modes, a modification of the display panel 4010 will be described below.

(1) While the auxiliary electrodes 714 have been formed between the lower interlayer insulating layer 713 and the upper interlayer insulating layer which constitute the planarizing layer in Embodiment 3, this is not limitative of the position at which to form the auxiliary electrodes. The auxiliary electrodes can be formed also in the TFT layer.

As a display panel according to Modification 1, a display panel in which auxiliary electrodes are formed in a TFT layer will be described below. Note that the descriptions of the same configurations, constituent elements and manufacturing methods as those in Embodiment 3 will be omitted.

(1-1. Configuration)

Figure 30:
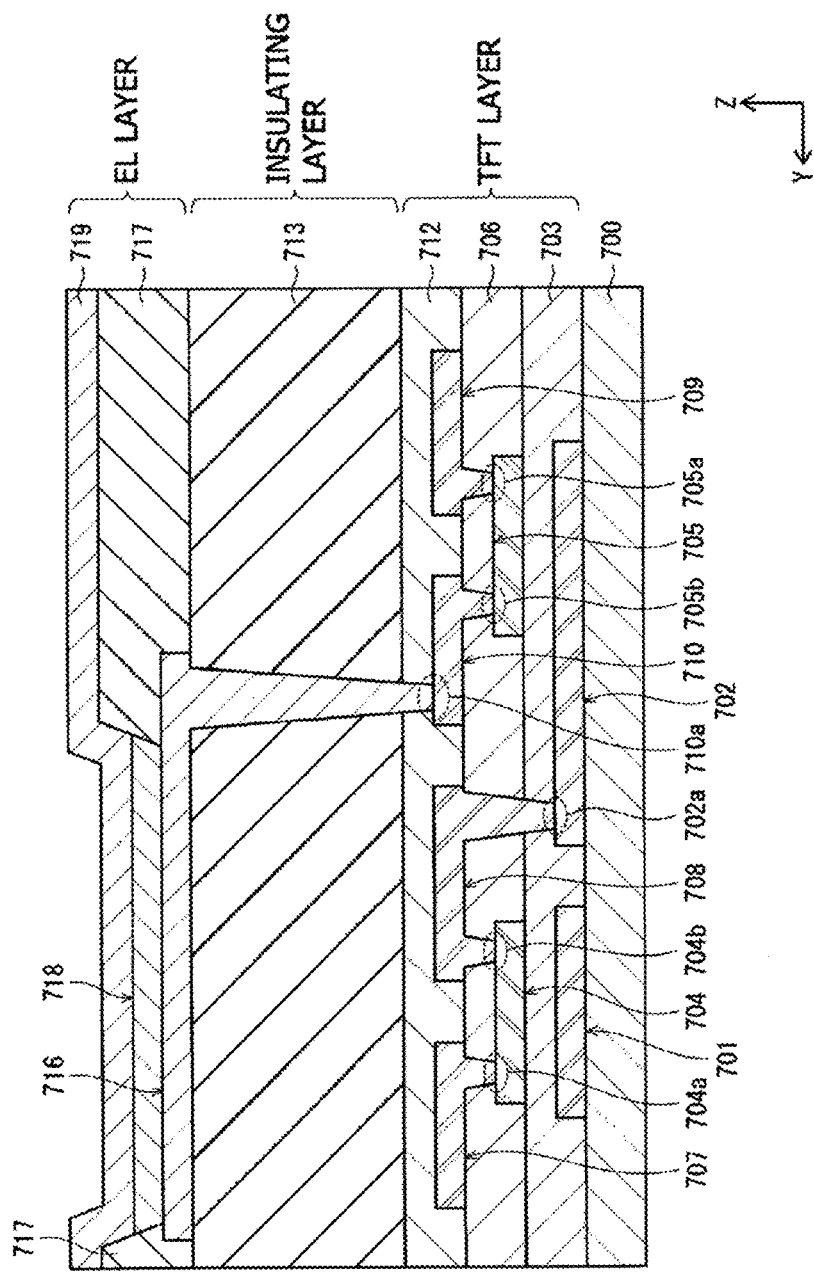
FIG. 30 is a schematic view of a sectional configuration of the display panel according to at least one embodiment.

The configuration of the display panel according to Modification 1 will be described referring to FIGS. 30 and 31. FIG. 30 depicts an example of sectional configuration in a YZ plane of the display panel, and FIG. 31 depicts an example of sectional configuration in an XZ plane of the display panel.

Figure 31:
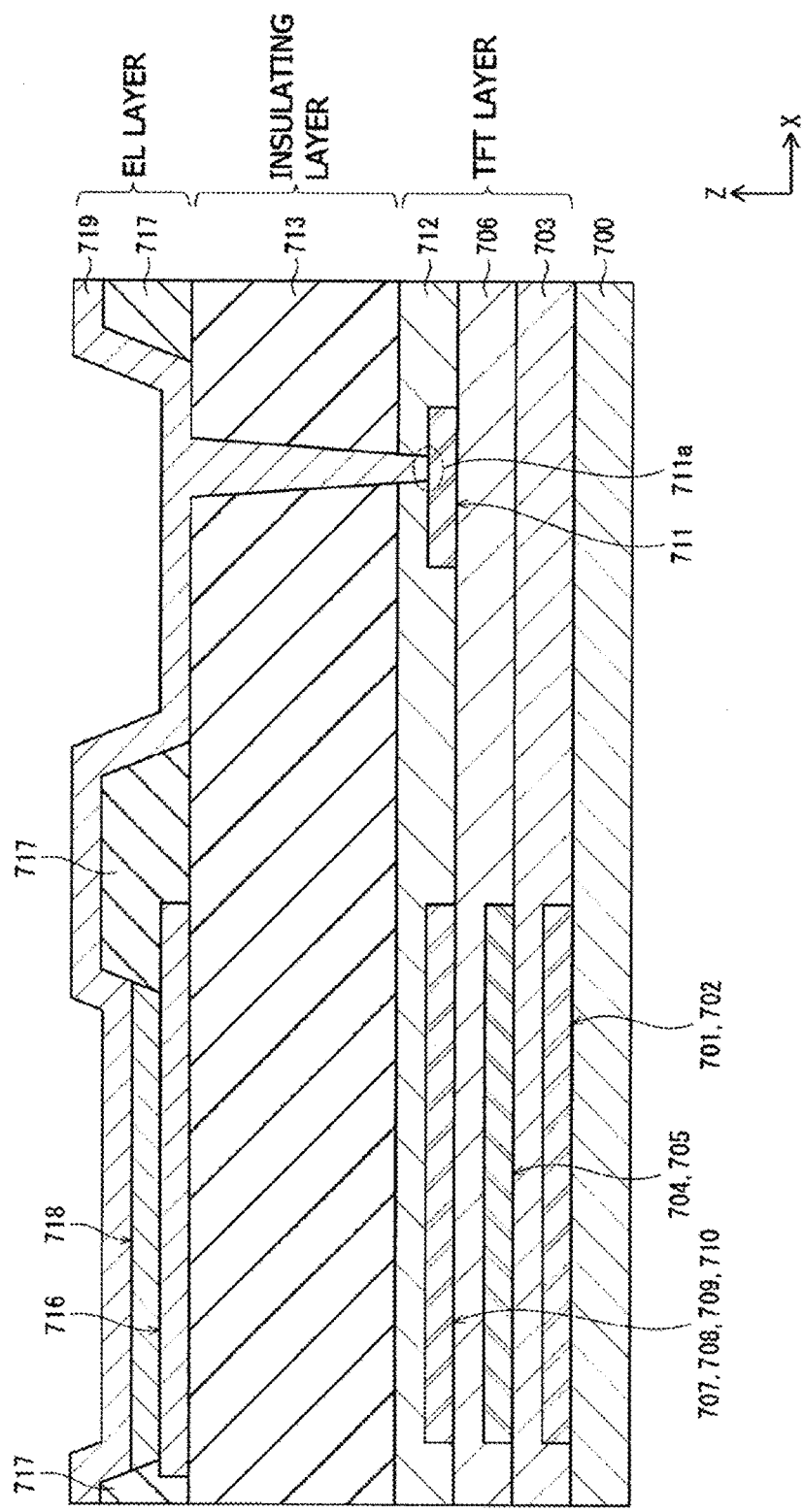
FIG. 31 is a schematic view of a sectional configuration of the display panel according to at least one embodiment.

As depicted in FIG. 31, on a channel protection layer 706, auxiliary electrodes 711 are formed in the state of being spaced from source electrodes 707 and 710 and drain electrodes 708 and 709. In addition, a passivation layer 712 is formed in such a manner as to cover the surfaces of the source electrodes 707 and 710, the drain electrodes 708 and 709, the auxiliary electrodes 711 and the channel protection layer 706.

On the passivation layer 712 is formed a lower interlayer insulating layer 713. The passivation layer 712 and the lower interlayer insulating layer 713 are provided therein with contact holes on the upper side of contact regions 711a of the auxiliary electrodes 711, and a common electrode layer 719 is in contact with the auxiliary electrodes 711 at bottoms of the contact holes.

Unlike in Embodiment 3 described above, as depicted in FIGS. 30 and 31, auxiliary electrodes 714 and an upper interlayer insulating layer 715 are not formed, but pixel electrodes 716, banks 717 and the common electrode layer 719 are formed, on the lower interlayer insulating layer 713.

Note that though not illustrated, the auxiliary electrodes 711 are provided to extend in the X-axis direction and/or the Y-axis direction continuously over a plurality of pixels, while avoiding the source electrodes 707 and 710 and the drain electrodes 708 and 709. Note that contact regions 711a of the auxiliary electrodes 711 are provided to extend in the Y-axis direction, every a few pixels in the X-axis direction.

(1-2. Constituent Material)

As the constituent material of the auxiliary electrodes 711, there can be used the same material as the constituent material of the source electrodes 707 and 710 and the drain electrodes 708 and 709. Specifically, a stacked body of titanium (Ti) and aluminum (Al) (Ti/Al (or Al alloy)/Ti) and a stacked body of copper-manganese (CuMn), copper (Cu) and molybdenum (Mo) can be used.

(1-3. Manufacturing Method)

A method of manufacturing the display panel according to Modification 1 will be described.

Figure 32:
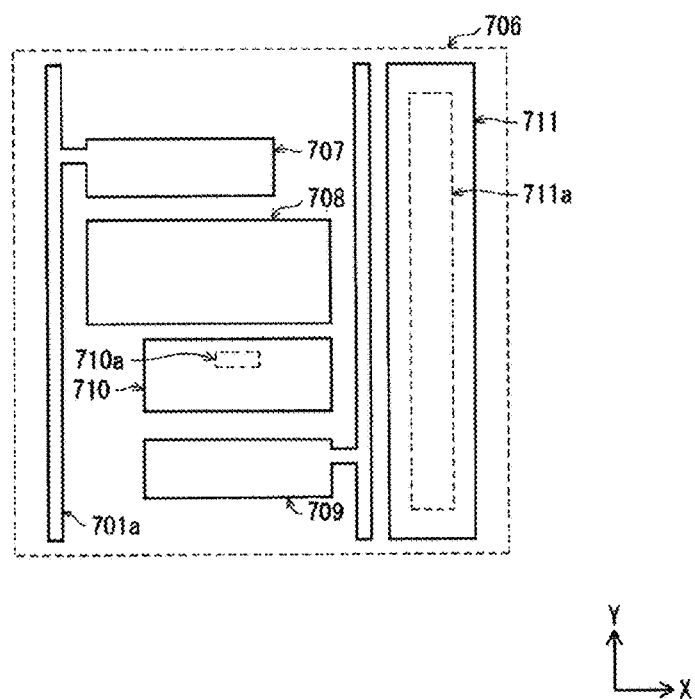
FIG. 32 is a schematic diagram depicting a manufacturing step of the display panel according to at least one embodiment.

The auxiliary electrodes 711 are formed on the channel protection layer 706. In forming the auxiliary electrodes 711, a metallic thin film of Ti, a metallic thin film of Al and a metallic thin film of Ti are sequentially stacked by use of a sputtering method. Then, the auxiliary electrodes 711 are patterned as depicted in FIG. 32 by use of a photolithographic method and a wet etching method. Note that the formation of the auxiliary electrodes 711 can be performed together with the formation of the source electrodes 707 and 710 and the drain electrodes 708 and 709.

The opening of contact holes in the lower interlayer insulating layer 713 on the upper side of the contact regions 711a of the auxiliary electrodes 711 can be carried out in Embodiment 3 in the same procedure as that in opening the contact holes in the upper interlayer insulating layer 715 on the upper side of the contact regions 714a of the auxiliary electrodes 714.

(1-4. Effect)

In the display panel 4010 according to Modification 1, the auxiliary electrodes 714 are formed in a layer different from that of the pixel electrodes 716. Therefore, a reduction in the area of the pixel electrodes 716 can be restrained, with the result that a lowering in pixel aperture ratio can be restrained.

In addition, since the auxiliary electrodes 711 are formed from the same constituent material and in the same layer as the source electrodes 707 and 710 and the drain electrodes 708 and 709, it is possible to simplify the manufacturing step.

(2) While the auxiliary electrodes have been formed in the TFT layer and not formed in the planarizing layer in the display panel according to Modification 1, the auxiliary electrodes may be formed in both the TFT layer and the planarizing layer.

As a display panel according to Modification 2, a display panel in which auxiliary electrodes are formed in both a TFT layer and a planarizing layer will be described below. Note that the descriptions of the same configurations, constituent materials and manufacturing methods as those in Embodiment 3 or Modification 1 will be omitted.

(2-1. Configuration)

The configuration of the display panel according to Modification 2 will be described referring to FIG. 33.

Figure 33:
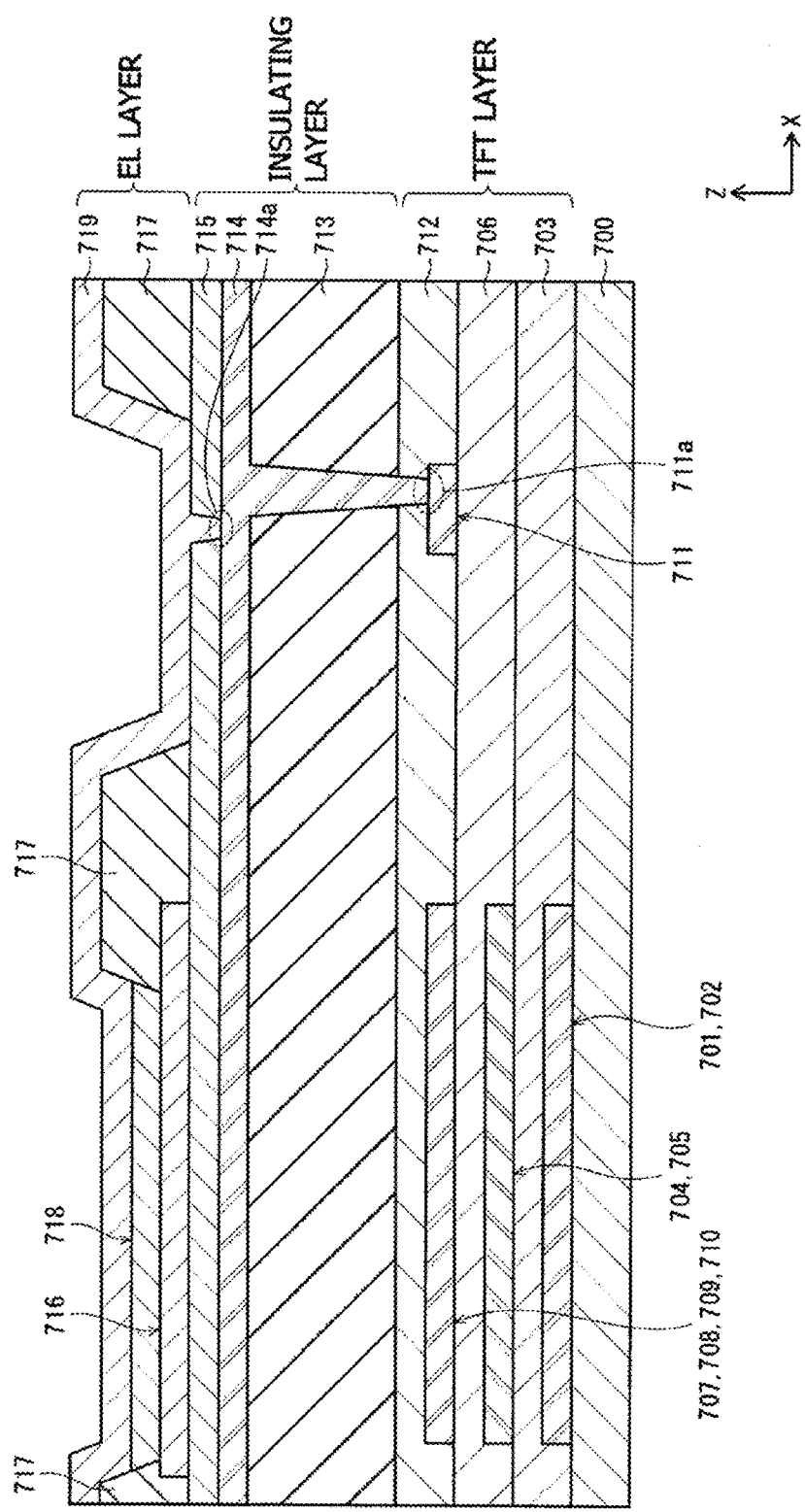
FIG. 33 is a schematic view of a sectional configuration of the display panel according to at least one embodiment.

As depicted in FIG. 33, like in Modification 1, an auxiliary electrode 711 is formed on a channel protection layer 706 in the state of being spaced from source electrodes 707 and 710 and drain electrodes 708 and 709.

In addition, like in Embodiment 3, an auxiliary electrode 714 and an upper interlayer insulating layer 715 are formed over a lower interlayer insulating layer 713.

A passivation layer 712 and the lower interlayer insulating layer 713 are provided therein with a contact hole on the upper side of a contact region 711a of the auxiliary electrode 711, and the auxiliary electrode 714 is in contact with the auxiliary electrode 711 at a bottom of the contact hole.

(2-2. Manufacturing Method)

A method of manufacturing the display panel according to Modification 2 will be described.

Like in Modification 1, the auxiliary electrode 711 is formed on a surface of the channel protection layer 706, after which the contact hole is opened in the lower interlayer insulating layer 713 on the upper side of the contact region 711a of the auxiliary electrode 711.

Figure 34:
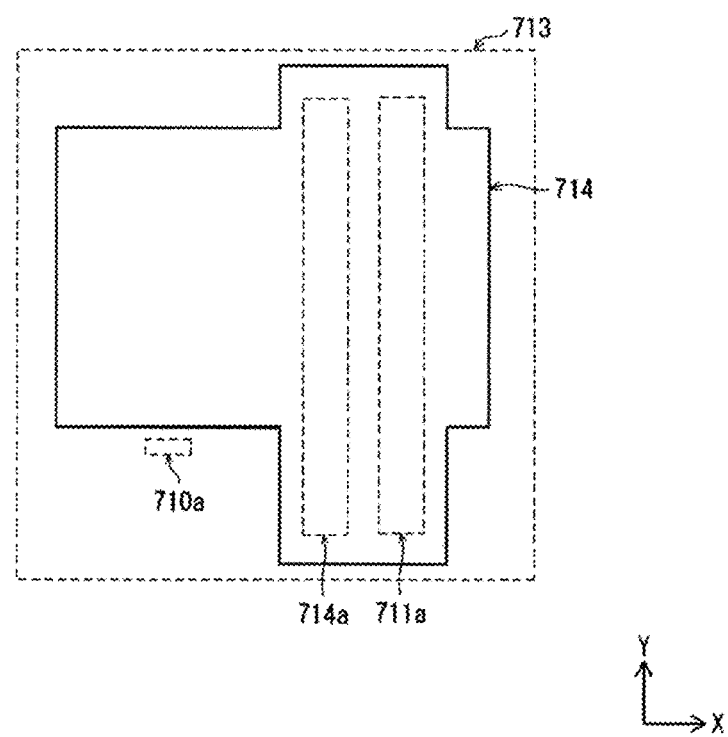
FIG. 34 is a schematic diagram depicting a manufacturing step of the display panel according to at least one embodiment.

After the contact hole is opened in the lower interlayer insulating layer 713, the auxiliary electrode 714 is formed. The formation of the auxiliary electrode 714 is conducted by forming a metallic film of tungsten (W) by use of a sputtering method or a vacuum deposition method or the like, followed by patterning the metallic film as depicted in FIG. 34, for example, by use of a photolithographic method and an etching method. The auxiliary electrode 714 and the auxiliary electrode 711 make contact with each other at the bottom of the contact hole opened in the lower interlayer insulating layer 713 on the upper side of the contact region 711a of the auxiliary electrode 711. Besides, a common electrode layer 719 and the auxiliary electrode 714 make contact with each other in a contact region 714a provided in the auxiliary electrode 714.

(2-3. Effect)

In the display panel 4010 according to Modification 2, the auxiliary electrodes 714 are formed in a layer different from that of pixel electrodes 716. Therefore, a reduction in the area of the pixel electrodes 716 can be restrained, with the result that a lowering in pixel aperture ratio can be restrained.

In addition, since the auxiliary electrodes 714 are formed in a layer for exclusive use, the degree of freedom in layout of the auxiliary electrodes 714 is high. This ensures that the area of the auxiliary electrodes 714 can be easily enlarged, and, as a result, a lowering in the resistance of the common electrode layer can be realized.

Besides, since the auxiliary electrodes 711 are formed from the same constituent material and in the same layer as the source electrodes 707 and 710 and the drain electrodes 708 and 709, it is possible to simplify the manufacturing step.

(3) In a step of manufacturing an organic EL display panel, for enhancing light emission efficiency, an organic layer such as an electron transport layer having a function of transferring electrons, injected from a common electrode layer, into a light emitting layer can be formed between the light emitting layer and the common electrode layer. When the organic layer is formed on a front surface of the display panel by use of a film forming method such as a vacuum deposition method after the formation of the light emitting layer, there arises a problem that since the organic layer comparatively high in electric resistance is formed between the auxiliary electrode and the common electrode layer, the electric resistance between the auxiliary electrode and the common electrode layer is raised. As a countermeasure against this problem, the organic layer may be formed while avoiding a contact part between the auxiliary electrode and the common electrode layer by use of a mask, whereby the electric resistance between the auxiliary electrode and the common electrode layer can be prevented from being raised. In addition, by specially designing the shape of the contact part between the auxiliary electrode and the common electrode layer, it is possible to prevent the rising in the electric resistance between the auxiliary electrode and the common electrode layer, without using mask vapor deposition.

As a display panel according to Modification 3, a display panel in which in the case of forming an organic layer such as an electron transport layer between a light emitting layer and a common electrode layer, a rising in the electric resistance between the auxiliary electrode and the common electrode layer can be prevented without using mask vapor deposition will be described. Note that the descriptions of the same configurations, constituent materials and manufacturing methods as those in Embodiment 3, Modification 1 or Modification 2 will be omitted.

(3-1. Configuration)

Figure 35:
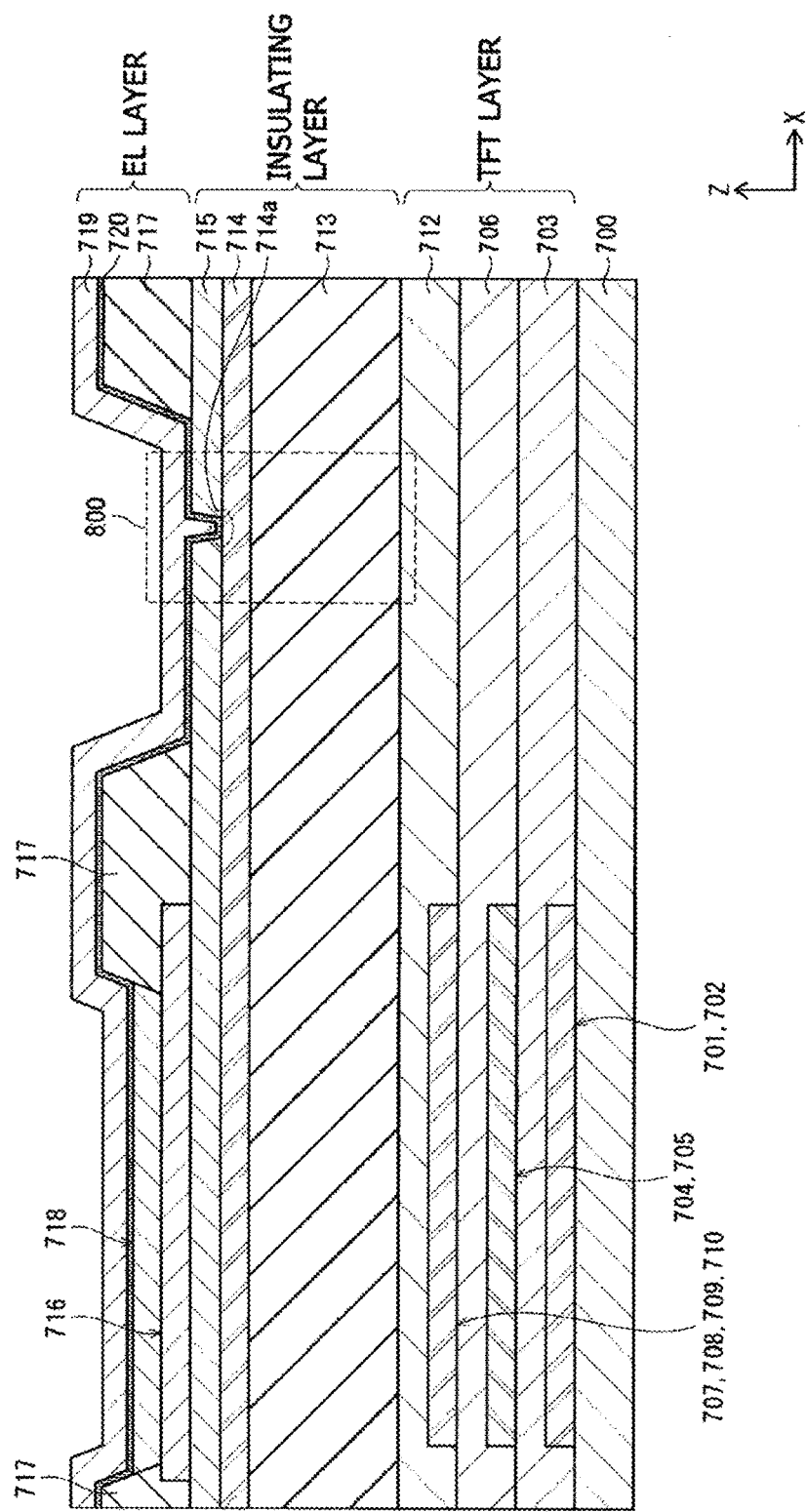
FIG. 35 is a schematic view of a sectional configuration of the display panel according to at least one embodiment.

The configuration of the display panel according to Modification 3 will be described referring to FIG. 35. FIG. 35 depicts an example of sectional configuration in an XZ plane of the display panel.

In the display panel 4010 according to Modification 3, an electron transport layer 720 is formed between a light emitting layer 718 and a common electrode layer 719. The electron transport layer 720 is formed in the state of being continuous over the whole part of the display panel 4010. Specifically, the electron transport layer 720 is formed also over the auxiliary electrode layer 714 exposed at a bottom of a contact hole opened in an upper interlayer insulating layer 715, and the common electrode layer 719 is formed further thereover.

Figure 36:
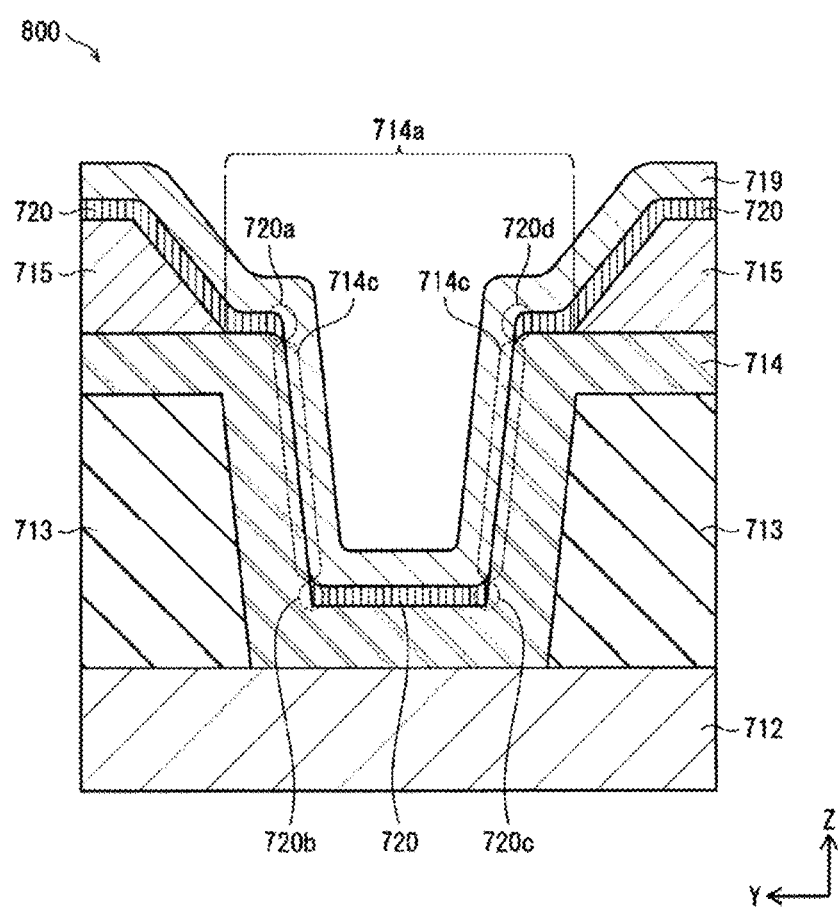
FIG. 36 is a schematic view of a sectional configuration of the display panel according to at least one embodiment.

A connection part between the auxiliary electrode 714 and the common electrode layer 719 in the display panel according to Modification 3 will be described referring to FIG. 36. FIG. 36 is a schematic sectional view of the connection part between the auxiliary electrode 714 and the common electrode layer 719 in the display panel according to Modification 3, and corresponds to that part of the display panel according to Modification 3 which is indicated by symbol 800 in FIG. 35.

As depicted in FIG. 36, a contact hole is opened in part of that portion of a lower interlayer insulating layer 713 which is located on the lower side of the auxiliary electrode 714, and a passivation layer 712 is exposed at a bottom of the contact hole. In addition, the auxiliary electrode 714 is formed with a recess which is recessed toward the passivation layer 712 side (the substrate 700 side), along the contact hole.

The upper interlayer insulating layer 715 is formed on the upper side of the auxiliary electrode 714, and the upper interlayer insulating layer 715 is provided therein with a contact hole in which a contact region 714a inclusive of the recess of the auxiliary electrode 714 is exposed.

The electron transport layer 720 is formed over the upper interlayer insulating layer 715 and over the auxiliary electrode 714 exposed via the contact hole. The electron transport layer 720 is completely or partially lacking (between ends 720a and 720b, or between ends 720c and 720d, in the figure) at the recess of the auxiliary electrode 714, and a contact surface 714c of the auxiliary electrode 714 is exposed at the lacking parts.

The common electrode layer 719 is formed over the electron transport layer 720. The common electrode layer 719 is formed in such a manner as to make direct contact with the contact surface 714c of the auxiliary electrode 714 that is exposed at the lacking part (between the ends 720a and 720b, or between the ends 720c and 720d) of the electron transport layer 720.

(3-2. Constituent Material)

For the electron transport layer 720, an organic material having a high electron transporting property is used. Examples of the organic material to be used for the electron transport layer 720 include 7E electron low-molecular-weight organic materials such as oxadiazole derivatives (OXD), triazole derivatives (TAZ) and phenanthroline derivatives (BCP, Bphen). In addition, the electron transport layer 720 may include a layer formed from an organic material having a high electron transporting property doped with a dopant metal selected from among alkali metals and alkaline earth metals. Besides, the electron transport layer 720 may include a layer formed from sodium fluoride. The alkali metals specifically include Li (lithium), Na (sodium), K (potassium), Rb (rubidium), Cs (cesium), and Fr (francium). The alkaline earth metals specifically include Ca (calcium), Sr (strontium), Ba (barium) and Ra (radium).

(3-3. Manufacturing Method)

A method of manufacturing the display panel according to Modification 3 will be described referring to FIGS. 37A to 37G.

FIGS. 37A to 37G are figures for explaining a method of manufacturing a connection part of the auxiliary electrode 714 and the common electrode layer 719 in the display panel according to Modification 3.

Figure 37A:
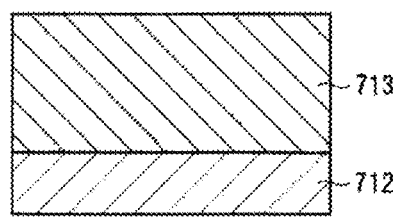
FIGS. 37A to 37G are schematic views depicting manufacturing steps of the display panel according to at least one embodiment.
Figure 37E:
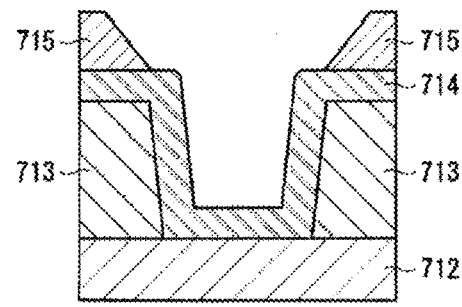
Figure 37B:
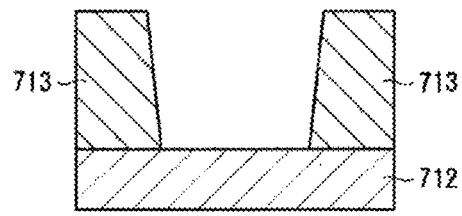

First, the lower interlayer insulating layer 713 is formed on the passivation layer 712 (FIG. 37A), the thus formed lower interlayer insulating layer 713 is patterned by use of a photolithographic method, and thereafter etching is conducted by use of a dry etching method, to open a contact hole (FIG. 37B).

Figure 37F:
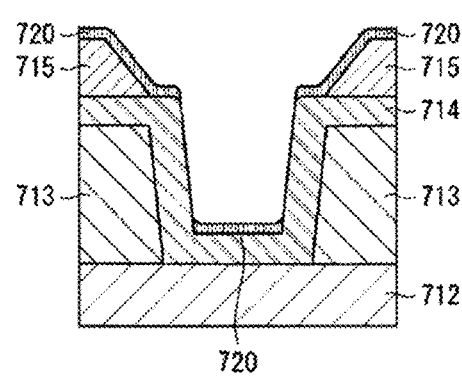
Figure 37C:
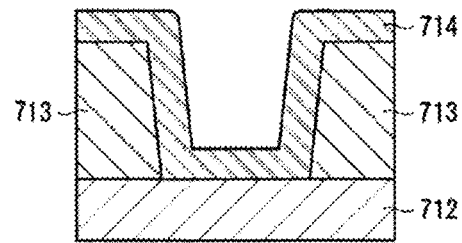
Figure 37D:
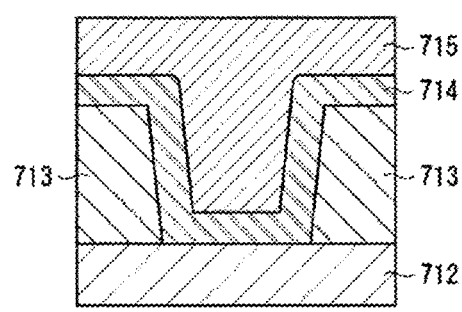

After the contact hole is opened in the lower interlayer insulating layer 713, a metallic film of tungsten (W) is formed by use of a sputtering method or a vacuum deposition method or the like, and the metallic film is patterned by use of a photolithographic method and an etching method, to form an auxiliary electrode 714 (FIG. 37C). In this instance, by forming the metallic film along an inner wall of the contact hole, a recess of the auxiliary electrode 714 is formed.

After the auxiliary electrode 714 is formed, the upper interlayer insulating layer 715 is formed in such a manner as to cover the lower interlayer insulating layer 713 and the auxiliary electrode 714 (FIG. 37D), the thus formed upper interlayer insulating layer 715 is patterned by use of a photolithographic method, and thereafter etching is conducted using a dry etching method, to open a contact hole (FIG. 37E).

After the contact hole is opened in the lower interlayer insulating layer 713, the electron transport layer 720 is formed by a vacuum deposition method or the like (FIG. 37F). In this instance, film formation is conducted in such a manner that lacking (stepping) is intentionally generated at a contact surface 714c of the recess of the auxiliary electrode 714, so that the contact surface 714c of the recess of the auxiliary electrode 714 is exposed at the lacking part.

Figure 37G:
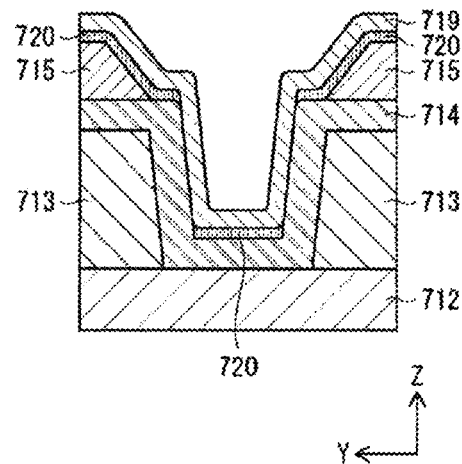

After the electron transport layer 720 is formed, the common electrode layer 719 is formed in such a manner as to cover the electron transport layer 720 by a CVD method or a sputtering method or the like (FIG. 37G). In this instance, film formation is conducted in such a manner that the common electrode layer 719 comes around into the lacking part of the electron transport layer 720, to make direct contact with the contact surface 714c of the recess of the auxiliary electrode 714 that is exposed at the lacking part of the electron transport layer 720.

(3-4. Configuration in which Auxiliary Electrode 714 and Common Electrode Layer 719 Make Direct Contact)

Of the auxiliary electrode 714, the inclination angle of the contact surface 714c is desirably 60 to 120 degrees. If the inclination angle is less than 60 degrees, the electron transport layer 720 would not undergo cutting (stepping), so that it is difficult to secure electrical connection of the auxiliary electrode 714 with the common electrode layer 719. If the inclination angle exceeds 120 degrees, on the other hand, the common electrode layer 719 would also undergo cutting (stepping) at the inner wall of the recess of the auxiliary electrode 714, so that it is difficult to secure contact of the auxiliary electrode 714 with the common electrode layer 719. This inclination angle coincides with the inclination angle of a side surface of the contact hole opened in the lower interlayer insulating layer 713, and, therefore, can be controlled by light exposure amount at the time of forming the contact hole in the lower interlayer insulating layer 713. The depth of the recess of the auxiliary electrode 714 is set in the range of 1 to 7 µm, for example. The width of the recess of the auxiliary electrode 714 is set in the range of 2 to 10 µm, for example.

By the adoption of such a shape, it is ensured that the electron transport layer 720 formed on the auxiliary electrode 714 is formed in the manner of breaking off (undergoing cutting or stepping) at the recess of the auxiliary electrode 714. To be more specific, the electron transport layer 720 is provided with a spacing between the ends 720a and 720b (or between the ends 720c and 720d) such that the contact surface 714c of the auxiliary electrode 714 is exposed there. On the other hand, the common electrode layer 719 is formed to make contact with the contact surface 714c of the auxiliary electrode 714, in the manner of coming around into the space between the ends 720a and 720b (or between the ends 720c and 720d) of the electron transport layer 720.

The auxiliary electrode 714 is desirably formed by a film forming method excellent in step coverage property (for example, a sputtering method or a CVD method), in order that the auxiliary electrode 714 will not undergo stepping at the side surface of the contact hole in the lower interlayer insulating layer 713. In addition, even where a film forming method excellent in step coverage is used, stepping may be generated if the film thickness of the auxiliary electrode 714 is excessively small. Therefore, the auxiliary electrode 714 is preferably formed in a film thickness of not less than 25 nm.

The electron transport layer 720 is desirably formed by a film forming method comparatively poor in step coverage (for example, a vacuum deposition method), in order that the electron transport layer 720 will undergo stepping at the recess of the auxiliary electrode 714 and the contact surface 714c will be exposed there. Besides, if the film thickness of the electron transport layer 720 is excessively small, electrons would migrate directly from the common electrode layer 719 into the light emitting layer 718, inhibiting a function of restricting injection of electrons into the light emitting layer 718 from being exhibited. Therefore, the electron transport layer 720 is desirably formed in a film thickness of not less than 3 nm. On the other hand, thickening of the electron transport layer 720 lowers the transmittance of the electron transport layer 720, and hampers the generation of stepping. In order to prevent light transmitted through the electron transport layer 720 from being excessively attenuated and in order to intentionally generate stepping at the recess of the auxiliary electrode 714, the electron transport layer 720 is preferably formed in a thickness of not more than 40 nm.

The common electrode layer 719 is desirably formed by a film forming method excellent in step coverage (for example, a sputtering method or a CVD method) such that the common electrode layer 719 is formed in the manner of coming around to the stepping part of the electron transport layer 720. If the common electrode layer 719 is excessively thin, stepping of the common electrode layer 719 may be generated; therefore, the common electrode layer 719 is desirably formed in a film thickness of not less than 25 nm. On the other hand, thickening of the common electrode layer 719 lowers the transmittance of the common electrode layer 719, and, therefore, the common electrode layer 719 is desirably formed in a film thickness of not more than 300 nm.

(3-5. Effect)

The display panel according to Modification 3 has a configuration in which the auxiliary electrode 714 is provided with the recess, whereby the electron transport layer 720 is made to undergo stepping, so that the contact surface 714c of the auxiliary electrode 714 exposed due to the stepping and the common electrode layer 719 make direct contact with each other. By such a configuration, it is ensured that it is unnecessary, in forming the electron transport layer 720, to perform mask vapor deposition for forming the electron transport layer 720 while avoiding the auxiliary electrode 714; as a result, a lowering in productivity attendant on high-accuracy aligning of a precision mask can be obviated.

Figure 38:
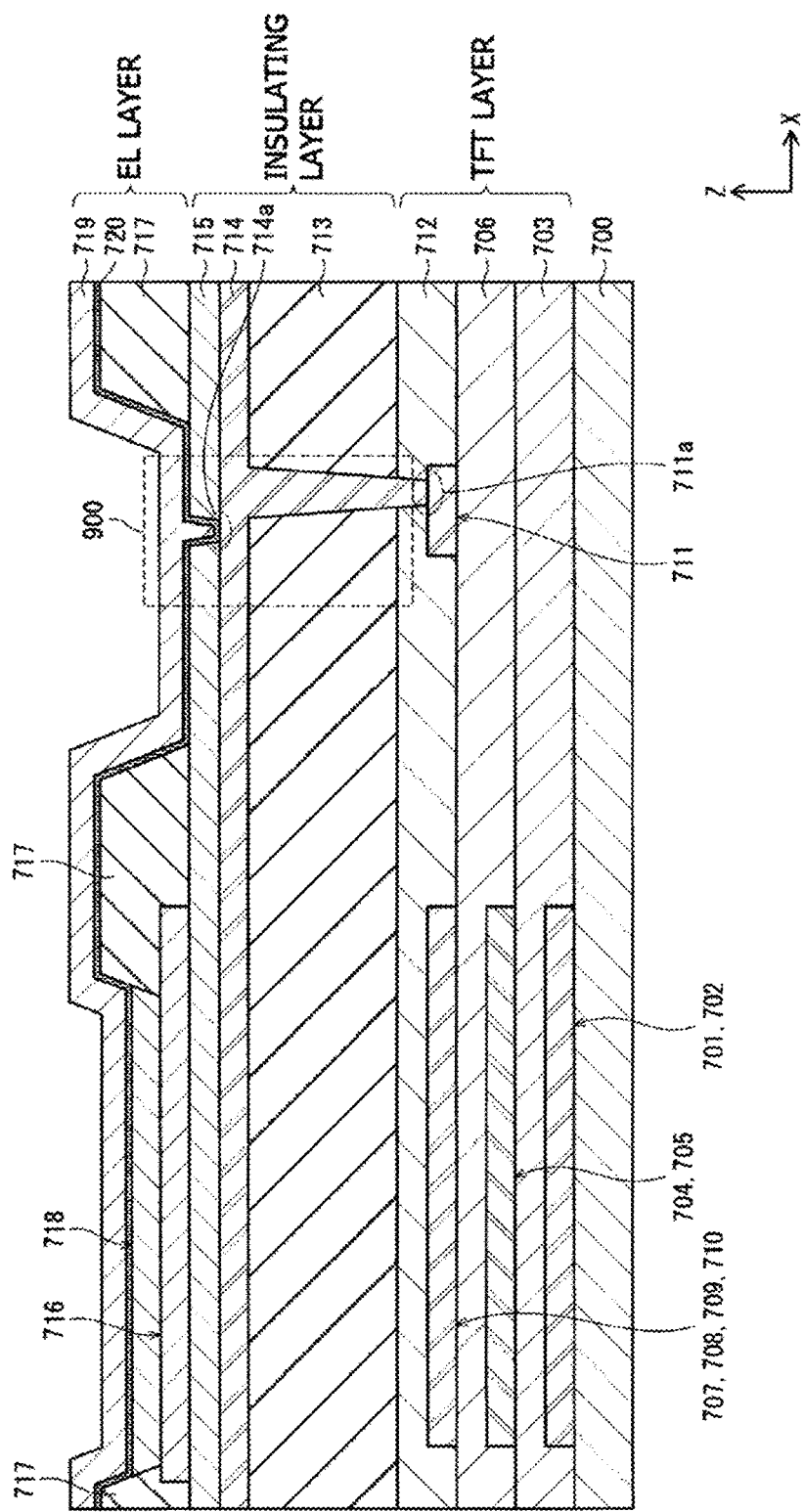
FIG. 38 is a schematic view of a sectional configuration of the display panel according to at least one embodiment.
Figure 39:
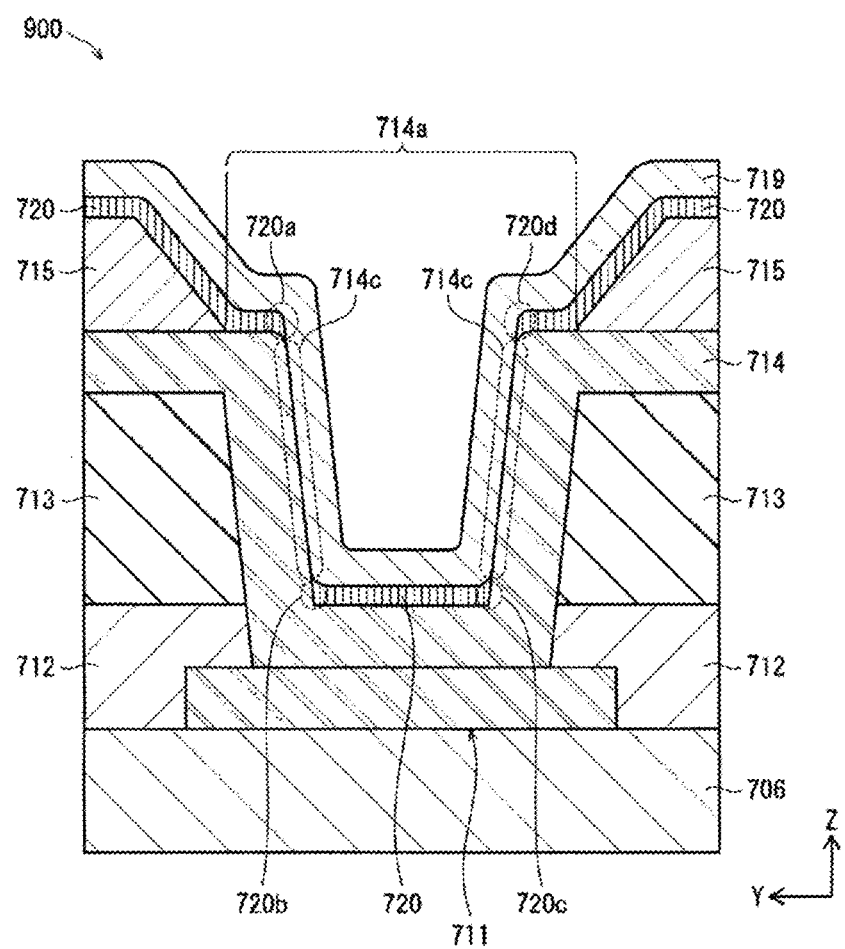
FIG. 39 is a schematic view of a sectional configuration of the display panel according to at least one embodiment.

Note that also in the case of forming auxiliary electrodes in a TFT layer and a planarizing layer as in the display panel according to Modification 2, an effect similar to the above-mentioned can be obtained by forming the auxiliary electrodes as depicted in FIGS. 38 and 39.

(4) While a configuration in which the electron transport layer 720 is lacking such that the contact surface 714c is exposed at the recess of the auxiliary electrode 714 has been adopted in the display panel according to Modification 3, the lacking may not be present and the contact surface 714c may not be completely exposed, so long as the electric resistance in electrical connection between the common electrode layer 719 and the auxiliary electrode 714 can be reduced. For example, a configuration may be adopted in which the electron transport layer 720 is thinned to a film thickness of, for example, not more than 1 nm at its part for contact with the contact surface 714c in the recess of the auxiliary electrode 714, and the common electrode layer 719 is electrically connected to the auxiliary electrode 714 at a lower electric resistance at the thinned part of the electron transport layer 720 than at the other parts of the electron transport layer 720.

(5) In the embodiments described above, a hole injection layer may be formed between the pixel electrode 716 and the light emitting layer 718.

The hole injection layer has a function of assisting generation of holes and injecting and transporting the holes stably to the light emitting layer 718. The hole injection layer is, for example, a layer formed from an oxide of silver (Ag), molybdenum (Mo), chromium (Cr), vanadium (V), tungsten (W), nickel (Ni), iridium (Ir) or the like, or a layer formed from a conductive polymer material such as PEDOT (a mixture of polythiophene and polystyrenesulfonic acid).

3. Supplements

The configurations of the present disclosure will be further described below.

(1) An organic EL display panel according to a first mode of the present disclosure includes: a substrate; a thin film semiconductor layer disposed on the substrate; a lower insulating layer disposed on the thin film semiconductor layer; a current feeding auxiliary electrode disposed partly on the lower insulating layer and having a recess recessed toward the substrate side; an upper insulating layer disposed over the lower insulating layer and the auxiliary electrode; and an EL element disposed on the upper insulating layer. The upper insulating layer is formed therein with a contact hole which reaches the recess of the auxiliary electrode. The EL element includes a pixel electrode disposed at a part on the upper insulating layer where the contact hole is not opened, a light emitting layer disposed on the pixel electrode, and a common electrode layer disposed on the light emitting layer and in the contact hole. In the contact hole, the common electrode layer is formed along a hole inner wall and a surface of the auxiliary electrode.

(2) An organic EL display panel according to a second mode of the present disclosure is the organic EL display panel according to the first mode, in which the EL element further includes a functional layer disposed on the light emitting layer and in the contact hole, on the lower side of the common electrode layer. In the contact hole, the functional layer is formed along a hole inner wall and a surface of the auxiliary electrode, and is lacking or thinned at a part located at an inner wall of the recess of the auxiliary electrode, and the common electrode layer is in direct contact with the auxiliary electrode exposed due to the lacking of the functional layer or is electrically connected to the auxiliary electrode at a lower resistance at the thinned part of the functional layer than at the other parts of the functional layer.

(3) An organic EL display panel according to a third mode of the present disclosure is the organic EL display panel according to the first mode, in which where the auxiliary electrode is defined as a first auxiliary electrode and the contact hole is defined as a first contact hole, the thin film semiconductor layer includes a gate electrode disposed on the substrate, a source electrode and a drain electrode which are disposed over the gate electrode, and a second auxiliary electrode which is disposed in the same layer as the source electrode and the drain electrode and which is disposed at a part located under the first auxiliary electrode. The lower insulating layer is formed therein with a second contact hole reaching the second auxiliary electrode. In the second contact hole, the first auxiliary electrode is formed along a hole inner wall and a surface of the second auxiliary electrode.

(4) A method of manufacturing an organic EL display panel according to a fourth mode of the present disclosure includes the steps of: forming a thin film semiconductor layer on a substrate; forming a lower insulating layer on the thin film semiconductor layer; forming a current feeding auxiliary electrode partly on the lower insulating layer, the current feeding auxiliary electrode having a recess recessed toward the substrate side; forming an upper insulating layer over the lower insulating layer and the auxiliary electrode; forming the upper insulating layer with a contact hole which reaches the recess of the auxiliary electrode; and forming an EL element on the upper insulating layer. The step of forming the EL element includes the steps of: forming a pixel electrode at a part on the upper insulating layer where the contact hole is not formed; forming a light emitting layer on the pixel electrode; and forming a common electrode layer on the light emitting layer and in the contact hole. The step of forming the common electrode layer includes forming the common electrode layer in the contact hole along a hole inner wall and a surface of the auxiliary electrode.

(5) A method of manufacturing an organic EL display panel according to a fifth mode of the present disclosure is the method of manufacturing the organic EL display panel according to the fourth mode, in which the step of forming the EL element includes a step of further forming a functional layer over the light emitting layer and in the contact hole, on a lower side of the common electrode layer. The step of forming the functional layer includes forming the functional layer in the contact hole along a hole inner wall and a surface of the auxiliary electrode by a vacuum deposition method in such a manner that the functional layer is lacking or thinned at a part located on an inner wall of the recess of the auxiliary electrode. The step of forming the common electrode layer includes forming the common electrode layer by a sputtering method or a CVD method in such a manner that the common electrode layer makes direct contact with the auxiliary electrode exposed due to lacking of the functional layer or that the common electrode layer is electrically connected to the auxiliary electrode at a lower resistance at the thinned part of the functional layer than at the other parts of the functional layer.

(6) A method of manufacturing an organic EL display panel according to a sixth mode of the present disclosure is the method of manufacturing the organic EL display panel according to the fourth mode, in which where the auxiliary electrode is defined as a first auxiliary electrode and the contact hole is defined as a first contact hole, the step of forming the thin film semiconductor layer includes the steps of: forming a gate electrode on a substrate; forming a source electrode and a drain electrode over the gate electrode; and forming a second auxiliary electrode in the same layer as the source electrode and the drain electrode. Further, the method of manufacturing the organic EL display panel further includes a step of forming the lower insulating layer with a second contact hole which reaches the second auxiliary electrode. The step of forming the first auxiliary electrode includes forming the first auxiliary electrode in the second contact hole along a hole inner wall and a surface of the second auxiliary electrode.

(7) An organic EL display panel according to a seventh mode of the present disclosure includes: a substrate; a gate electrode disposed on the substrate; a source electrode and a drain electrode which are disposed over the gate electrode; a current feeding auxiliary electrode disposed in the same layer as the source electrode and the drain electrode; an insulating layer disposed over the source electrode, the drain electrode and the auxiliary electrode; and an EL element disposed over the insulating layer. The insulating layer is formed therein with a contact hole which reaches the auxiliary electrode. The EL layer includes a pixel electrode disposed at a part on the insulating layer where the contact hole is not opened, a light emitting layer disposed on the pixel electrode, and a common electrode layer disposed on the light emitting layer and in the contact hole. In the contact hole, the common electrode layer is formed along a hole inner wall and a surface of the auxiliary electrode.

(8) An organic EL display panel according to an eighth mode of the present disclosure includes: a substrate; a gate electrode disposed on the substrate; a source electrode and a drain electrode which are disposed over the gate electrode; a current feeding first auxiliary electrode disposed in the same layer as the source electrode and the drain electrode; a lower insulating layer disposed over the source electrode, the drain electrode and the first auxiliary electrode; a current feeding second auxiliary electrode disposed at that part on the lower insulating layer which is located over the first auxiliary electrode; an upper insulating layer disposed over the lower insulating layer and the second auxiliary electrode; and an EL element disposed on the upper insulating layer. The lower insulating layer is formed therein with a first contact hole which reaches the first auxiliary electrode. The second auxiliary electrode is formed in the first contact hole along an inner wall of the first contact hole and a surface of the first auxiliary electrode. The upper insulating layer is formed therein with a second contact hole which reaches the second auxiliary electrode. The EL element includes a pixel electrode disposed at a part on the upper insulating layer where the second contact hole is not opened, a light emitting layer disposed on the pixel electrode, and a common electrode layer disposed on the light emitting layer and in the second contact hole. In the second contact hole, the common electrode layer is formed along a hole inner wall and a surface of the second auxiliary electrode.

<Summary>

In the organic EL display panel according to Embodiment 3 of the present disclosure, the auxiliary electrodes are formed in a layer different from that of the pixel electrodes. Therefore, a reduction in the area of the pixel electrodes can be restrained, with the result that a lowering in pixel aperture ratio can be restrained. In addition, since the auxiliary electrodes are formed in a layer for exclusive use, the area of the auxiliary electrodes can be enlarged and, therefore, a lowering in the resistance of the common electrode layer can be realized. Further, the recess in the surface of the auxiliary electrode ensures that even in the case where an organic layer having a comparatively high electric resistance is formed between the auxiliary electrode and the common electrode layer, it is possible, by utilizing film forming methods different in step coverage as a film forming method for forming the organic layer and a film forming method for forming the common electrode layer, to easily realize a lowering in the resistance in electrical connection between the auxiliary electrode and the common electrode layer.

Although the technology pertaining to the present disclosure has been fully described by way of examples with reference to the accompanying drawings, various changes and modifications will be apparent to those skilled in the art. Therefore, unless such changes and modifications depart from the scope of the present disclosure, they should be construed as being included therein.

What is claimed is:

1. An EL (Electro Luminescence) display panel comprising:
    a substrate;
    a plurality of pixel electrodes on the substrate;
    a plurality of light emitting layers, wherein each light emitting layer of the plurality of light emitting layer is on a corresponding pixel electrode of the plurality of pixel electrodes, wherein each of the plurality of light emitting layers comprises a light emitting material;
    a first current feeding auxiliary electrode layer extending in a column or row direction in at least one of gaps between adjacent pixel electrodes of the plurality of pixel electrodes, wherein the first current feeding auxiliary electrode layer comprises a metal different from aluminum, and the metal is lower than aluminum in contact resistance in air;
    a second current feeding auxiliary electrode layer superposed on the first current feeding auxiliary electrode layer, wherein the second current feeding auxiliary electrode layer comprises aluminum; and
    a common electrode layer continuously covering the first current feeding auxiliary electrode layer and the second current feeding auxiliary electrode layer as well as an upper side of each of the plurality of light emitting layers, wherein the common electrode layer contacts the first current feeding auxiliary electrode layer in a partial area on a wall surface perpendicular to an upper surface of the first current feeding auxiliary electrode layer.

2. The EL display panel according to claim 1,
    wherein an oxide of aluminum is formed at least at a surface layer of the second current feeding auxiliary electrode layer.

3. The EL display panel according to claim 1,
    wherein a functional layer composed of at least one layer disposed continuously to cover the first current feeding auxiliary electrode layer and the second current feeding auxiliary electrode layer as well as an upper side of the plurality of light emitting layers is further provided between the second current feeding auxiliary electrode layer and the common electrode layer,
    the functional layer is lacking or thinned in a vicinity of a partial area of the first current feeding auxiliary electrode layer, and the thickness of the first current feeding auxiliary electrode layer is greater than the thickness of the functional layer on the light emitting layer.

4. The EL display panel according to claim 1,
wherein the resistance in a vicinity of a surface layer of the second current feeding auxiliary electrode layer is higher than the resistance in a vicinity of a surface layer of the first current feeding auxiliary electrode layer.

5. The EL display panel according to claim 1,
wherein the contact resistance between the first current feeding auxiliary electrode layer and the common electrode layer is lower than the contact resistance between the second current feeding auxiliary electrode layer and the common electrode layer.

6. The EL display panel according to claim 1,
wherein the sheet resistance of the material is higher than the sheet resistance of aluminum.

7. The EL display panel according to claim 1,
wherein the metal different from aluminum is at least one metal selected from among tungsten, chromium, titanium, molybdenum, nickel, copper, lanthanum, and indium.

8. The EL display panel according to claim 1,
wherein the first current feeding auxiliary electrode layer is composed of ITO (Indium Tin Oxide) or IZO (Indium Zinc Oxide).

9. The EL display panel according to claim 3,
wherein when the functional layer is referred to as a first functional layer,
a second functional layer disposed discontinuously under the plurality of light emitting layers and over the first current feeding auxiliary electrode layer and the second current feeding auxiliary electrode layer is further provided between the second current feeding auxiliary electrode layer and the first functional layer.

10. The EL display panel according to claim 3,
wherein a transparent conductive layer composed of ITO or IZO and disposed discontinuously under the plurality of light emitting layers and over the first current feeding auxiliary electrode layer and the second current feeding auxiliary electrode layer is further provided between the second current feeding auxiliary electrode layer and the functional layer.

11. The EL display panel according to claim 1,
wherein the common electrode layer includes a transparent conductive layer composed of ITO or IZO.

12. The EL display panel according to claim 1,
wherein the common electrode layer includes a metal electrode layer containing silver as a main constituent.

13. The EL display panel according to claim 1,
wherein a planarizing layer composed of a planarizing lower layer and a planarizing upper layer which contain a resin as a main constituent is provided over the substrate,
a third current feeding auxiliary electrode layer is disposed to extend in a column or row direction between the planarizing lower layer and the planarizing upper layer,
the planarizing upper layer is formed therein with a contact hole penetrating to an upper surface of the third current feeding auxiliary electrode layer, with the first current feeding auxiliary electrode layer being electrically connected to the third current feeding auxiliary electrode layer through the contact hole,
the common electrode layer is disposed to be continuous with an inner peripheral surface and a bottom surface of the contact hole, and
the third current feeding auxiliary electrode layer and the common electrode layer are electrically connected to each other through the first current feeding auxiliary electrode layer.

14. The EL display panel according to claim 13,
wherein a functional layer is further disposed between the bottom surface of the contact hole and the common electrode layer in the contact hole, and
the depth of the contact hole is greater than the thickness of the functional layer, and the first current feeding auxiliary electrode layer and the common electrode layer are in contact with each other at least in a partial area on the inner peripheral surface of the contact hole in the first current feeding auxiliary electrode layer.

15. The EL display panel according to claim 1,
wherein the substrate includes a TFT (Thin Film Transistor) substrate and an insulating layer provided over the TFT substrate, the insulating layer containing a resin as a main constituent,
a planarizing layer containing a resin as a main constituent is provided over the substrate,
a fourth current feeding auxiliary electrode layer disposed to extend in a column or row direction is provided between the TFT substrate and the insulating layer,
the planarizing layer is formed therein with a contact hole penetrating from an upper surface of the planarizing layer to a lower surface of the fourth current feeding auxiliary electrode layer, with the first current feeding auxiliary electrode layer being electrically connected to the fourth current feeding auxiliary electrode layer through the contact hole,
the common electrode layer is disposed to be continuous with an inner peripheral surface and a bottom surface of the contact hole, and
the fourth current feeding auxiliary electrode layer and the common electrode layer are electrically connected to each other through the first current feeding auxiliary electrode layer.

16. The EL display panel according to claim 15,
wherein a functional layer is further disposed between a bottom surface of the contact hole in the substrate and the common electrode layer in the contact hole, and
the depth of the contact hole is greater than the thickness of the functional layer, and the first current feeding auxiliary electrode layer and the common electrode layer are in contact with each other at least in a partial area on the inner peripheral surface of the contact hole in the first current feeding auxiliary electrode layer.

17. The EL display panel according to claim 1,
wherein the substrate includes a TFT substrate and an insulating layer provided over the TFT substrate, the insulating layer containing a resin as a main constituent,
a planarizing layer composed of a planarizing lower layer and a planarizing upper layer which contain a resin as a main constituent is provided over the substrate,
a third current feeding auxiliary electrode layer disposed to extend in a column or row direction is provided between the planarizing lower layer and the planarizing upper layer,
a fourth current feeding auxiliary electrode layer disposed to extend in the column or row direction is provided between the TFT substrate and the insulating layer,
the planarizing lower layer, the planarizing upper layer and the insulating layer are formed therein with a contact hole which penetrates to an upper surface of the fourth current feeding auxiliary electrode layer, the first current feeding auxiliary electrode layer is electrically connected to the third current feeding auxiliary electrode layer through the contact hole, the third current feeding auxiliary electrode layer is electrically connected to the fourth current feeding auxiliary electrode layer through the contact hole, the common electrode layer is disposed to be continuous with an inner peripheral surface and a bottom surface of the contact hole, and the third current feeding auxiliary electrode layer and the fourth current feeding auxiliary electrode layer are electrically connected to the common electrode layer through the first current feeding auxiliary electrode layer.

18. The EL display panel according to claim 17, wherein a functional layer is further disposed between a bottom surface of the contact hole and the common electrode layer in the contact hole, and the depth of the contact hole is greater than the thickness of the functional layer, and the first current feeding auxiliary electrode layer and the common electrode layer are in contact with each other at least in a partial area on an inner peripheral surface of the contact hole in the first current feeding auxiliary electrode layer.

19. An EL (Electro Luminescence) display panel comprising:

a substrate;

a plurality of pixel electrodes on the substrate;

a plurality of light emitting layers, wherein each light emitting layer of the plurality of light emitting layer is on a corresponding pixel electrode of the plurality of pixel electrodes;

a first current feeding auxiliary electrode layer extending in at least one of gaps between adjacent pixel electrodes of the plurality of pixel electrodes, wherein the first current feeding auxiliary electrode layer comprises a material different from aluminum;

a second current feeding auxiliary electrode layer superposed on the first current feeding auxiliary electrode layer, wherein the second current feeding auxiliary electrode layer comprises aluminum; and a common electrode layer continuously covering the first current feeding auxiliary electrode layer and the second current feeding auxiliary electrode layer as well as an upper side of each of the plurality of light emitting layers, wherein the common electrode layer contacts the first current feeding auxiliary electrode layer in a partial area on a wall surface perpendicular to an upper surface of the first current feeding auxiliary electrode layer.

* * * * *